(12) United States Patent
Huang et al.

(10) Patent No.: US 11,968,865 B2
(45) Date of Patent: Apr. 23, 2024

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Weiyun Huang, Beijing (CN); Yao Huang, Beijing (CN); Chi Yu, Beijing (CN); Xingliang Xiao, Beijing (CN); Bo Shi, Beijing (CN); Benlian Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 63 days.

(21) Appl. No.: 17/297,641

(22) PCT Filed: Mar. 19, 2020

(86) PCT No.: PCT/CN2020/080182
§ 371 (c)(1),
(2) Date: May 27, 2021

(87) PCT Pub. No.: WO2021/147160
PCT Pub. Date: Jul. 29, 2021

(65) Prior Publication Data
US 2022/0310746 A1  Sep. 29, 2022

(30) Foreign Application Priority Data

Jan. 23, 2020 (WO) ................ PCT/CN2020/073993
Jan. 23, 2020 (WO) ................ PCT/CN2020/073995
(Continued)

(51) Int. Cl.
*H01L 27/32* (2006.01)
*G09G 3/3233* (2016.01)
(Continued)

(52) U.S. Cl.
CPC ......... *H10K 59/131* (2023.02); *G09G 3/3233* (2013.01); *H10K 59/126* (2023.02);
(Continued)

(58) Field of Classification Search
CPC ......... G09G 3/3233; G09G 2300/0413; G09G 2300/0426; G09G 2300/0452;
(Continued)

(56) References Cited

U.S. PATENT DOCUMENTS 8,294,702 B2  10/2012  Tanikame
9,412,307 B2  8/2016  Kwon et al.
(Continued)

FOREIGN PATENT DOCUMENTS

CN   101465095 A   6/2009
CN   104252835 A   12/2014
(Continued)

OTHER PUBLICATIONS

Office Action and English translation for corresponding Chinese Application No. 202080000101.2, dated Oct. 17, 2022.
(Continued)

*Primary Examiner* — Stacy Khoo
(74) *Attorney, Agent, or Firm* — Leason Ellis LLP

(57) ABSTRACT

A display substrate and a display device are provided. The display substrate includes a display region, at least one first signal line, and at least one connecting wire. The display region includes a first display region and a second display region; the first display region includes at least one first light emitting element, and the second display region includes at least one first pixel circuit; the first signal line includes a first
(Continued)

main body portion and a first winding portion; the first main body portion extends along a first direction, and at least part of the first winding portion extends along a direction intersecting with the first direction; at least one first signal line is electrically connected to at least one first pixel circuit; and at least one first pixel circuit is configured to respectively drive at least one first light emitting element.

19 Claims, 28 Drawing Sheets

(30) Foreign Application Priority Data

Jan. 23, 2020 (WO) ................ PCT/CN2020/073996
Jan. 23, 2020 (WO) ................ PCT/CN2020/074001

(51) Int. Cl.
*H10K 59/126* (2023.01)
*H10K 59/131* (2023.01)
*H10K 59/35* (2023.01)
*H10K 59/88* (2023.01)

(52) U.S. Cl.
CPC ... *H10K 59/353* (2023.02); *G09G 2300/0413* (2013.01); *G09G 2300/0426* (2013.01); *G09G 2300/0452* (2013.01); *G09G 2300/0842* (2013.01); *H10K 59/88* (2023.02)

(58) Field of Classification Search
CPC ........... G09G 2300/0842; H10K 59/12; H10K 59/121; H10K 59/126; H10K 59/131; H10K 59/353; H10K 59/65; H10K 59/88
See application file for complete search history.

(56) References Cited

U.S. PATENT DOCUMENTS

| | | | |
|---|---|---|---|
| 10,460,658 | B2 | 10/2019 | Xiang et al. |
| 10,741,621 | B2 | 8/2020 | Choo et al. |
| 10,756,136 | B1 | 8/2020 | Ma et al. |
| 10,910,459 | B2 | 2/2021 | Liang et al. |
| 2002/0121639 | A1 | 9/2002 | So et al. |
| 2011/0193855 | A1 | 8/2011 | Han |
| 2013/0087770 | A1 | 4/2013 | Son et al. |
| 2013/0207099 | A1* | 8/2013 | Shu ................... H10K 59/1213 257/43 |
| 2018/0089485 | A1 | 3/2018 | Bok |
| 2019/0123066 | A1 | 4/2019 | Zhan et al. |
| 2019/0180686 | A1 | 6/2019 | Qu et al. |
| 2019/0393286 | A1 | 12/2019 | Ding et al. |
| 2020/0176696 | A1 | 6/2020 | Dai |
| 2020/0350377 | A1 | 11/2020 | Zhong et al. |
| 2021/0066409 | A1 | 3/2021 | Fan |
| 2021/0327958 | A1 | 10/2021 | Li et al. |
| 2022/0209148 | A1* | 6/2022 | Park ........................ B32B 9/045 |

FOREIGN PATENT DOCUMENTS

| | | |
|---|---|---|
| CN | 104599634 A | 5/2015 |
| CN | 106023900 A | 10/2016 |
| CN | 106531084 A | 3/2017 |
| CN | 107591125 A | 1/2018 |
| CN | 108039149 A | 5/2018 |
| CN | 108364957 A | 8/2018 |
| CN | 109064904 A | 12/2018 |
| CN | 109272873 A | 1/2019 |
| CN | 109585519 A | 4/2019 |
| CN | 109981855 A | 7/2019 |
| CN | 110047846 A | 7/2019 |
| CN | 110060578 A | 7/2019 |
| CN | 110061014 A | 7/2019 |
| CN | 110061038 A | 7/2019 |
| CN | 110148621 A | 8/2019 |
| CN | 110189639 A | 8/2019 |
| CN | 110232892 A | 9/2019 |
| CN | 110415650 A | 11/2019 |
| CN | 110491918 A | 11/2019 |
| CN | 110492018 A | 11/2019 |
| CN | 110504289 A | 11/2019 |
| CN | 209787228 A | 12/2019 |
| CN | 110675744 A | 1/2020 |
| CN | 110716677 A | 1/2020 |
| CN | 209947878 U | 1/2020 |
| CN | 111326560 A | 6/2020 |
| IN | 107610635 A | 1/2018 |
| JP | 2015156270 A | 8/2015 |
| JP | 2018085114 A | 5/2018 |
| JP | 2019148737 A | 9/2019 |
| WO | 2012101397 A2 | 8/2012 |

OTHER PUBLICATIONS

Extended European Search Report in corresponding European Application No. 20866970.5 dated Jan. 3, 2023.
Office Action issued by Chinese Patent Office in the corresponding application No. 202080000249.6 and its English Translation, dated May 19, 2023.
Office Action issued in corresponding U.S. Appl. No. 17/288,823, mailed Jan. 26, 2024, 11 pages.
Office Action issued in corresponding Japanese Patent Application No. 2022-502521, mailed Feb. 1, 2024, 13 pages. English translation attached.

* cited by examiner

DISPLAY SUBSTRATE AND DISPLAY DEVICE

CROSS-REFERENCE TO RELATED PATENT APPLICATIONS

This application is a U.S. National Stage Application under 35 U.S.C § 371 of International Patent Application No. PCT/CN2020/080182, filed Mar. 19, 2020, which claims the benefit of priority to International Patent Application Nos. PCT/CN2020/073993, PCT/CN2020/073995, PCT/CN2020/073996 and PCT/CN2020/074001, all filed on Jan. 23, 2020, for all objectives, the disclosures of which are incorporated herein by reference in their entireties as part of the present application.

TECHNICAL FIELD

Embodiments of the present disclosure relate to a display substrate and a display device.

BACKGROUND

Organic light emitting diode (OLED) display devices have the characteristics of wide viewing angle, high contrast, high response speed, wide color gamut, high screen-to-body ratio, light self-emission, lightness and thinness, and the like. In addition, compared to inorganic light emitting display devices, the OLED display device has the advantages of higher light emitting brightness, lower driving voltage, and the like. Due to the characteristics and the advantages described above, the OLED display device gradually receives widespread attention of people and can be applicable to apparatus with the display function, such as a mobile phone, a display, a notebook computer, a smartwatch, a digital camera, instruments and apparatus, a flexible wearable apparatus and the like. With the further development of the display technology, the display device with the high screen-to-body ratio already cannot meet demands of people, and a display device with a full screen becomes the development trend of the display technology in the future.

SUMMARY

At least one embodiment of the present disclosure provides a display substrate, which comprises a display region, at least one first signal line, and at least one connecting wire. The display region comprises a first display region and a second display region; the second display region at least partially surrounds the first display region; the first display region comprises at least one first light emitting element, and the second display region comprises at least one first pixel circuit; the at least one first signal line comprises a first main body portion and a first winding portion; the first main body portion extends along a first direction, and at least part of the first winding portion extends along a direction intersecting with the first direction; the at least one first signal line is electrically connected to the at least one first pixel circuit, so as to provide a first driving signal for the at least one first pixel circuit; the at least one first pixel circuit is respectively connected to the at least one first light emitting element through corresponding connecting wire; and the at least one first pixel circuit is configured to respectively drive the at least one first light emitting element.

For example, in at least one example of the display substrate, the display region further comprises a third display region. The third display region at least partially surrounds the second display region; the at least one first light emitting element comprises a plurality of first light emitting elements; the second display region comprises a plurality of second light emitting elements; the third display region comprises a plurality of third light emitting elements; and the at least one first signal line is configured to drive the first light emitting elements and the third light emitting elements which are arranged in parallel along the first direction.

For example, in at least one example of the display substrate, the display substrate further comprises at least one second signal line. The at least one second signal line comprises a second main body portion, and the second main body portion extends along a second direction intersecting with the first direction; a dummy extending line, extending along the first direction, of the first main body portion intersects with a dummy extending line, extending along the second direction, of the second main body portion in the first display region; and the second main body portion of the at least one second signal line is electrically connected to the at least one first pixel circuit, so as to provide a second driving signal different from the first driving signal for the at least one first pixel circuit.

For example, in at least one example of the display substrate, the at least one connecting wire extends to the second display region from the first display region along the second direction.

For example, in at least one example of the display substrate, the first main body portion comprises a first sub-portion and a second sub-portion which are spaced by the first display region; the first sub-portion and the second sub-portion are electrically connected through the first winding portion; and at least part of the first winding portion intersects with a dummy connecting line positioned between the first sub-portion and the second sub-portion and extending along the first direction.

For example, in at least one example of the display substrate, the first winding portion is an arc line, a first end of the arc line is connected with an end portion, close to the second sub-portion, of the first sub-portion, and a second end of the arc line is connected with an end portion, close to the first sub-portion, of the second sub-portion; or the first winding portion comprises a first line segment, a second line segment, and a third line segment which are sequentially connected, an end portion, which is not connected with the second line segment, of the first line segment is connected with the end portion, close to the second sub-portion, of the first sub-portion, an end portion, which is not connected with the second line segment, of the third line segment is connected with the end portion, close to the first sub-portion, of the second sub-portion, the second line segment extends along the first direction, and the first line segment and the third line segment extend along a second direction intersecting with the first direction.

For example, in at least one example of the display substrate, the second display region has an inner edge and an outer edge, and the inner edge of the second display region surrounds the first winding portion.

For example, in at least one example of the display substrate, the at least one first signal line further comprises a second winding portion; a first end of the second winding portion is electrically connected to the second sub-portion, and a second end of the second winding portion is electrically connected to a corresponding first pixel circuit; the second winding portion comprises a first line portion and a second line portion which are sequentially connected; an end, which is not connected with the second line portion, of the first line portion serves as the first end of the second winding portion; an end, which is not connected with the first line portion, of the second line portion serves as the second end of the second winding portion; the first line portion extends along a second direction intersecting with the first direction; the second line portion extends along the first direction, and is arranged in parallel to the second sub-portion in the second direction; and in working process, current trend in the second line portion is opposite to current trend in the main body portion.

For example, in at least one example of the display substrate, the display substrate further comprises a peripheral region surrounding the display region. The first line portion is integrally in the peripheral region, and is arranged in parallel to the second display region in the first direction.

For example, in at least one example of the display substrate, the first line portion is integrally in the second display region, and at least part of the first line portion is arranged in parallel to the first display region in the first direction.

For example, in at least one example of the display substrate, the display substrate further comprises a peripheral region surrounding the display region. The first line portion comprises a first portion, a second portion, and a third portion which are sequentially connected; the first portion of the first line portion is electrically connected to the second sub-portion, and the third portion of the first line portion is electrically connected to the second line portion; the first portion of the first line portion is in the peripheral region, and is arranged in parallel to the second display region in the first direction; the second portion of the first line portion extends to the second display region from the peripheral region along the first direction; and the third portion of the first line portion is in the second display region, and a dummy extending line, extending along the second direction, of the third portion of the first line portion is arranged in parallel to the first display region in the first direction.

For example, in at least one example of the display substrate, the at least one first signal line further comprises a third winding portion; and a first end of the third winding portion is electrically connected to the first sub-portion, a second end of the third winding portion is electrically connected to a corresponding first pixel circuit, and the first pixel circuit connected to the second winding portion is different from the first pixel circuit connected to the third winding portion.

For example, in at least one example of the display substrate, the third winding portion comprises a third line portion and a fourth line portion which are sequentially connected; an end, which is not connected with the fourth line portion, of the third line portion serves as the first end of the third winding portion, and an end, which is not connected with the third line portion, of the fourth line portion, serves as the second end of the third winding portion; the third line portion extends along the second direction, and is arranged in parallel to the first line portion in the first direction; the fourth line portion extends along the first direction, and is arranged in parallel to the first sub-portion in the second direction; and in the working process, current trend in the fourth line portion is same with current trend in the main body portion.

For example, in at least one example of the display substrate, the first main body portion, the first winding portion, and the second line portion are in a first electrode layer of the display substrate; the first line portion is in a second electrode layer of the display substrate; the first electrode layer and the second electrode layer are stacked in a normal direction of a display surface of the display substrate; and the first line portion is electrically connected to the second sub-portion and the second line portion through a first via hole and a second via hole of an insulating layer between the first electrode layer and the second electrode layer, respectively.

For example, in at least one example of the display substrate, each of the at least one first pixel circuit comprises a thin film transistor; the thin film transistor comprises a gate electrode and source and drain electrodes; and the source and drain electrodes are in the first electrode layer, and the gate electrode is in the second electrode layer.

For example, in at least one example of the display substrate, the first winding portion surrounds the first display region, and is integrally in the second display region; the first winding portion comprises a fifth line portion, a sixth line portion, and a seventh line portion which are sequentially connected; the fifth line portion is electrically connected to the first sub-portion, and the seventh line portion is electrically connected to the second sub-portion; the sixth line portion extends along the first direction, and the fifth line portion and the seventh line portion extend along a second direction intersecting with the first direction; the sixth line portion and the dummy connecting line positioned between the first sub-portion and the second sub-portion and extending along the first direction are arranged in parallel in the first direction; the sixth line portion at least partially overlaps with the first pixel circuit electrically connected to the sixth line portion; and in working process, current trend in the sixth line portion is same with current trend in the main body portion.

For example, in at least one example of the display substrate, the first winding portion surrounds the first display region, and is integrally in the second display region; the first winding portion comprises an eighth line portion and a ninth line portion which are sequentially connected; the eighth line portion is electrically connected to the first main body portion, and extends along the second direction; the ninth line portion extends along the first direction, and is arranged in parallel to the dummy extending line of the first main body portion in the first direction; in working process, current trend in the ninth line portion is same with current trend in the main body portion; and the ninth line portion is electrically connected to the first pixel circuit configured to drive a first number of first light emitting elements arranged in parallel in the first display region along the first direction.

For example, in at least one example of the display substrate, the second signal line further comprises a fourth winding portion, and the fourth winding portion is routed deviated from the dummy extending line of the second main body portion along the second direction; the second main body portion comprises a third sub-portion and a fourth sub-portion which are spaced by the first display region, and the third sub-portion is electrically connected to the fourth sub-portion through the fourth winding portion; and the fourth winding portion is routed deviated from a dummy connecting line positioned between the third sub-portion and the fourth sub-portion and extending along the second direction.

For example, in at least one example of the display substrate, each of the at least one first pixel circuit comprises a thin film transistor, and the thin film transistor comprises a gate electrode and source and drain electrodes; and the source and drain electrodes, the first winding portion, and the second signal line are all in a first electrode layer, and the first main body portion and the gate electrode are in a second electrode layer.

For example, in at least one example of the display substrate, a portion, in the first display region, of the at least one connecting wire is a transparent wire.

At least one embodiment of the present disclosure further provides a display device, which comprises the display substrate provided by at least one embodiment of the present disclosure.

For example, in at least one example of the display device, the display device further comprises a sensor. The sensor is on a non-display side of the display substrate, stacks on the first display region in a normal direction of a display surface of the display substrate, and is configured to receive and process an optical signal passing through the first display region.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The inventor of the present disclosure notes that for a current display substrate with an in-screen sensor (e.g., a camera), in order to improve the transmittance of the display region, corresponding to the in-screen sensor (e.g., the camera), of the display substrate, the unit area distribution density (or called pixel per inch (PPI)) of the light emitting elements in the display region corresponding to the in-screen sensor (the camera) is smaller than the unit area distribution density of the light emitting elements in other display regions of the display substrate. Exemplary illustration is carried out below in connection with FIG. 1A and FIG. 1B.

Figure 1A:
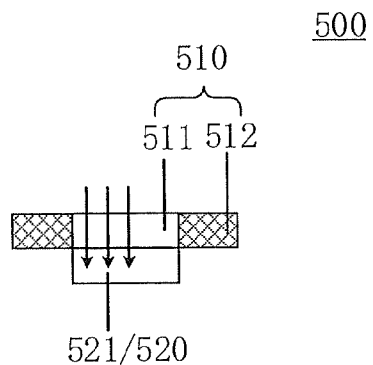
FIG. 1A is a sectional schematic diagram of a display substrate.
Figure 1B:
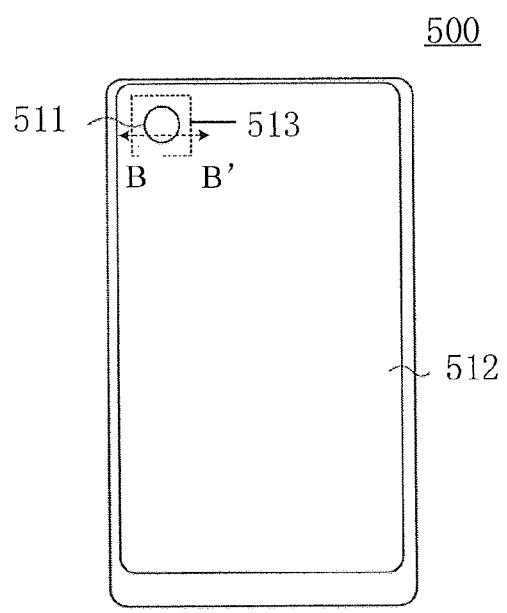
FIG. 1B is a plane schematic diagram of the display substrate illustrated in FIG. 1A.
Figure 1C:
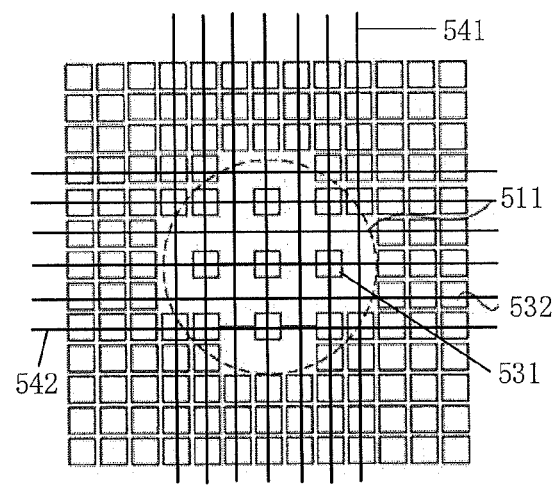
FIG. 1C is a schematic diagram of a partial region of the display substrate illustrated in FIG. 1B.

FIG. 1A is a sectional schematic diagram of a display substrate 500, FIG. 1B is a plane schematic diagram of the display substrate 500 illustrated in FIG. 1A, and the display substrate 500 illustrated in FIG. 1A corresponds to the BB' line of the display substrate 10 illustrated in FIG. 1B. FIG. 1C is a schematic diagram of a partial region 513 of the display substrate 500 illustrated in FIG. 1B.

As illustrated in FIG. 1A, the display substrate 500 includes a display layer 510 and a sensing layer 520, and the sensing layer 520 is arranged on a non-display side (i.e., one side facing away from a user) of the display substrate 500. As illustrated in FIG. 1A to FIG. 1C, the display layer 510 includes a first display region 511 and a second display region 512; the first display region 511 includes a plurality of first pixel units 531 arranged in an array, and each of the plurality of first pixel units 531 includes a first light emitting element and a first pixel circuit; and the second display region 512 includes a plurality of second pixel units 532 arranged in an array, and each of the plurality of second pixel units 532 includes a second light emitting element and a second pixel circuit. For example, the plurality of first light emitting elements and the plurality of second light emitting elements have the same structure and performance characteristics; and the plurality of first pixel circuits and the plurality of second pixel circuits have the same structure and performance characteristics.

As illustrated in FIG. 1A, the sensing layer 520 includes a sensor 521, and the sensor 521 is stacked with the first display region 511 in the normal direction of a display surface of the display substrate 500 and is configured to receive and process an optical signal passing through the first display region 511.

As illustrated in FIG. 1C, in order to reduce the shielding of the elements in the first display region 511 on the optical signal incident to the first display region 511 and transmitted towards the sensor 521, the unit area distribution density of the plurality of first pixel units 531 in the first display region 511 is smaller than, that of the plurality of second pixel units 532 in the second display region 512, and the unit area distribution density of the plurality of first light emitting elements in the first display region 511 is smaller than that of the plurality of second light emitting elements in the second display region 512.

The inventor of the present disclosure further notes that although the transmittance of the display region, corresponding to the in-screen sensor (the camera), of the display substrate can be improved to a certain degree by reducing the unit area distribution density (PPI) of the first light emitting elements and increasing the spacing between the adjacent first light emitting elements, the promotion effect of this solution on the transmittance is still limited, and this solution is difficult to completely meet the demand of the user for acquiring high-quality pictures by the in-screen camera.

Figure 1D:
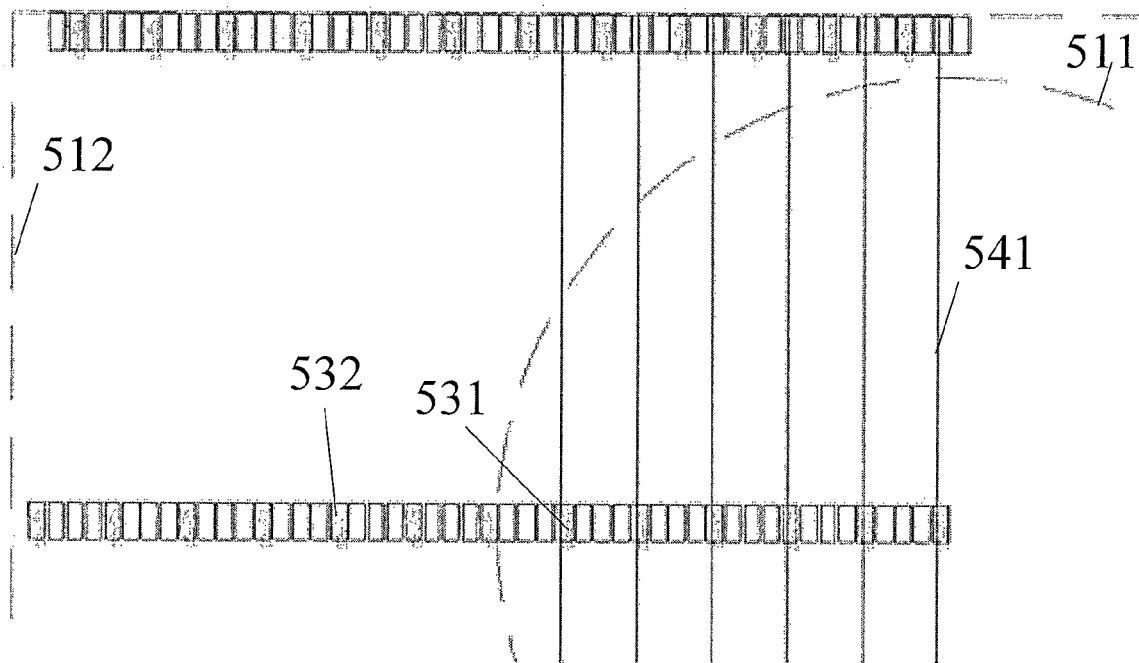
FIG. 1D is a schematic diagram of part of a first display region and part of a second display region of the display substrate illustrated in FIG. 1B.

As illustrated in FIG. 1A to FIG. 1C, a data line 541 and a gate line 542 of the display substrate pass through the first display region 511. FIG. 1D is a schematic diagram of part of the first display region and part of the second display region of the display substrate 500 illustrated in FIG. 1B. As illustrated in FIG. 1D, the data line 541 passes through the first display region 511.

The inventor of the present disclosure further notes that the data line 541 and the gate line 542 which pass through the first display region 511 not only may block light incident to the first display region 511 and transmitted towards the sensor 521, but also may cause diffraction, resulting in that the image output by the sensor has ghosting or a ghost image, so that the image quality of the image output by the sensor is further reduced.

At least one embodiment of the present disclosure provides a display substrate and a display device. The display substrate includes a display region, at least one first signal line, and at least one connecting wire. The display region includes a first display region and a second display region; the second display region at least partially surrounds the first display region; the first display region includes at least one first light emitting element, and the second display region includes at least one first pixel circuit; the at least one first signal line includes a first main body portion and a first winding portion; the first main body portion extends along a first direction, and at least part of the first winding portion extends along a direction intersecting with the first direction; at least one first signal line is electrically connected to at least one first pixel circuit, so as to provide a first driving signal for the at least one first pixel circuit; at least one first pixel circuit is respectively connected to at least one first light emitting element through the corresponding connecting wire; and at least one first pixel circuit is configured to respectively drive at least one first light emitting element.

At least one embodiment of the present disclosure further provides a display device, which includes any one of the display substrates provided by at least one embodiment of the present disclosure. The display substrate and the display device can promote the transmittance of the first display region.

The display substrate and the display device provided by at least one embodiment of the present disclosure are illustrated in a non-limiting manner below by several examples or embodiments, and as described below, different characteristics in those specific examples or embodiments can be combined with each other in the case of no mutual conflict, so as to obtain new examples or embodiments, which all shall fall within the scope of protection of the present disclosure.

Figure 2A:
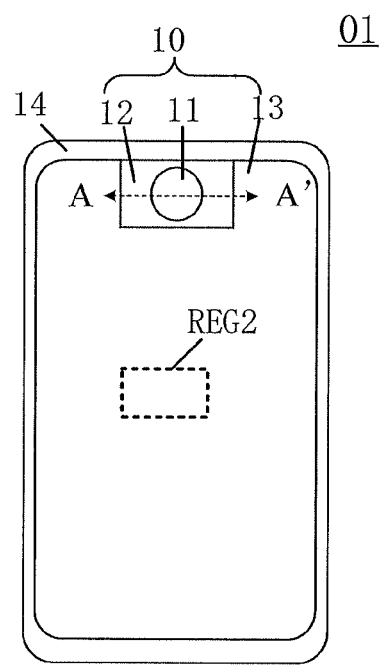
FIG. 2A is a plane schematic diagram of a display substrate provided by at least one embodiment of the present disclosure.

FIG. 2A is a plane schematic diagram of a display substrate 01 provided by at least one embodiment of the present disclosure. As illustrated in FIG. 2A, the display substrate 01 includes a display region 10 and a peripheral region 14, the display region 10 includes a first display region 11, a second display region 12, and a third display region 13, and the peripheral region 14 at least partially surrounds (e.g., fully surrounds) the third display region 13. For example, as illustrated in FIG. 2A, the first display region 11, the second display region 12 and the third display region 13 do not overlap with each other. For example, as illustrated in FIG. 2A, the third display region 13 at least partially surrounds (for example, partially surrounds) the second display region 12. For example, as illustrated in FIG. 2A, the third display region 13 partially surrounds the second display region 12. It should be noted that in some examples, the display substrate 01 also may not have the peripheral region 14.

Figure 2B:
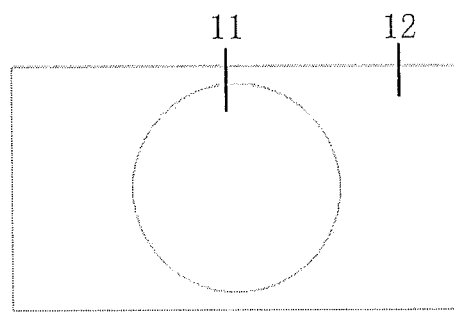
FIG. 2B is a plane schematic diagram of a first display region and a second display region of the display substrate illustrated in FIG. 2A.

FIG. 2B is a plane schematic diagram of the first display region 11 and the second display region 12 of the display substrate 01 illustrated in FIG. 2A. For example, as illustrated in FIG. 2A and FIG. 2B, the second display region 12 at least partially surrounds (e.g., completely surrounds) the first display region 11.

For example, as illustrated in FIG. 2A and FIG. 2B, the first display region 11 may be of a round shape, the second display region 12 may be of a rectangle shape, but the embodiments of the present disclosure are not limited thereto. For another example, both the first display region 11 and the second display region 12 may be of the rectangle shape or other suitable shapes.

Figure 2C:
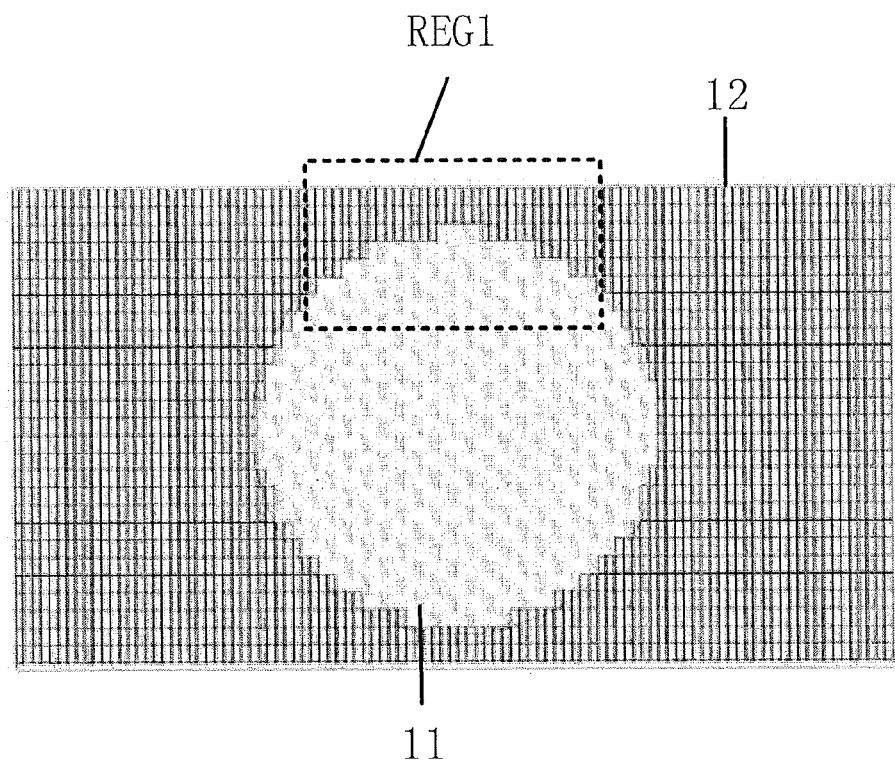
FIG. 2C is an example of the first display region and the second display region of the display substrate illustrated in FIG. 2B.
Figure 2D:
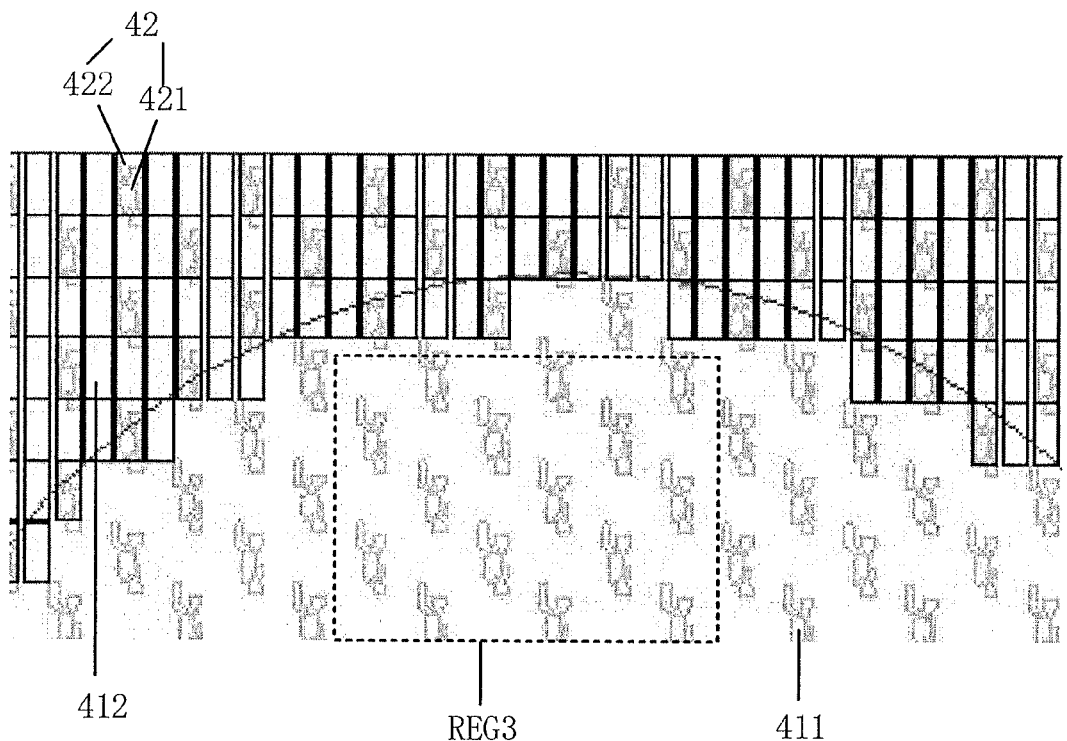
FIG. 2D is an enlarged view of a partial region of FIG. 2C.
Figure 2E:
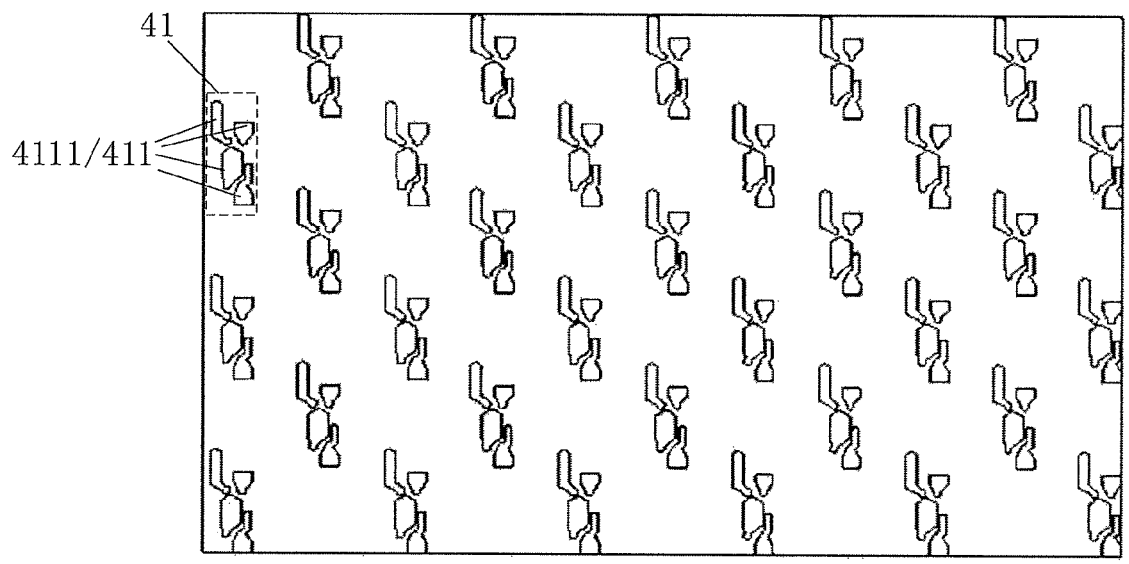
FIG. 2E is an enlarged view of a partial region of the first display region illustrated in FIG. 2D.

FIG. 2C is an example of the first display region 11 and the second display region 12 of the display substrate 01 illustrated in FIG. 2B. FIG. 2D is an enlarged view of a partial region REG1 of FIG. 2C. FIG. 2E is an enlarged view of a partial region REG3 of the first display region 11 illustrated in FIG. 2D.

For example, as illustrated in FIG. 2C to FIG. 2E, the first display region 11 includes a plurality of first light emitting elements 411. It should be noted that for clarity, an anode structure 4111 of the first light emitting element 411 is used in the related drawings to schematically illustrate the first light emitting element 411. For example, as illustrated in FIG. 2C to FIG. 2E, the first display region 11 includes a plurality of first pixel units 41 arranged in an array, each of the plurality of first pixel units 41 includes a first number of first light emitting elements 411, and the first number of first light emitting elements 411 are configured to emit light of a second number of colors. For example, as illustrated in FIG. 2C to FIG. 2E, the anode structures 4111 of different first light emitting elements 411 among the first number of first light emitting elements 411 are of different shapes, and correspondingly, different first light emitting elements 411 among the first number of first light emitting elements 411 are of different shapes.

For example, as illustrated in FIG. 2C to FIG. 2E, the first number may be four, the second number may be three, i.e., each of the plurality of first pixel units 41 includes four first light emitting elements 411, and the four first light emitting elements 411 are configured to emit light of three colors (e.g., red, green, and blue). For example, each of the plurality of first pixel units 41 includes four first light emitting elements 411 (e.g., GGRB, i.e., two green light emitting elements, one red light emitting element and one blue light emitting element), and the four light emitting elements (e.g., GGRB) are respectively configured to emit green, green, red and blue light. For another example, in the case that each of the plurality of first pixel units 41 includes four first light emitting elements 411, the arrangement mode of the four first light emitting elements 411 is not limited to GGRB, and the arrangement mode of the four first light emitting elements 411 also may be RGBG or other applicable arrangement modes. It should be noted that in some examples, both the first number and the second number may be three; and in this case, each of the plurality of first pixel units 41 includes three first light emitting elements 411 (e.g., RGB).

For example, as illustrated in FIG. 2C and FIG. 2D, the second display region 12 includes a plurality of first pixel circuits 412. For example, the plurality of first pixel circuits 412 are configured to drive the plurality of first light emitting elements 411 in one-to-one correspondence. For example, the white rectangular box illustrated in FIG. 2C and FIG. 2D represents a first pixel driving unit, and each first pixel driving unit includes the first number of pixel circuits. For example, the ratio of the number of the first pixel driving unit to the number of the first pixel units 41 in the second display region 12 illustrated in FIG. 2C and FIG. 2D is three; and correspondingly, the pixel circuit of only one first pixel driving unit in every three first pixel driving units is used for driving the first light emitting element 411, and thus, the pixel circuit included by the first pixel driving unit used for driving the first light emitting element 411 is called as the first pixel circuit 412, and the pixel circuit included by the first pixel driving unit which is not used for driving the first light emitting element 411 is called as a dummy pixel circuit. For example, the first pixel circuit 412 and the dummy pixel circuit have the same circuit structure. For example, the first number of first pixel circuits 412 included by each first pixel driving unit used for driving the first light emitting element 411 are configured to drive the first number of first light emitting elements 411 of one corresponding first pixel unit 41 in the plurality of first pixel units 41 in one-to-one correspondence. For example, as illustrated in FIG. 2C to FIG. 2E, the plurality of first light emitting elements 411 are arranged in an array, and the plurality of first pixel circuits 412 are arranged in an array. For clarity, the specific structures of the first light emitting element 411 and the first pixel circuit 412 are described in an example illustrated in FIG. 5D, and are not repeated herein.

For example, as illustrated in FIG. 2C and FIG. 2D, the second display region 12 further includes a plurality of second pixel units 42, and each of the plurality of second pixel units 42 includes a second light emitting element 421 (e.g., the first number of second light emitting elements 421) and a second pixel circuit 422 (e.g., the first number of second pixel circuits 422) for driving the second light emitting element 421. For example, as illustrated in FIG. 2C and FIG. 2D, the second light emitting element 421 and the second pixel circuit 422 (i.e., the rectangular box at least partially overlapping with the second light emitting element 421) included by each of the second pixel units 42 at least partially overlap in the normal direction of a display surface of the display substrate 01 (e.g., a direction perpendicular to the display substrate 01). For example, as illustrated in FIG. 2C and FIG. 2D, the plurality of second pixel units 42 are arranged in an array. For clarity, the specific structure of the second pixel unit 42 is described in an example illustrated in FIG. 5E, and is not repeated herein. It should be noted that the rectangular box illustrated in FIG. 2D is merely used for illustrating the second pixel circuit 422, but does not represent the specific shape of the second pixel circuit 422 and the specific boundary of the second pixel circuit 422.

For example, the first number of second light emitting elements 421 included by the second pixel unit 42 and the first number of first light emitting elements 411 included by the first pixel unit 41 have the same arrangement mode and structure. For example, the first number of second pixel circuits 422 included by the second pixel unit 42 and the first number of first pixel circuits 412 included by the first pixel driving unit used for driving the first light emitting element 411 have the same arrangement mode and structure.

Figure 2F:
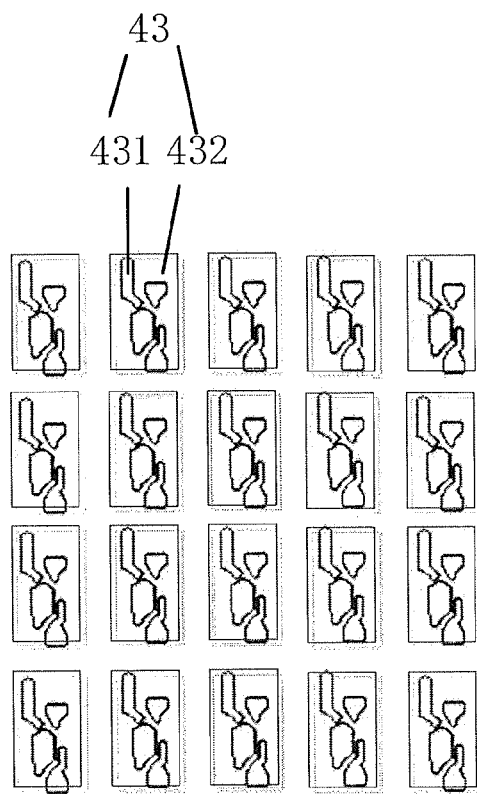
FIG. 2F is an enlarged view of a partial region of a third display region of the display substrate illustrated in FIG. 2A.

FIG. 2F is an enlarged view of a partial region REG2 of a third display region 13 of the display substrate 01 illustrated in FIG. 2A. For example, as illustrated in FIG. 2F, the third display region 13 includes a plurality of third pixel units 43, and each of the plurality of third pixel units 43 includes a third light emitting element 431 (e.g., the first number of third light emitting elements 431) and a third pixel circuit 432 (e.g., the first number of third pixel circuits 432) for driving the third light emitting element 431. For example, as illustrated in FIG. 2F, the third light emitting element 431 and the third pixel circuit 432 included by each of the plurality of third pixel units 43 at least partially overlap in the normal direction of the display surface of the display substrate 01. For clarity, the specific structure of the third pixel unit 43 is described in an example illustrated in FIG. 5F, and is not repeated herein. It should be noted that the rectangular box illustrated in FIG. 2F is merely used for illustrating the third pixel circuit 432, but does not represent the specific shape of the third pixel circuit 432 and the specific boundary of the third pixel circuit 432.

For example, the first number of third light emitting elements 431 included by the third pixel unit 43 and the first number of first light emitting elements 411 included by the first pixel unit 41 have the same arrangement mode and structure. For example, the first number of third pixel circuits 432 included by the third pixel unit 43 and the first number of first pixel circuits 412 included by the first pixel driving unit used for driving the first light emitting element 411 have the same arrangement mode and structure.

For example, as illustrated in FIG. 2D and FIG. 2F, the unit area distribution density of the plurality of first light emitting elements 411 in the first display region 11 is smaller than that of the plurality of third light emitting elements 431 in the second display region 12; and the unit area distribution density of the plurality of second light emitting elements 421 in the second display region 12 is smaller than that of the plurality of third light emitting elements 431 in the second display region 12. For example, the first display region 11 and the second display region 12 can be called as low-resolution regions of the display substrate 01. For example, as illustrated in FIG. 2D, the unit area distribution density of the plurality of first light emitting elements 411 in the first display region 11 is equal to that of the plurality of second light emitting elements 421 in the second display region 12.

Figure 3:
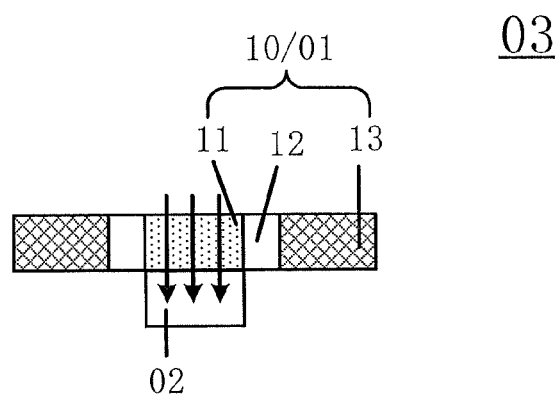
FIG. 3 is a sectional schematic diagram of a display device provided by at least one embodiment of the present disclosure.

FIG. 3 is a sectional schematic diagram of a display device 03 provided by at least one embodiment of the present disclosure. As illustrated in FIG. 3, the display device 03 includes the display substrate 01 illustrated in FIG. 2A. The sectional schematic diagram of the display device 03 illustrated in FIG. 3 corresponds to the AA' line in FIG. 2A. As illustrated in FIG. 3, the display device 03 further includes a sensor 02.

For example, the display substrate 01 includes a display side and a non-display side which are opposite to each other, and the display substrate 01 is configured to execute the display operation on the display side of the display substrate 01, i.e., the display side of the display substrate 01 is a light emergent side of the display substrate 01 and faces a user. The display side and the non-display side are opposite in the normal direction of the display surface of the display substrate 01.

As illustrated in FIG. 3, the sensor 02 is stacked with the first display region 11 in the normal direction of the display surface of the display substrate 01 (e.g., the direction perpendicular to the display substrate 01) and is configured to receive and process an optical signal passing through the first display region 11, and the optical signal may be visible light, infrared light and the like. For example, the pixel circuit is not arranged in the first display region 11; and in this case, the transmittance of the first display region 11 can be improved.

For example, by arranging the plurality of first pixel circuits 412 which are configured to correspondingly drive the plurality of first light emitting elements 411 in the second display region 12 and enabling the sensor 02 to be attacked with the first display region 11 in the normal direction of the display surface of the display substrate 01, shielding of the element in the first display region 11 on the optical signal incident to the first display region 11 and transmitted towards the sensor 02 can be reduced, so that the signal-to-noise ratio of the image output by the sensor 02 can be improved. For example, the first display region 11 can be called as a high-transmittance region of the low-resolution region of the display substrate 01.

For example, the sensor 02 may be an image sensor, can be used for acquiring an image of an external environment which a light collecting surface of the sensor 02 faces, and for example, may be a CMOS image sensor or a CCD image sensor; and the sensor 02 also may be an infrared sensor, a distance sensor, or the like. For example, in the case that the display device 03 is a mobile terminal such as a mobile phone and a notebook, the sensor 02 can be used for implementing a camera of the mobile terminal such as the mobile phone and the notebook, and also can include an optical device, e.g., a lens, a reflector, an optical waveguide, or the like, as required, so as to modulate the optical path. For example, the sensor 02 may include photosensitive pixels arranged in an array. For example, each photosensitive pixel can include a light-sensitive detector (e.g., a photodiode, or a phototransistor) and a switching transistor (e.g., the switching transistor). For example, the photodiode can convert the optical signal irradiated on the photodiode into an electric signal, and the switching transistor can be electrically connected to the photodiode so as to control whether the photodiode is in a state of acquiring the optical signal and control time of acquiring the optical signal.

In some examples, only the anode of the first light emitting element 411 in the first display region 11 is light-proof, i.e., the wire for driving the first light emitting element 411 bypasses the first display region 11 or is set as a transparent wire; and in this case, not only can the transmittance of the first display region 11 be further improved, but also diffraction caused by each element in the first display region 11 can be reduced. Exemplary illustration is carried out below in connection with an example illustrated in FIG. 4.

Figure 4:
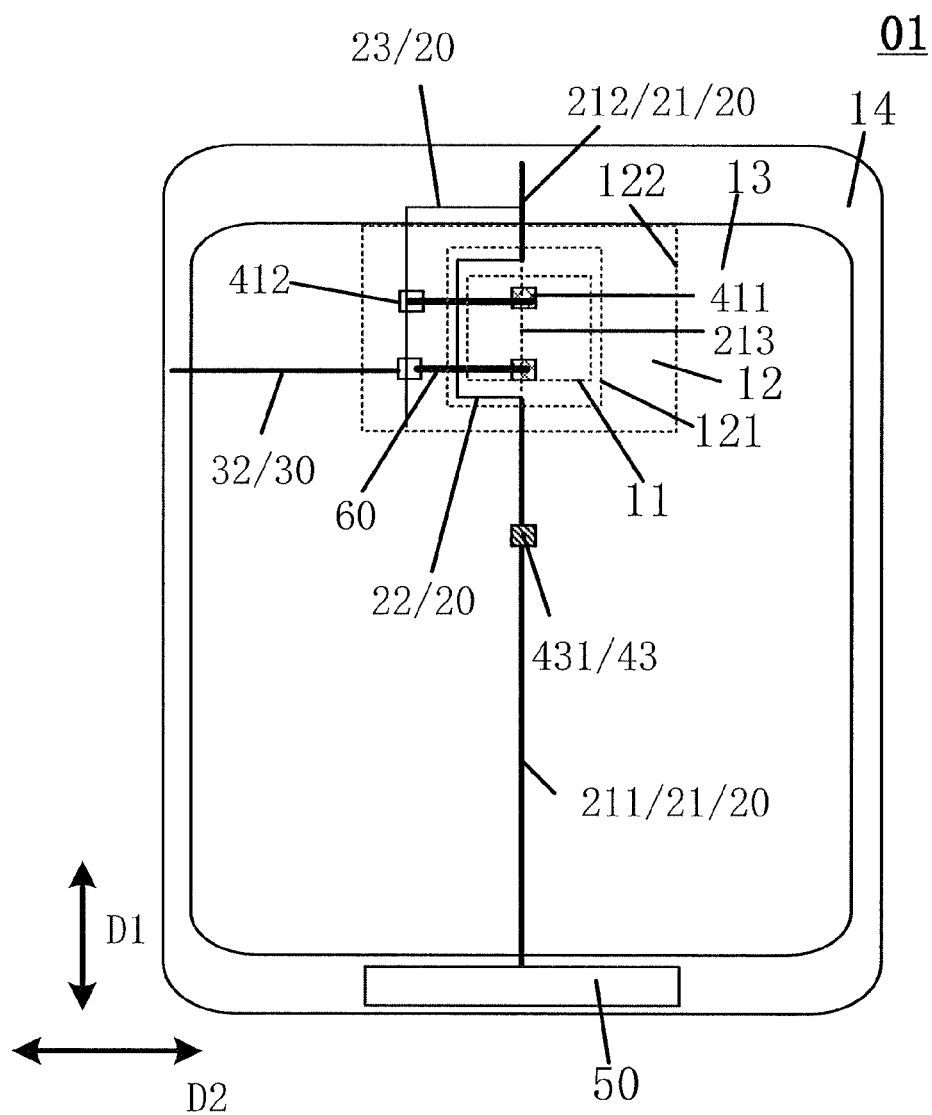
FIG. 4 is a first example of the display substrate illustrated in FIG. 2A.
Figure 5A:
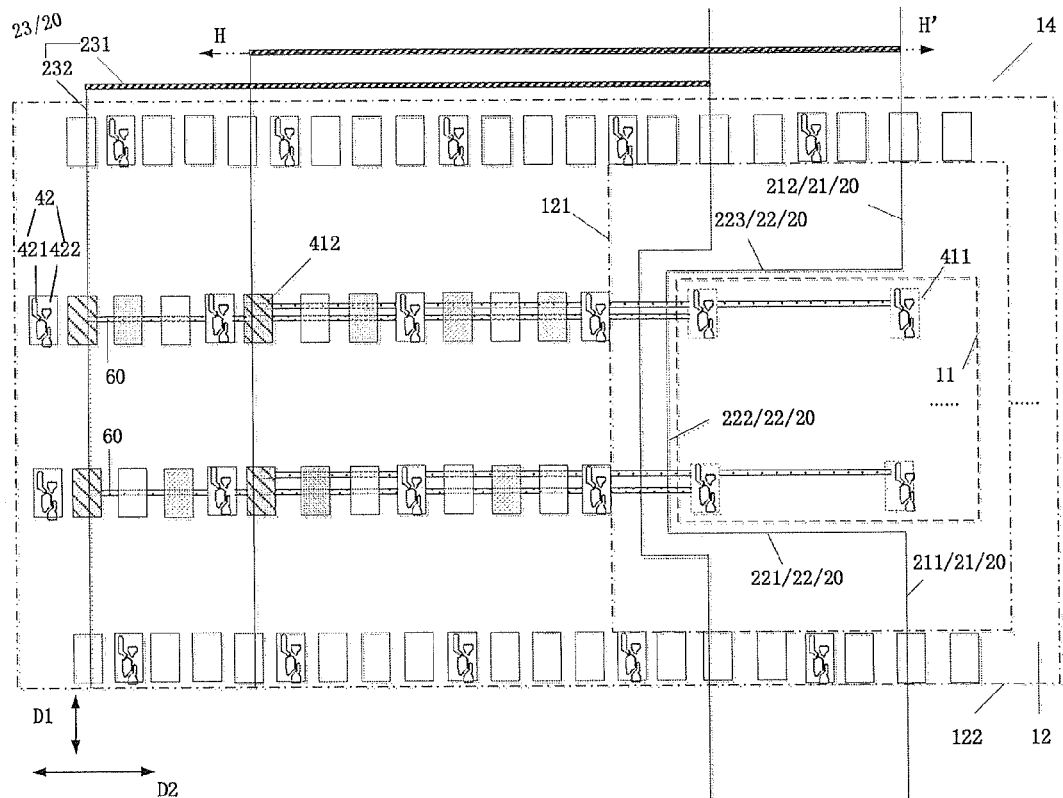
FIG. 5A is a first schematic diagram for illustrating a first display region, a second display region, and part of a peripheral region of the display substrate illustrated in FIG. 4.

FIG. 4 is a first example of the display substrate 01 illustrated in FIG. 2A. FIG. 5A is a first schematic diagram for illustrating a first display region 11, a second display region 12 and part of a peripheral region 14 of the display substrate 01 illustrated in FIG. 4.

As illustrated in FIG. 4 and FIG. 5A, the display substrate 01 includes at least one first signal line 20, at least one second signal line 30, and at least one connecting wire 60. It should be noted that for clarity, in FIG. 4, the sizes of the first display region 11 and the second display region 12 are enlarged, and the size of the third display region 13 in the first direction D1 is shortened. In order to facilitate description, FIG. 4 also illustrates a data driving circuit.

In an example, at least one first signal line includes a plurality of first signal lines, and at least one first pixel circuit includes a plurality of first pixel circuits; in another example, at least one first signal line includes one first signal line, and at least one first pixel circuit includes a plurality of first pixel circuits; and in yet another example, at least one first signal line includes a plurality of first signal lines, and at least one first pixel circuit includes one first pixel circuit.

For example, as illustrated in FIG. 4 and FIG. 5A, the first display region 11 includes at least one first light emitting element 411, and the second display region 12 includes at least one first pixel circuit 412; at least one connecting wire 60 is electrically connected to at least one first pixel circuit 412 and at least one first light emitting element 411 in one-to-one correspondence; and at least one first pixel circuit 412 is configured to drive at least one first light emitting element 411 in one-to-one correspondence.

For example, as illustrated in FIG. 4 and FIG. 5A, at least one connecting wire 60 extends to the second display region 12 from the first display region 11 along a second direction D2. It should be noted that line segments illustrated in FIG. 5A and connected between the first number of first light emitting elements 411 included by each first pixel unit 41 and the first number of first pixel circuits 412 included by each first pixel driving unit for driving the first light emitting element 411 represent the first number (e.g., four) of connecting wires 60.

For example, as illustrated in FIG. 4 and FIG. 5A, at least one first pixel circuit 412 and at least one first light emitting element 411 correspondingly driven by at least one first pixel circuit 412 are respectively arranged in parallel in the second direction D2 intersecting with (e.g., perpendicular to) the first direction D1.

For example, a portion, which is positioned in the first display region 11, of at least one connecting wire 60 is a transparent wire; and in this case, not only can the transmittance of the first display region 11 and the signal-to-noise ratio of the image output by the sensor 02 be further improved, but also diffraction caused by a nontransparent wire can be reduced, so that the image quality of the image output by the sensor can be further improved. For example, at least one connecting wire 60 is integrally made of a transparent conducting material. For example, the transparent conducting material may be selected from transparent metal oxide such as indium tin oxide (ITO), indium zinc oxide (IZO), or the like.

In some examples, in order to reduce the resistance of the connecting wire 60 and improve the transmission speed of the signal on the connecting wire 60, the connecting wire can include a first portion in the first display region and a second portion in the second display region, which are electrically connected with each other, the first portion includes a first light transmitting wire layer made of the transparent conducting material, and the second portion includes a metal wire layer made of a metal material, which are not repeated herein.

For example, as illustrated in FIG. 4 and FIG. 5A, at least one connecting wire 60 includes a plurality of connecting wires 60, and at least one first light emitting element 411 includes a plurality of first light emitting elements 411; and the length of at least one of the plurality of connecting wires 60 is greater than twice of the spacing between two adjacent first pixel units 41.

For example, the resistances of the plurality of connecting wires 60 are equal to each other, so that uniformity (e.g., in the case that data signals are equal to each other) of the driving current can be improved. For example, as illustrated in FIG. 4 and FIG. 5A, the lengths of the plurality of connecting wires 60 are equal to each other, so that the resistances of the plurality of connecting wires 60 can be equal to each other in the case that the plurality of connecting wires 60 are made of the same material.

For example, as illustrated in FIG. 4 and FIG. 5A, at least one first signal line 20 includes a first main body portion 21 and a first winding portion 22; and the first main body portion 21 extends along the first direction D1, and the first winding portion 22 is routed deviated from a dummy extending line 213 of the first main body portion 21 along the first direction D1. For example, at least part of the first winding portion 22 extends along a direction intersecting with the first direction D1. For example, at least part of the first winding portion 22 extends along a direction perpendicular to the first direction D1.

For example, as illustrated in FIG. 4, at least one second signal line 30 includes a second main body portion 32, and the second main body portion 32 extends along the second direction D2; and the dummy extending line of the first main body portion 21 along the first direction D1 intersects with a dummy extending line of the second main body portion 32 along the second direction D2 in the first display region 11. In some examples, the second signal line 30 also includes a winding portion (e.g., a winding portion surrounding the first display region 11), so that the second signal line still can simultaneously drive the pixel circuits positioned on both sides of the first display region 11 in the second direction D2 and in the same row in the case of not passing through the first display region, which is not repeated herein.

It should be noted that in order to indicate that the first signal line and the second signal line are used for driving the corresponding pixel circuits, the first signal line intersects with the second signal line at the positions of the correspondingly driven pixel circuits, but the embodiments of the present disclosure are not limited thereto. For example, the first signal line and the second signal line can be closely adjacent to the pixel circuits driven by the first signal line and the second signal line, but do not intersect with each other at the positions of the pixel circuits, and the pixel circuits can be electrically connected to the corresponding first signal line and second signal line by using the corresponding wires.

For example, as illustrated in FIG. 4, at least one first signal line 20 is electrically connected to at least one first pixel circuit 412, so as to provide a first driving signal for at least one first pixel circuit 412; and the second main body portion 32 of at least one second signal line 30 is electrically connected to at least one first pixel circuit 412, so as to provide a second driving signal different from the first driving signal for at least one first pixel circuit 412.

For example, as illustrated in FIG. 4, at least one first signal line 20 is electrically connected to a data driving circuit 50, so as to receive the first driving signal from the data driving circuit 50, i.e., the first signal line 20 is a data line and the first driving signal is a data signal.

For example, as illustrated in FIG. 4, the first direction D1 and the second direction D2 are a column direction and a row direction of the display substrate 01, respectively; the first signal line 20 and the second signal line 30 are a data line and a gate line of the display substrate 01, respectively; and the first driving signal and the second driving signal are the data signal and the gate scanning signal, respectively.

For example, as illustrated in FIG. 4 and FIG. 5A, at least one first signal line 20 is configured to drive the first light emitting element 411 and the third light emitting element 431 which are arranged in parallel along the first direction D1, i.e., the first light emitting element 411 and the third light emitting element 431 which are driven by the same first signal line 20 are positioned in the same column of the display substrate 01. For example, at least one first signal line 20 is configured to drive the first light emitting element 411, the second light emitting element 421, and the third light emitting element 431 which are arranged in parallel along the first direction D1, i.e., the first light emitting element 411, the second light emitting element 421 and the third light emitting element 431 which are driven by the same first signal line 20 are positioned in the same column of the display region of the display substrate 01.

It should be noted that the display substrate further includes a third signal line (e.g., the data line) and a fourth signal line (e.g., the gate line), the third signal line extends along the first direction D1, and the fourth signal line extends along the second direction D2; and both the third signal line and the fourth signal line are straight line segments, and do not overlap with the first display region 11 (i.e., do not pass through the first display region 11).

For example, as illustrated in FIG. 4 and FIG. 5A, the first main body portion 21 includes a first sub-portion 211 and a second sub-portion 212 spaced by the first display region 11 (i.e., the first sub-portion 211 and the second sub-portion 212 are respectively positioned on different sides of the first display region 11 in the first direction D1); the first sub-portion 211 is electrically connected to the second sub-portion 212 through the first winding portion 22; and the first winding portion 22 is routed deviated from a dummy connecting line positioned between the first sub-portion 211 and the second sub-portion 212 and extending along the first direction D1 (i.e., the dummy extending line 213 of the first main body portion 21 along the first direction D1). For example, both the first sub-portion 211 and the second sub-portion 212 are straight line segments.

For example, as illustrated in FIG. 4 and FIG. 5A, by enabling the first winding portion 22 to be routed deviated from the dummy extending line of the first main body portion 21 along the first direction D1, overlapping of the first signal line 20 and the first light emitting element 411 driven by the first signal line 20 as well as neighboring regions thereof can be avoided, so that the transmittance of the display region 10 near the first light emitting element 411 driven by the first signal line 20 can be improved.

For example, as illustrated in FIG. 4 and FIG. 5A, the second display region 12 has an inner edge 121 and an outer edge 122. For example, as illustrated in FIG. 4 and FIG. 5A, the inner edge 121 of the second display region 12 is formed by a boundary, close to the first display region 11, of one circle of pixel circuits (e.g., the first pixel circuit 412 and the second pixel circuit 422) on the innermost side of the second display region 12, i.e., the inner edge 121 of the second display region 12 is formed by a boundary, close to the first display region 11, of one circle of pixel circuits which is positioned in the second display region 12 and is the closest to the first display region 11.

For example, as illustrated in FIG. 4 and FIG. 5A, the inner edge 121 of the second display region 12 surrounds the first winding portion 22; and in this case, the short circuit between the first winding portion 22 and the pixel circuits (e.g., the first pixel circuit 412 and the second pixel circuit 422) in the second display region 12 can be avoided.

In the first example, the inner edge 121 of the second display region 12 surrounds the first winding portion 22 and the first winding portion 22 surrounds the first display region 11, and in this case, not only can shielding of the first winding portion 22 on the optical signal incident to the first display region 11 and transmitted towards the sensor 02 be avoided, but also shielding of the first winding portion 22 on light emitted by the first light emitting element 411 in the first display region 11 can be avoided, so that not only can the signal-to-noise ratio of the image output by the sensor 02 be improved and diffraction caused by the first winding portion 22 can be avoided, but also the display quality of the first display region 11 can be improved.

In the second example, the inner edge 121 of the second display region 12 surrounds the first winding portion 22 and the first winding portion 22 surrounds an active boundary of the first display region 11, and in this case, shielding of the first winding portion 22 on the optical signal incident into the active boundary of the first display region 11 and transmitted towards the sensor 02 can be avoided, so that the signal-to-noise ratio of the image output by the sensor 02 and the display quality of the first display region 11 can be improved. For example, the active boundary of the first display region 11 is formed by an outer boundary of one circle of first light emitting elements 411 on the outermost side of the first display region 11, and in this case, shielding of the first winding portion 22 on the light emitted by the first light emitting element 411 in the first display region 11 can be avoided, so that the display quality of the first display region 11 can be improved. For another example, the active boundary of the first display region 11 is formed by an outer boundary of one circle of first light emitting elements 411 on the secondary outer side of the first display region 11 (i.e., one circle of light emitting elements on the outermost side in the residual first light emitting elements 411 except for the circle of first light emitting elements 411 on the outermost side of the first display region 11); and in this case, the first winding portion 22 can at least partially overlap with the circle of first light emitting elements 411 on the outermost side of the first display region 11, so that the wiring space of the first winding portion 22 can be increased in the case of slightly reducing the active area of the first display region 11.

For example, as illustrated in FIG. 5A, the first display region 11 is of a rectangle shape; the first winding portion 22 includes a first line segment 221, a second line segment 222 and a third line segment 223 which are sequentially connected; the end portion, which is not connected with the second line segment 222, of the first line segment 221 is connected with the end portion, close to the second sub-portion 212, of the first sub-portion 211; the end portion, which is not connected with the second line segment 222, of the third line segment 223 is connected with the end portion, close to the first sub-portion 211, of the second sub-portion 212; and the second line segment 222 extends along the first direction D1, and the first line segment 221 and the third line segment 223 extend along the second direction D2 intersecting with the first direction D1. For example, the first line segment 221, the second line segment 222 and the third line segment 223 are all straight line segments.

For example, as illustrated in FIG. 4 and FIG. 5A, the second line segment 222 can be positioned between the pixel circuit on the innermost side (i.e., one side close to the first display region 11) of the second display region 12 and the pixel circuit on the outermost side of the first display region 11 in the second direction D2.

For example, as illustrated in FIG. 4 and FIG. 5A, the display substrate 01 can further include a second winding portion 23. For example, at least part of the second winding portion 23 is routed along a direction intersecting (e.g., perpendicular to) the first direction D1. For example, a first end of the second winding portion 23 is electrically connected to the second sub-portion 212, and a second end of the second winding portion 23 is electrically connected to the corresponding first pixel circuit 412. For example, as illustrated in FIG. 4 and FIG. 5A, the second end of the second winding portion 23 can be electrically connected to the same column of first pixel circuits 412 (e.g., the same column of first pixel circuits 412 directly adjacent to a second line portion 232 of the second winding portion 23).

For example, as illustrated in FIG. 4 and FIG. 5A, the second winding portion 23 includes a first line portion 231 and the second line portion 232 which are sequentially connected; an end, which is not connected with the second line portion 232, of the first line portion 231 serves as the first end of the second winding portion 23; an end, which is not connected with the first line portion 231, of the second line portion 232 serves as the second end of the second winding portion 23; the first line portion 231 extends along the second direction D2; and the second line portion 232 extends along the first direction D1, and is arranged in parallel to the second sub-portion 212 in the second direction D2. For example, the second line portion 232 is a straight line segment. For example, the first line portion 231 can be a straight line segment. For another example, the first line portion 231 can be of a bent structure, and integrally extends along the second direction D2.

For example, by enabling the first signal line 20 to include the second winding portion 23, different columns of pixel circuits respectively used for driving the first light emitting element 411 and the third light emitting element 431 in the same column can be connected by using the same first signal line 20, and in this case, the data signal provided by the data driving circuit 50 can directly correspond to the position of the light emitting element, so that an algorithm of providing the data signal or the setting of the data driving circuit 50 does not need to be changed and the data driving circuit does not need to be separately provided for the data line with the winding portion, and thus, the calculation amount of the data driving circuit or a related controller and processor can be reduced. For example, by enabling the first signal line 20 to include the second winding portion 23, the first signal line for providing the data signal to the first pixel circuit configured to drive the first light emitting element does not need to be regulated into the first signal line (the portion, positioned in the third display region, of the first signal line is positioned in the same column with the first pixel circuit) in the same column of the first pixel circuit from the first signal line (a portion, positioned in the third display region, of the first signal line is positioned in the same column with the first light emitting element) in the same column with the first light emitting element.

For example, in the working process, the current trend in the second line portion 232 is opposite to the current trend in the main body portion. For example, the current trend in the first main body portion 21 flows from the lower side (one side where the data driving circuit 50 is arranged) of the display substrate 01 to the upper side of the display substrate 01, and the current trend in the second line portion 232 flows from the upper side of the display substrate 01 to the lower side of the display substrate 01.

Figure 5B:
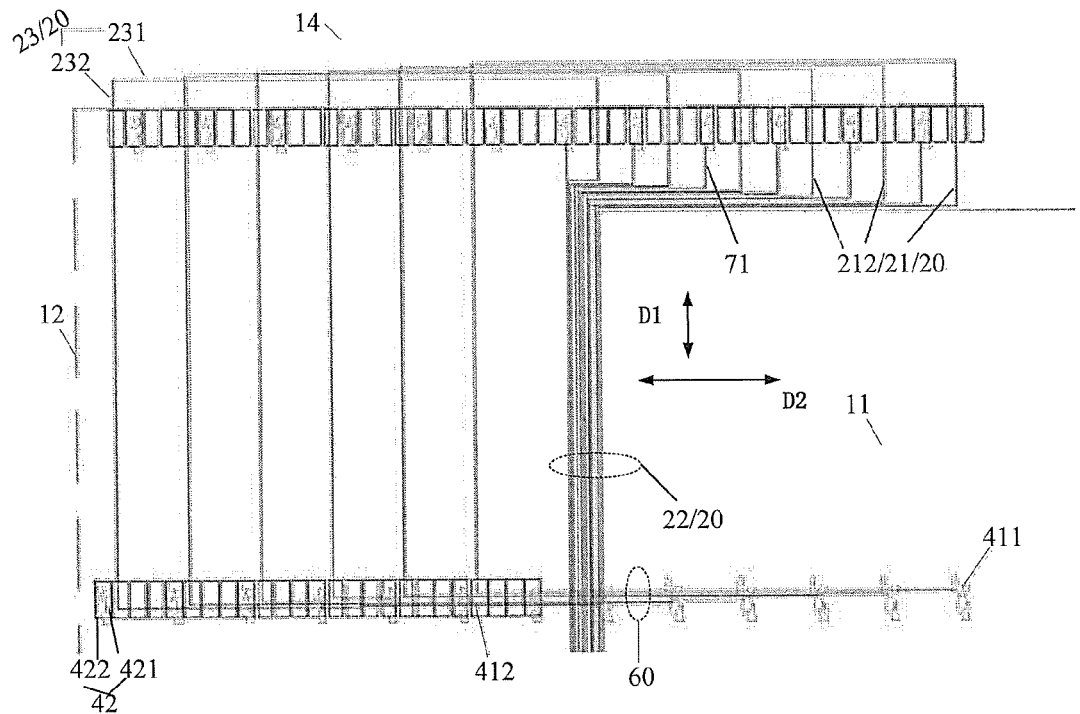
FIG. 5B is a second schematic diagram for illustrating the first display region, the second display region, and part of the peripheral region of the display substrate illustrated in FIG. 4.
Figure 5C:
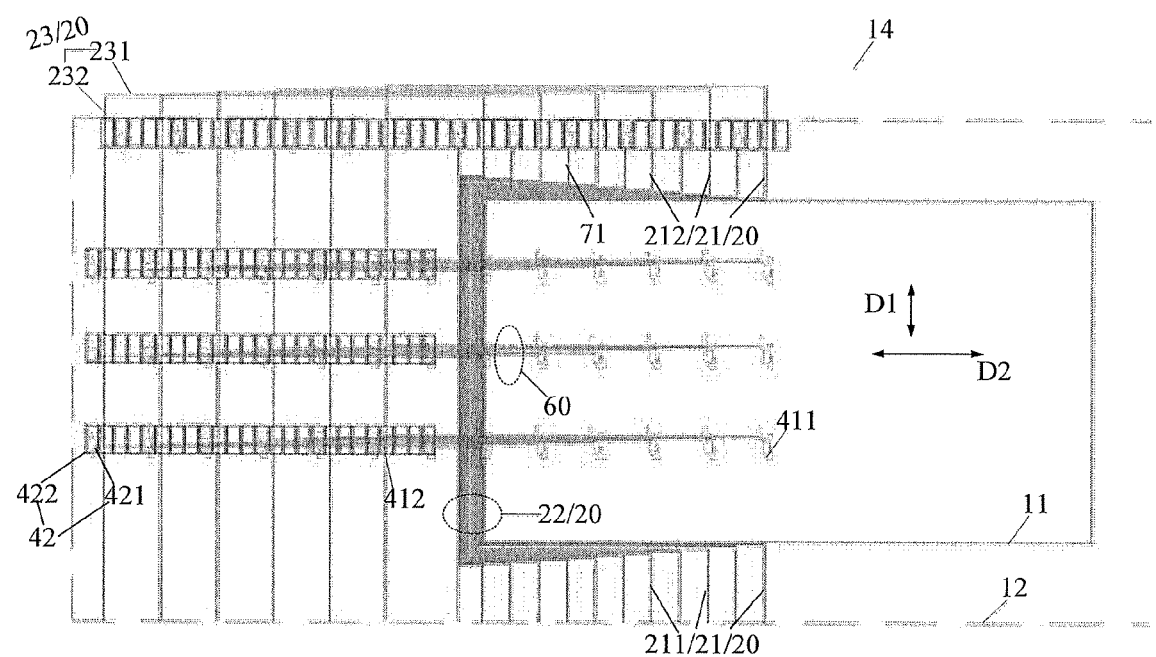
FIG. 5C is a third schematic diagram for illustrating the first display region, the second display region, and part of the peripheral region of the display substrate illustrated in FIG. 4.

FIG. 5B is a second schematic diagram for illustrating the first display region 11, the second display region 12 and part of the peripheral region 14 of the display substrate 01 illustrated in FIG. 4, and FIG. 5C is a third schematic diagram for illustrating the first display region 11, the second display region 12 and part of the peripheral region 14 of the display substrate 01 illustrated in FIG. 4. FIG. 5B is the upper half portion of FIG. 5C.

FIG. 5C is similar with FIG. 5A, and the differences between FIG. 5C and FIG. 5A are that FIG. 5C illustrates more first light emitting elements 411, connecting wires 60, first pixel circuits 412, first signal lines 20, second light emitting elements 421 and second pixel circuits 422, and FIG. 5C also illustrates a fifth signal line 71 (e.g., the data line) electrically connected to the second pixel circuit 422.

For example, as illustrated in FIG. 5B and FIG. 5C, the fifth signal line 71 also has a winding portion. For example, the fifth signal line 71 also has the winding portion surrounding the active boundary of the first display region 11, and an inner edge of the second display region 12 surrounds the winding portion of the fifth signal line 71.

For example, as illustrated in FIG. 5A to FIG. 5C, the display substrate 01 includes a plurality of first signal lines 20, and a plurality of first line portions 231 included by the plurality of first signal lines 20 are arranged in parallel in the first direction D1 (i.e., at least partially overlap with each other in the first direction D1).

For example, as illustrated in FIG. 5A to FIG. 5C, the lengths of the plurality of first line portions 231 included by the plurality of first signal lines. 20 in the second direction D2 are equal to each other, so that the uniformity (e.g., in the case that the data signals are equal to each other) of the driving current on the first line portion 231 can be further improved.

For example, the first main body portion 21, the first winding portion 22 and the second line portion 232 are positioned in a first electrode layer of the display substrate 01; the first line portion 231 is positioned in a second electrode layer of the display substrate 01; the first electrode layer and the second electrode layer are stacked in the normal direction of the display surface of the display substrate 01; and the first line portion 231 is electrically connected to the second sub-portion 212 and the second line portion 232 through a first via hole and a second via hole of an insulating layer between the first electrode layer and the second electrode layer, respectively.

For example, by enabling the first line portion 231 of the second winding portion 23 of each first signal line 20 to be positioned in different layer from other portions (e.g., the second line portion 232 and the second sub-portion 212) of each first signal line 20, the short circuit between the first line portion 231 of the second winding portion 23 of each first signal line 20 and other first signal lines 20 can be avoided.

For example, both the first electrode layer and the second electrode layer are made of a metal material. For example, the metal material can be selected from silver (Ag), aluminium (Al), molybdenum (Mo), titanium (Ti), aluminium alloy or other suitable materials.

The specific structures of the first light emitting element 411, the first pixel circuit 412, the second pixel unit 42 and the third pixel unit 43 and the relationship between each portion of the first signal line 20 and each part of the thin film transistor of the pixel circuit are exemplarily illustrated below in connection with FIG. 5D to FIG. 5G.

Figure 5D:
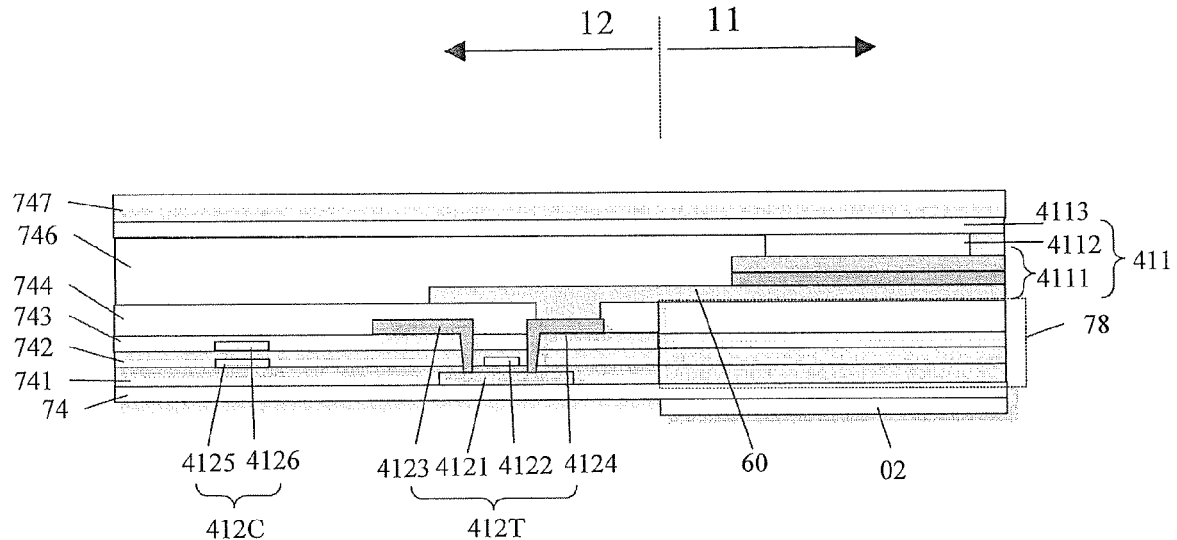
FIG. 5D illustrates a schematic diagram of a stacked structure of a first light emitting element and a first pixel circuit for driving the first light emitting element, which are provided by at least one embodiment of the present disclosure.

FIG. 5D illustrates a schematic diagram of a stacked structure of the first light emitting element 411 and the first pixel circuit 412 for driving the first light emitting element 411, which are provided by at least one embodiment of the present disclosure. For example, the first pixel circuit 412 includes structures such as a thin film transistor 412T, a storage capacitor 412C and the like. The first light emitting element 411 includes a first anode structure 4111, a first cathode structure 4113 and a first light emitting layer 4112 between the first anode structure 4111 and the first cathode structure 4113, and the first anode structure 4111 is electrically connected to the thin film transistor 412T included by the first pixel circuit 412 through a via hole. For example, the first anode structure 4111 can include a plurality of anode sub-layers and for example, include three layers of structures of ITO/Ag/ITO and the like (not illustrated in the drawings), and the embodiments of the present disclosure do not make any limit to the specific form of the first anode structure 4111. For example, the first cathode structure 4113 can be a structure formed on the full surface on the display substrate 01, and the first cathode structure 4113, for example, can include metal materials such as lithium (Li), aluminium (Al), magnesium (Mg), silver (Ag) and the like. For example, the first cathode structure 4113 can form one very thin layer, and thus, the first cathode structure 4113 has excellent light transmission.

For example, the thin film transistor 412T includes structures such as an active layer 4121, a gate electrode 4122 and source and drain electrodes (i.e., a source electrode 4123 and a drain electrode 4124) and the like, and the storage capacitor 412C includes a first capacitor plate 4125 and a second capacitor plate 4126. For example, the active layer 4121 is arranged on a base substrate 74, a first gate insulating layer 741 is arranged on one side, away from the base substrate 74, of the active layer 4121, the gate electrode 4122 and the first capacitor plate 4125 are arranged on the same layer and positioned on one side, away from the base substrate 74, of the first gate insulating layer 741, a second gate insulating layer 742 is arranged on the side, away from the base substrate 74, of the gate electrode 4122 and the first capacitor plate 4125, the second capacitor plate 4126 is arranged on one side, away from the base substrate 74, of the second gate insulating layer 742, an interlayer insulating layer 743 is arranged on one side, away from the base substrate 74, of the second capacitor plate 4126, the source and drain electrodes are arranged on one side, away from the base substrate 74, of the interlayer insulating layer 743 and electrically connected to the active layer 4121 through via holes positioned in the first gate insulating layer 741, the second gate insulating layer 742 and the interlayer insulating layer 743, and a planarization layer 744 is arranged on the side, away from the base substrate 74, of the source and drain electrodes so as to planarize the first pixel circuit 412.

For example, a via hole is formed in the planarization layer 744, and the first anode structure 4111 is electrically connected to the source electrode 4123 or the drain electrode 4124 of the thin film transistor 412T through the via hole in the planarization layer 744.

For example, the first display region 11 further includes a transparent supporting layer 78 positioned on the base substrate 74, and the first light emitting element 411 is positioned on one side, away from the base substrate 74, of the transparent supporting layer 78. Therefore, with respect to the base substrate 74, the first light emitting element 411 in the first display region 11 can be at the basically same height with the second light emitting element 421 in the second display region 12 and the third light emitting element 431 in the third display region 13, so that the display effect of the display substrate can be improved.

Figure 5E:
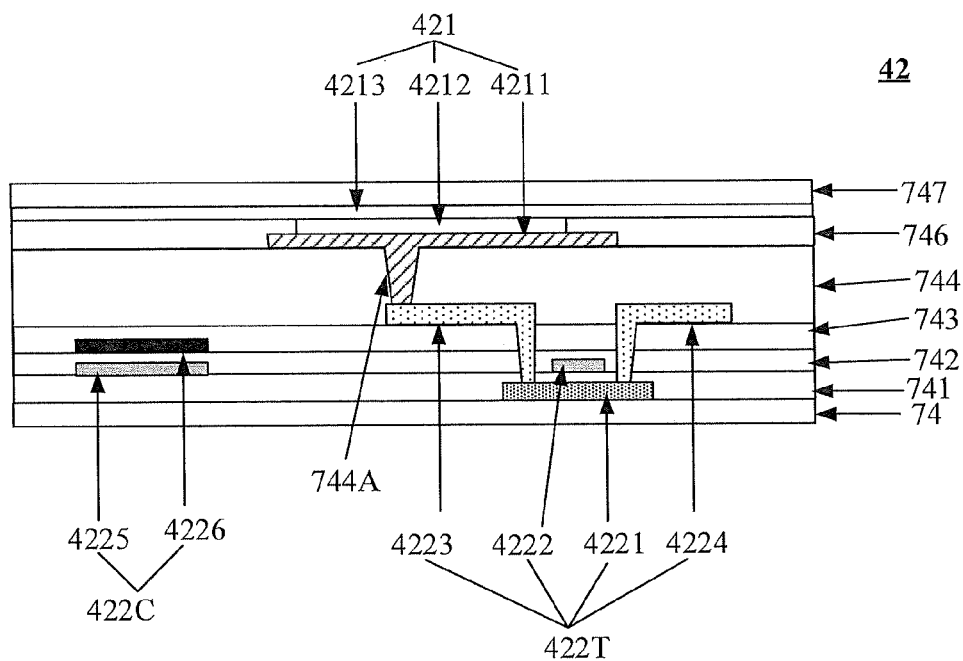
FIG. 5E illustrates a schematic diagram of a stacked structure of a second pixel unit provided by at least one embodiment of the present disclosure.

FIG. 5E illustrates a schematic diagram of a stacked structure of a second pixel unit 42 provided by at least one embodiment of the present disclosure, and as illustrated in FIG. 5E, the second pixel unit 42 includes the second light emitting element 421 and the second pixel circuit 422 for driving the second light emitting element 421. For example, the second pixel circuit 422 includes structures such as a thin film transistor 422T, a storage capacitor 422C and the like. The second light emitting element 421 includes a second anode structure 4211, a second cathode structure 4213 and a second light emitting layer 4212 between the second anode structure 4211 and the second cathode structure 4213, and the second anode structure 4211 is electrically connected to the thin film transistor 4221 included by the second pixel circuit 422 through a via hole 744A. For example, the second anode structure 4211 can include a plurality of anode sub-layers and for example, include three layers of structures of ITO/Ag/ITO and the like (not illustrated in the drawings), and the embodiments of the present disclosure do not make any limit to the specific form of the second anode structure 4211.

For example, the thin film transistor 422T includes structures such as an active layer 4221, a gate electrode 4222 and source and drain electrodes (i.e., a source electrode 4223 and a drain electrode 4224) and the like, and the storage capacitor 422C includes a first capacitor plate 4225 and a second capacitor plate 4226. For example, the active layer 4221 is arranged on a base substrate 74, a first gate insulating layer 741 is arranged on one side, away from the base substrate 74, of the active layer 4221, the gate electrode 4222 and the first capacitor plate 4225 are arranged on the same layer and arranged on one side, away from the base substrate 74, of the first gate insulating layer 741, a second gate insulating layer 742 is arranged on the side, away from the base substrate 74, of the gate electrode 4222 and the first capacitor plate 4225, the second capacitor plate 4226 is arranged on one side, away from the base substrate 74, of the second gate insulating layer 742, an interlayer insulating layer 743 is arranged on one side, away from the base substrate 74, of the second capacitor plate 4226, the source and drain electrodes are arranged on one side, away from the base substrate 74, of the interlayer insulating layer 743 and electrically connected to the active layer 4221 through via holes positioned in the first gate insulating layer 741, the second gate insulating layer 742 and the interlayer insulating layer 743, and a planarization layer 744 is arranged on the side, away from the base substrate 74, of the source and drain electrodes so as to planarize the second pixel circuit 422.

For example, a via hole 744A is formed in the planarization layer 744, and the second anode structure 4211 is electrically connected to the source electrode 4223 or the drain electrode 4224 of the thin film transistor 422T through the via hole 744A in the planarization layer 744.

It should be noted that for clarity, FIG. 5E merely illustrates one second light emitting unit 421 and one second pixel circuit 422 included by the second pixel unit 42 and merely illustrates one thin film transistor 422T and one storage capacitor 422C included by the second pixel circuit 422, but the embodiments of the present disclosure are not limited thereto.

Figure 5F:
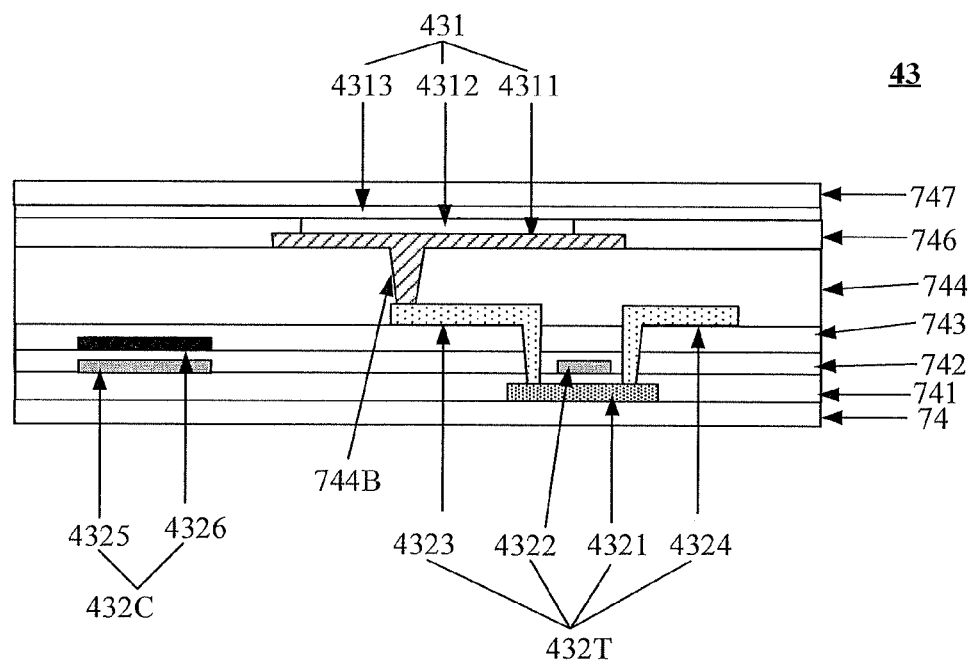
FIG. 5F illustrates a schematic diagram of a stacked structure of a third pixel unit provided by at least one embodiment of the present disclosure.

For example, FIG. 5F illustrates a schematic diagram of a stacked structure of a third pixel unit 43 provided by at least one embodiment of the present disclosure, and as illustrated in FIG. 5F, each third sub-pixel includes a third light emitting element 431 and a third pixel circuit 432 electrically connected to the third light emitting element, and the third pixel circuit 432 is configured to drive the third light emitting element 431. The third light emitting element 431 includes a third anode structure 4311, a third cathode structure 4313 and a third light emitting layer 4312 between the third anode structure 4311 and the third cathode structure 4313, and the third anode structure 4311 is electrically connected to the third pixel circuit 432 through a via hole. For example, the third anode structure 4311 can include a plurality of anode sub-layers and for example, include three layers of structures of ITO/Ag/ITO and the like (not illustrated in the drawings), and the embodiments of the present disclosure do not make any limit to the specific form of the third anode structure 4311.

For example, the third pixel circuit 432 includes structures such as a thin film transistor 432T, a storage capacitor 432C and the like. For example, the thin film transistor 432T includes structures such as an active layer 4321, a gate electrode 4322 and source and drain electrodes (i.e., a source electrode 4323 and a drain electrode 4324) and the like, and the storage capacitor 432C includes a first capacitor plate 4325 and a second capacitor plate 4326. For example, the active layer 4321 is arranged on a base substrate 74, a first gate insulating layer 741 is arranged on one side, away from the base substrate 74, of the active layer 4321, the gate electrode 4322 and the first capacitor plate 4325 are arranged on the same layer and arranged on one side, away from the base substrate 74, of the first gate insulating layer 741, a second gate insulating layer 742 is arranged on the side, away from the base substrate 74, of the gate electrode 4322 and the first capacitor plate 4325, the second capacitor plate 4326 is arranged on one side, away from the base substrate 74, of the second gate insulating layer 742, an interlayer insulating layer 743 is arranged on one side, away from the base substrate 74, of the second capacitor plate 4326, the source and drain electrodes are arranged on one side, away from the base substrate 74, of the interlayer insulating layer 743 and electrically connected to the active layer 4321 through via holes positioned in the first gate insulating layer 741, the second gate insulating layer 742 and the interlayer insulating layer 743, and a planarization layer 744 is arranged on the side, away from the base substrate 74, of the source and drain electrodes so as to planarize the third pixel circuit 432.

For example, a via hole 744B is formed in the planarization layer 744, and the third anode structure 4311 is electrically connected to the source electrode 4323 or the drain electrode 4324 of the thin film transistor 432T through the via hole 744B in an insulating layer 745.

It should be noted that for clarity, FIG. 5F merely illustrates one third light emitting element 431 and one third pixel circuit 432 included by the third pixel unit 43, and merely illustrates one thin film transistor 432T and one storage capacitor 432C included by the third pixel circuit 432, but the embodiments of the present disclosure are not limited thereto.

For example, the first pixel circuit 412, the second pixel circuit 422 and the third pixel circuit 432 are arranged on the same layer, and thus can be formed by adopting the same patterning process in the preparation process. For example, the first gate insulating layers 741, the second gate insulating layers 742, the interlayer insulating layers 743 and the planarization layers 744 are arranged on the same layers in the first display region 11, the second display region 12 and the third display region 13 and are also integrally connected (i.e., integrally formed and connected with each other) in some embodiments, and thus the same reference signs are adopted in the drawings.

For example, in some embodiments, the display substrate further includes structures such as a pixel defining layer 746, a packaging layer 747 and the like, and for example, the pixel defining layer 746 is arranged on the first anode structure and includes a plurality of openings for defining different pixels or sub-pixels, and the first light emitting layer is formed in the opening of the pixel defining layer 746. For example, the packaging layer 747 may include a single-layer or multi-layer packaging structure, and the multi-layer packaging structure, for example, includes a lamination of an inorganic packaging layer and an organic packaging layer so as to improve the packaging effect on the display substrate.

For example, the pixel defining layers 746 in the first display region 11, the second display region 12 and the third display region 13 are arranged on the same layer, the packaging layers 747 in the first display region 11, the second display region 12 and the third display region 13 are arranged on the same layer, and the pixel defining layers 746 and the packaging layers 747 are also integrally connected in some embodiments, respectively, and thus the same reference signs are adopted in the drawings.

For example, in each embodiment of the present disclosure, the base substrate 74 may be a glass substrate, a quartz substrate, a metal substrate, a resin substrate, or the like, and may be a rigid substrate or a flexible substrate. The embodiments of the present disclosure are not limited in this aspect.

For example, the first gate insulating layer 741, the second gate insulating layer 742, the interlayer insulating layer 743, the planarization layer 744, the insulating layer 745, the pixel defining layer 746, the packaging layer 747 and the insulating layer 748 may include an inorganic insulating material such as silicon oxide, silicon nitride, silicon oxynitride and the like, or may include an organic insulating material such as polyimide, polyphthalimide, polyphthalamide, acrylic resin, benzocyclobutene, phenolic resin, and the like. The embodiments of the present disclosure do not make specific limit to the material of each functional layer above.

For example, the material of the active layer 4121/4221/4321 may include a semiconductor material such as a polycrystalline silicon or oxide semiconductor (e.g., indium gallium zinc oxide) and the like. For example, part of the active layer 4121/4221/4321 can be subjected to conduction treatment by doping and the like, so as to have high conductivity.

For example, in each example above, materials of the gate electrode 4122/4222/4322, the first capacitor plate 4125/4225/4325 and the second capacitor plate 4126/4226/4326 may include a metal material or an alloy material, and for example, include molybdenum, aluminium, titanium and the like.

For example, materials of the source electrode 4123/4223/4323 and the drain electrode 4124/4224/4324 may include a metal material or an alloy material, for example, the source electrode 4123/4223/4323 and the drain electrode 4124/4224/4324 are of a metal single-layer or multi-layer structure formed by molybdenum, aluminium, titanium and the like, and for example, the multi-layer structure is a multi-metal-layer lamination, e.g., a titanium, aluminium and titanium three-layer metal lamination (Ti/Al/Ti) and the like.

For example, the display substrate provided by the embodiments of the present disclosure may be an OLED display substrate or a quantum dot light emitting diode (QLED) display substrate or other display substrates, and the embodiments of the present disclosure do not make any limit to the specific type of the display substrate.

For example, in the case that the display substrate is the OLED display substrate, the light emitting layer 4111/4211/4311 may include a small molecule organic material or a polymer molecule organic material, may be made of a fluorescence light emitting material or a phosphorescence light emitting material, and can emit red light, green light, blue light or can emit white light and the like. In addition, according to different actual demands, in different examples, the light emitting layer 4111/4211/4311 may further include functional layers such as an electron injection layer, an electron transport layer, a hole injection layer, a hole transport layer and the like.

For example, in the case that the display substrate is the QLED display substrate, the light emitting layer 4111/4211/4311 may include a quantum dot material, e.g., silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots and the like, and the particle size of the quantum dots ranges from 2 nm to 20 nm.

Figure 5G:
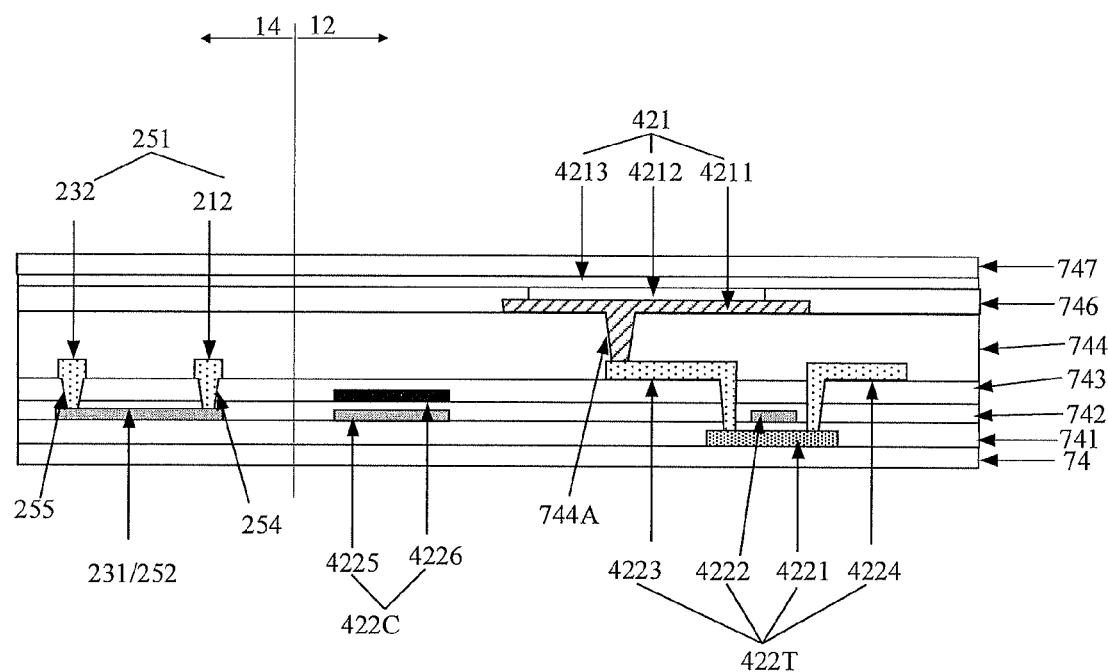
FIG. 5G is a schematic diagram of a stacked structure of a second pixel unit, a first line portion of a second winding portion, and a second sub-portion of a first main body portion, which are provided by at least one embodiment of the present disclosure.

FIG. 5G is a schematic diagram of a stacked structure of the second pixel unit 42, the first line portion 231 of the second winding portion 23 and the second sub-portion 212 of the first main body portion 21, which are provided by at least one embodiment of the present disclosure. For example, as illustrated in FIG. 5G the second sub-portion 212 of the first main body portion 21, the source electrode 4223 and the drain electrode 4224 are positioned in the first electrode layer 251 of the display substrate 01, and for example, the first sub-portion 211 of the first main body portion 21, the first winding portion 22 and the second line portion 232 of the second winding portion 23 are also positioned in the first electrode layer 251. For example, as illustrated in FIG. 5F, the first line portion 231 of the second winding portion 23, the gate electrode 4222 and the first capacitor plate 4225 are positioned in the second electrode layer 252 of the display substrate 01. For example, as illustrated in FIG. 5G, the first line portion 231 is electrically connected to the second sub-portion 212 and the second line portion 232 via the first via hole 254 and the second via hole 255 of the insulating layer between the first electrode layer 251 and the second electrode layer 252, respectively, i.e., the first signal line 20 adopts a jumper design and for example, can adopt a design including repeated jumper. In some examples, the first line portion 231 of the second winding portion 23 and the second capacitor plate 4226 are positioned in the second electrode layer 252 of the display substrate 01, which is not repeated herein. For example, the second main body portion 32 of the second signal line 30 is also positioned in the second electrode layer 252 of the display substrate 01.

Figure 5H:
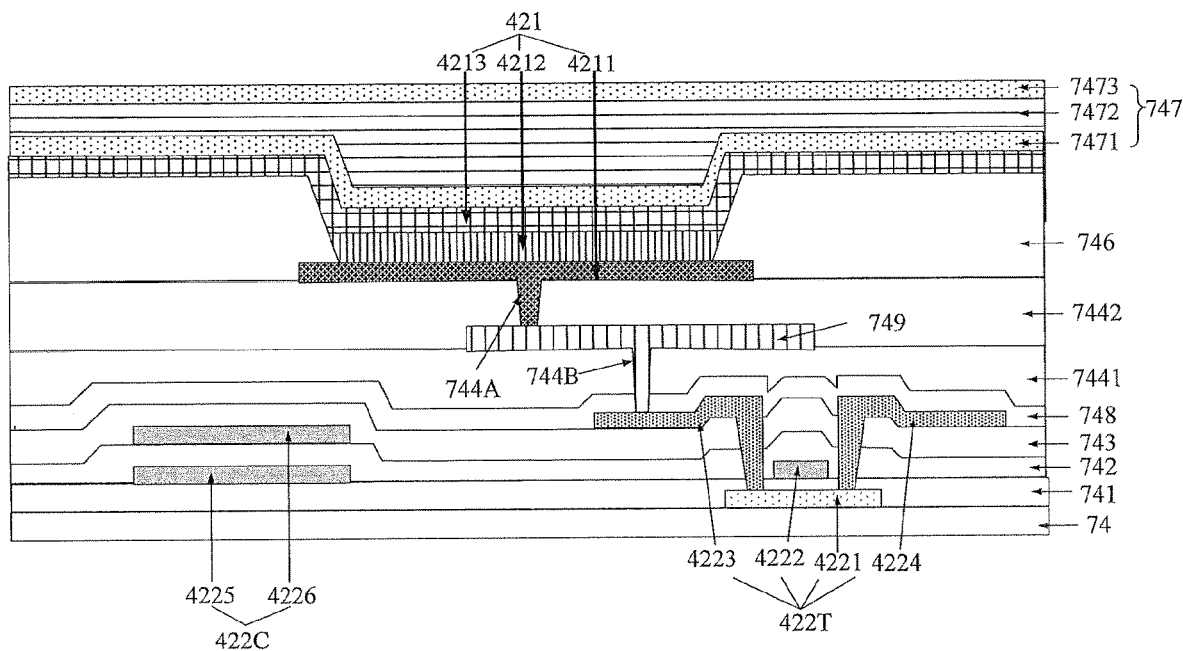
FIG. 5H illustrates another schematic diagram of a stacked structure of a second pixel unit provided by at least one embodiment of the present disclosure.

FIG. 5H illustrates another schematic diagram of a stacked structure of a second pixel unit 42 provided by at least one embodiment of the present disclosure, and as illustrated in FIG. 5H, the second pixel unit 42 includes the second light emitting element 421 and the second pixel circuit 422 for driving the second light emitting element 421. For example, the second pixel circuit 422 includes structures such as a thin film transistor 422T, a storage capacitor 422C and the like. The second light emitting element 421 includes a second anode structure 4211, a second cathode structure 4213 and a second light emitting layer 4212 between the second anode structure 4211 and the second cathode structure 4213, the second anode structure 4211 is electrically connected to an adapter electrode 749 through a via hole 744A, and the adapter electrode 749 is electrically connected to the thin film transistor 422T included by the second pixel circuit 422 through a via hole 744B. For example, the second anode structure 4211 can include a plurality of anode sub-layers and for example, include three layers of structures of ITO/Ag/ITO and the like (not illustrated in the drawings), and the embodiments of the present disclosure do not make any limit to the specific form of the second anode structure 4211. For example, the adapter electrode 749 may be made of a transparent conducting material. For example, the transparent conducting material may be selected from transparent metal oxide such as ITO, IZO and the like.

For example, the thin film transistor 422T includes structures such as an active layer 4221, a gate electrode 4222 and source and drain electrodes (i.e., a source electrode 4223 and a drain electrode 4224) and the like, and the storage capacitor 422C includes a first capacitor plate 4225 and a second capacitor plate 4226. For example, the active layer 4221 is arranged on a base substrate 74, a first gate insulating layer 741 is arranged on one side, away from the base substrate 74, of the active layer 4221, the gate electrode 4222 and the first capacitor plate 4225 are arranged on the same layer and arranged on one side, away from the base substrate 74, of the first gate insulating layer 741, a second gate insulating layer 742 is arranged on the side, away from the base substrate 74, of the gate electrode 4222 and the first capacitor plate 4225, the second capacitor plate 4226 is arranged on one side, away from the base substrate 74, of the second gate insulating layer 742, an interlayer insulating layer 743 is arranged on one side, away from the base substrate 74, of the second capacitor plate 4226, and the source and drain electrodes are arranged on one side, away from the base substrate 74, of the interlayer insulating layer 743 and electrically connected to the active layer 4221 through via holes positioned in the first gate insulating layer 741, the second gate insulating layer 742 and the interlayer insulating layer 743; a passivation layer 748 is arranged on the side, away from the base substrate 74, of the source and drain electrodes; a first planarization layer 7441 is arranged on one side, away from the base substrate 74, of the passivation layer 748 so as to planarize the second pixel circuit 422; the adapter electrode 749 is arranged on one side, away from the base substrate 74, of the first planarization layer 7441; and a second planarization layer 7442 is arranged on one side, away from the base substrate 74, of the adapter electrode 749.

For example, a via hole 744B is formed in the first planarization layer 7441, and the adapter electrode 749 is electrically connected to the source electrode 4223 or the drain electrode 4224 of the thin film transistor 422T through the via hole 744B in the first planarization layer 7441. For example, a via hole 744A is formed in the planarization layer 744, and the second anode structure 4211 is electrically connected to the adapter electrode 749 through the via hole 744A in the second planarization layer 7442, so that the second anode structure 4211 can be electrically connected to the source electrode 4223 or the drain electrode 4224 of the thin film transistor 422T.

For example, as illustrated in FIG. 5H, the display substrate further includes structures such as the pixel defining layer 746, the packaging layer 747 and the like, and for example, the pixel defining layer 746 is arranged on the first anode structure and includes a plurality of openings for defining different pixels or sub-pixels, and the first light emitting layer is formed in the opening of the pixel defining layer 746. For example, the packaging layer 747 may include a first packaging layer 7471, a second packaging layer 7472 and a third packaging layer 7473 which are sequentially arranged on the second cathode structure 4213 in a direction perpendicular to the display substrate. For example, the first packaging layer 7471, the second packaging layer 7472 and the third packaging layer 7473 respectively are an inorganic packaging layer, an organic packaging layer and an inorganic packaging layer.

It should be noted that for clarity, FIG. 5H merely illustrates one second light emitting unit 421 and one second pixel circuit 422 included by the second pixel unit 42 and merely illustrates one thin film transistor 422T and one storage capacitor 422C included by the second pixel circuit 422, but the embodiments of the present disclosure are not limited thereto.

It should be noted that in the case that the second pixel unit 42 provided by at least one embodiment of the present disclosure adopts the structure illustrated in FIG. 5H, the third pixel unit 43 provided by at least one embodiment of the present disclosure, the first light emitting element 411 and the first pixel circuit 412 for driving the first light emitting element 411, which are provided by at least one embodiment of the present disclosure, also can adopt the structure illustrated in FIG. 5H, which is not repeated herein.

Figure 5I:
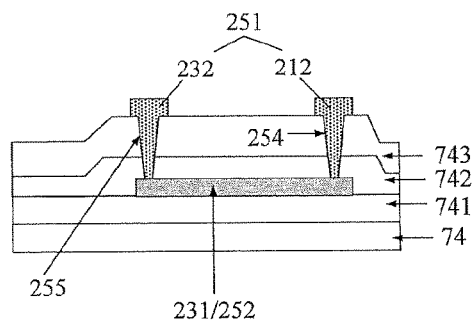
FIG. 5I is a sectional schematic diagram along an HH' line illustrated in FIG. 5A.

FIG. 5I is a sectional schematic diagram along an HH' line illustrated in FIG. 5A. For example, as illustrated in FIG. 5I, the second sub-portion 212 of the first main body portion 21 and the second line portion 232 of the second winding portion 23 are positioned on the side, away from the base substrate 74, of the interlayer insulating layer 743, i.e., the second sub-portion 212 of the first main body portion 21 and the second line portion 232 of the second winding portion 23 are arranged in the same electrode layer (e.g., the first electrode layer 251) with the source and drain electrodes (e.g., the source electrode 4223 and the drain electrode 4224) of the thin film transistor. For example, the first sub-portion 211 of the first main body portion 21 and the first winding portion 22 are also positioned in the same electrode layer (e.g., the first electrode layer 251).

For example, as illustrated in FIG. 5I, the first line portion 231 of the second winding portion 23 is positioned between the first gate insulating layer 741 and the second gate insulating layer 742, i.e., the first line portion 231 of the second winding portion 23, the gate electrode 4222 and the first capacitor plate 4225 are positioned in the same electrode layer (e.g., positioned in the second electrode layer 252 of the display substrate 01). For example, as illustrated in FIG. 5I, the first line portion 231 is electrically connected to the second sub-portion 212 and the second line portion 232 through the first via hole 254 and the second via hole 255 of the insulating layer between the first electrode layer 251 and the second electrode layer 252, respectively, i.e., the first signal line 20 adopts the jumper design and for example, can adopt the design including repeated jumper. For example, the second main body portion 32 of the second signal line 30 is also positioned in the second electrode layer 252 of the display substrate 01. In some examples, the first line portion 231 of the second winding portion 23 and the second capacitor plate 4226 are positioned in the same electrode layer (e.g., the second electrode layer 252 of the display substrate 01), and the gate electrode 4222 is not positioned in the above-mentioned same electrode layer (e.g., the second electrode layer 252 of the display substrate 01).

For example, as illustrated in FIG. 4, FIG. 5A to FIG. 5C and FIG. 5G, the first line portion 231 is integrally positioned in the peripheral region 14, and is arranged in parallel to the second display region 12 in the first direction D1. For example, the peripheral region 14 does not have the pixel circuits (the first pixel circuit 412 to the third pixel circuit 432), and thus, the wiring difficulty of the first line portion 231 can be lowered.

For example, as illustrated in FIG. 4 and FIG. 5A to FIG. 5C, the first line portion 231 is integrally positioned on one side, away from the third display region 13, of the second display region 12 in the first direction D1. For example, as illustrated in FIG. 4 and FIG. 5A to FIG. 5C, the first line portion 231 is integrally positioned at the upper edge of the display substrate 01.

It should be noted that although the first line portion 231 illustrated in FIG. 4, FIG. 5A to FIG. 5C and FIG. 5G is integrally positioned in the peripheral region 14, the embodiments of the present disclosure are not limited thereto, and according to the actual application demands, the first line portion 231 also can be integrally positioned in the second display region 12 or the first line portion 231 is simultaneously positioned in the peripheral region 14 and the second display region 12. Exemplary illustration is carried out below in connection with FIG. 6, FIG. 7A to FIG. 7B, FIG. 8 and FIG. 9A to FIG. 9B.

Figure 6:
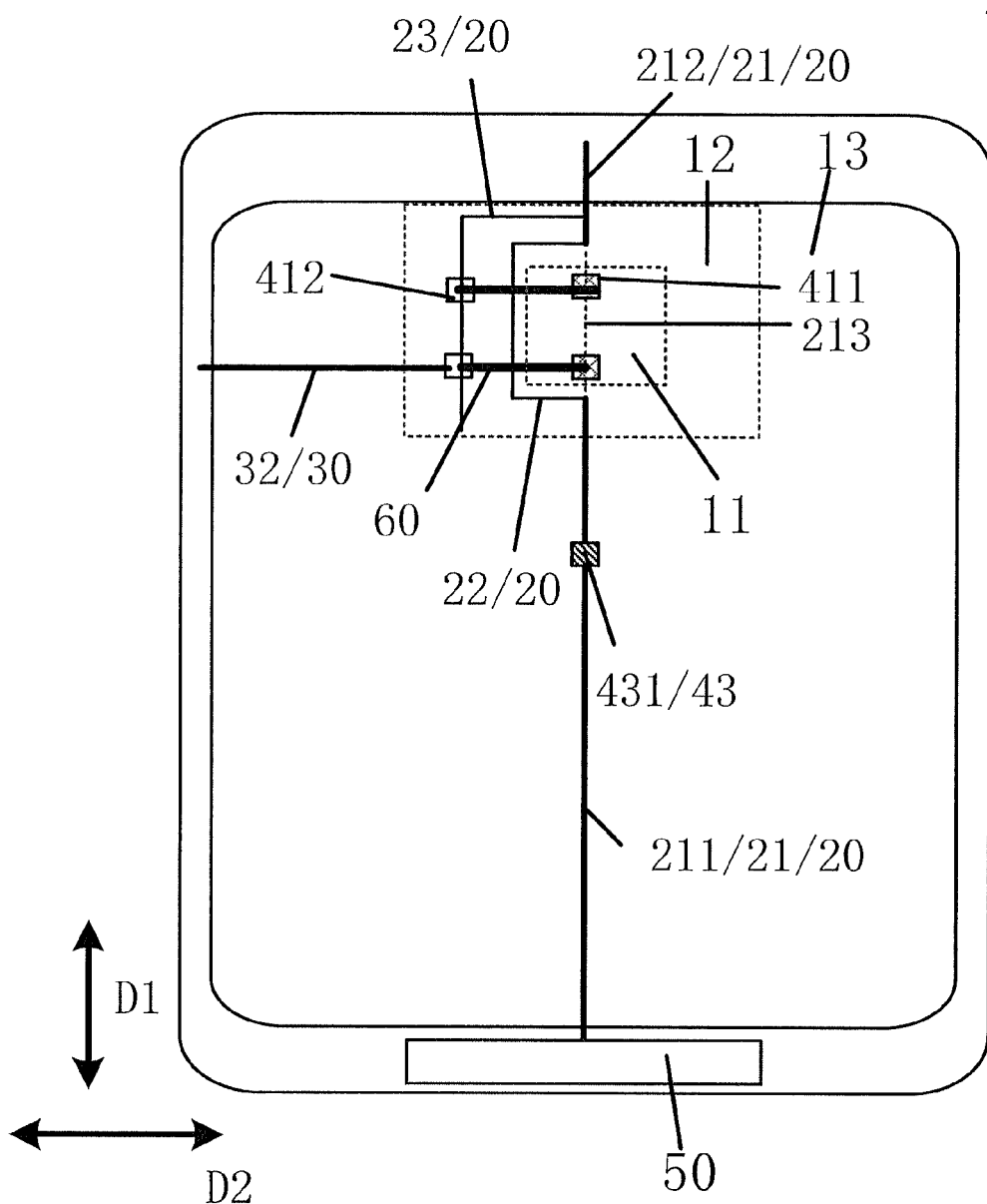
FIG. 6 is a second example of the display substrate illustrated in FIG. 2A.
Figure 7A:
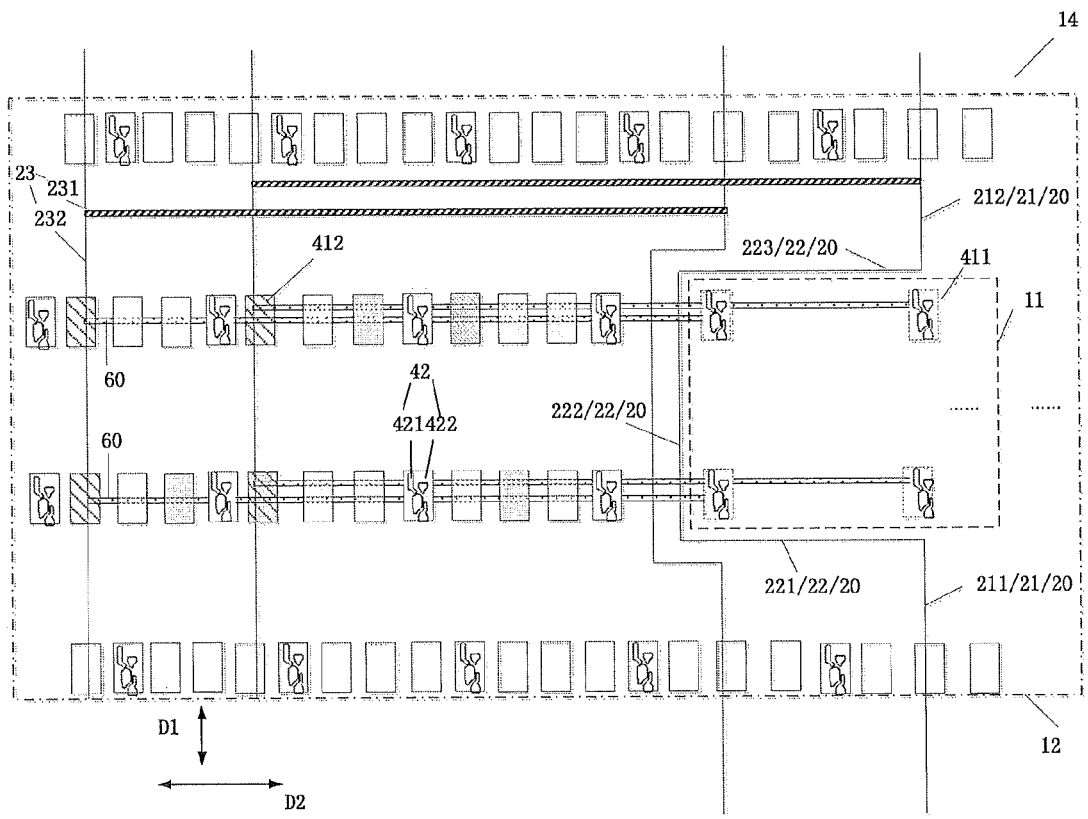
FIG. 7A is a first schematic diagram for illustrating a first display region, a second display region, and part of a peripheral region of the display substrate illustrated in FIG. 6.

FIG. 6 is a second example of the display substrate 01 illustrated in FIG. 2A. FIG. 7A is a first schematic diagram for illustrating the first display region 11, the second display region 12 and part of the peripheral region 14 of the display substrate 01 illustrated in FIG. 6, and FIG. 7B is a second schematic diagram for illustrating the first display region 11, the second display region 12 and part of the peripheral region 14 of the display substrate 01 illustrated in FIG. 6.

Figure 7B:
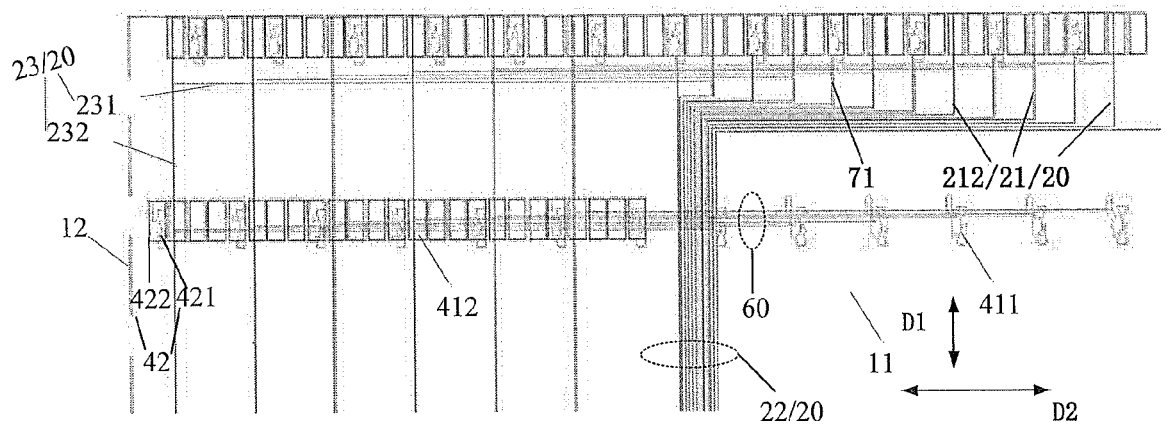
FIG. 7B is a second schematic diagram for illustrating the first display region, the second display region, and part of the peripheral region of the display substrate illustrated in FIG. 6.

For example, as illustrated in FIG. 6 and FIG. 7A to FIG. 7B, the first line portion 231 is integrally positioned in the second display region 12, and is arranged in parallel to the first display region 11 in the first direction D1. For example, as illustrated in FIG. 6 and FIG. 7A to FIG. 7B, the first line portion 231 is positioned on one side, away from the third display region 13, of the first display region 11 in the first direction D1.

In an example, a plurality of first line portions 231 included by a plurality of first signal lines 20 are all straight (i.e., straight line segments). In another example, at least part of the first line portions 231 included by a plurality of first signal lines 20 can be of a bent structure so as to avoid the case that part of the first line portions 231 overlap with the second light emitting element 421 to shield the light emitted by the second light emitting element 421.

For example, by enabling the first line portion 231 to be integrally positioned in the second display region 12, the size of the peripheral region 14 of the display substrate 01 can be reduced, so as to benefit to the narrow-frame or full-screen design of the display substrate 01.

It should be noted that other structures and the specific implementation mode of the display substrate 01 illustrated in FIG. 6 are the same or similar with those of the display substrate 01 illustrated in FIG. 4, and the same or similar points are not repeated herein.

It should be noted that compared to the connecting wire 60, the first light emitting element 411 and the second light emitting element 421 are farther away from the base substrate of the display substrate 01; and the plane schematic diagram illustrated in FIG. 7A and other related plane schematic diagrams are used for illustrating the arrangement mode and the connection mode of each element of the display substrate 01 in a plane in parallel to the base substrate of the display substrate 01, but not used for limiting the arrangement mode or the relative position relationship of each element of the display substrate 01 in a direction perpendicular to the base substrate of the display substrate 01. The arrangement mode or the relative position relationship of each element of the display substrate 01 in the direction perpendicular to the base substrate of the display substrate 01 can refer to the schematic diagrams of the stacked structures illustrated in FIG. 5D to FIG. 5H and the sectional schematic diagram illustrated in FIG. 5I, which are not repeated herein.

Figure 8:
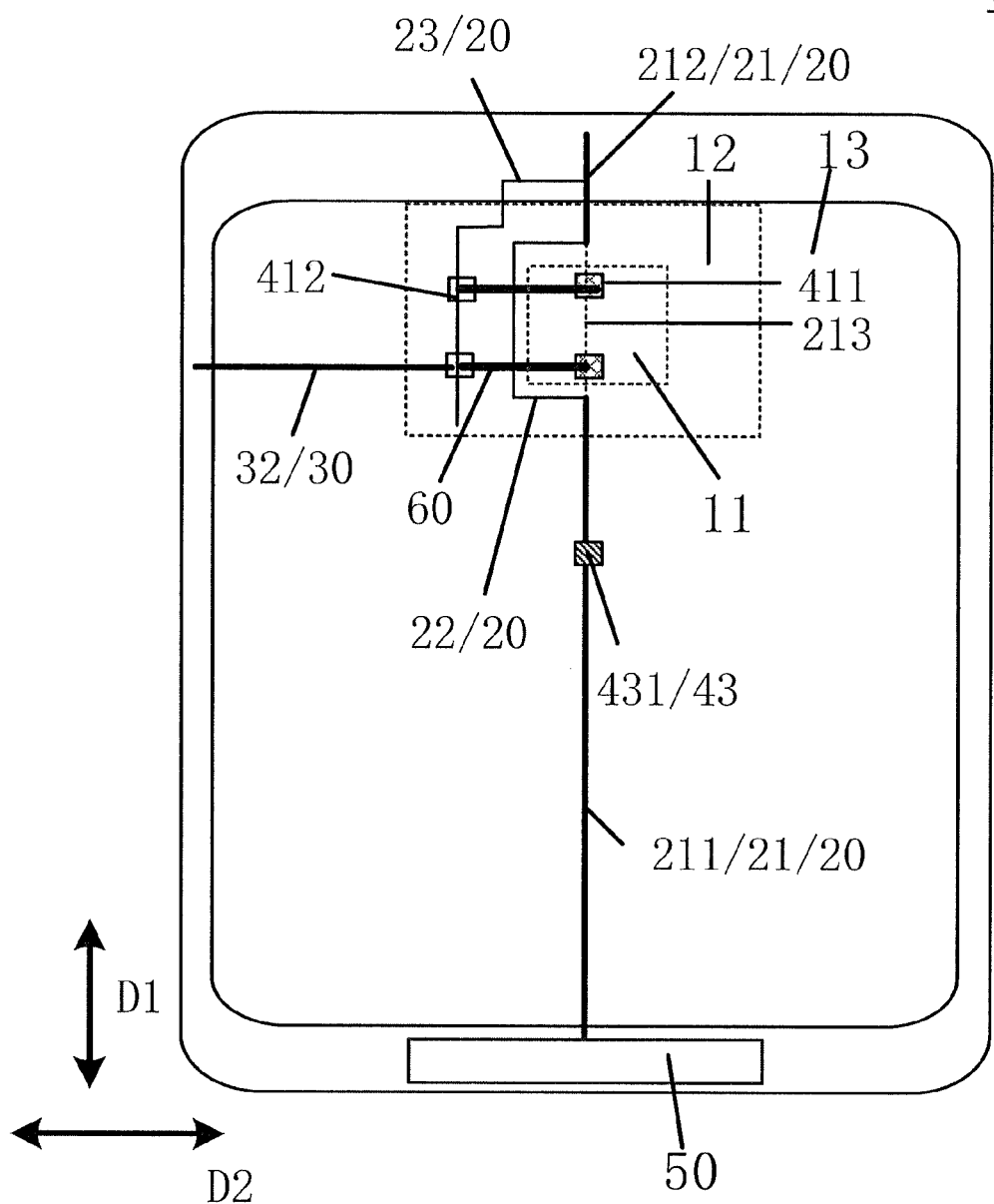
FIG. 8 is a third example of the display substrate illustrated in FIG. 2A.
Figure 9A:
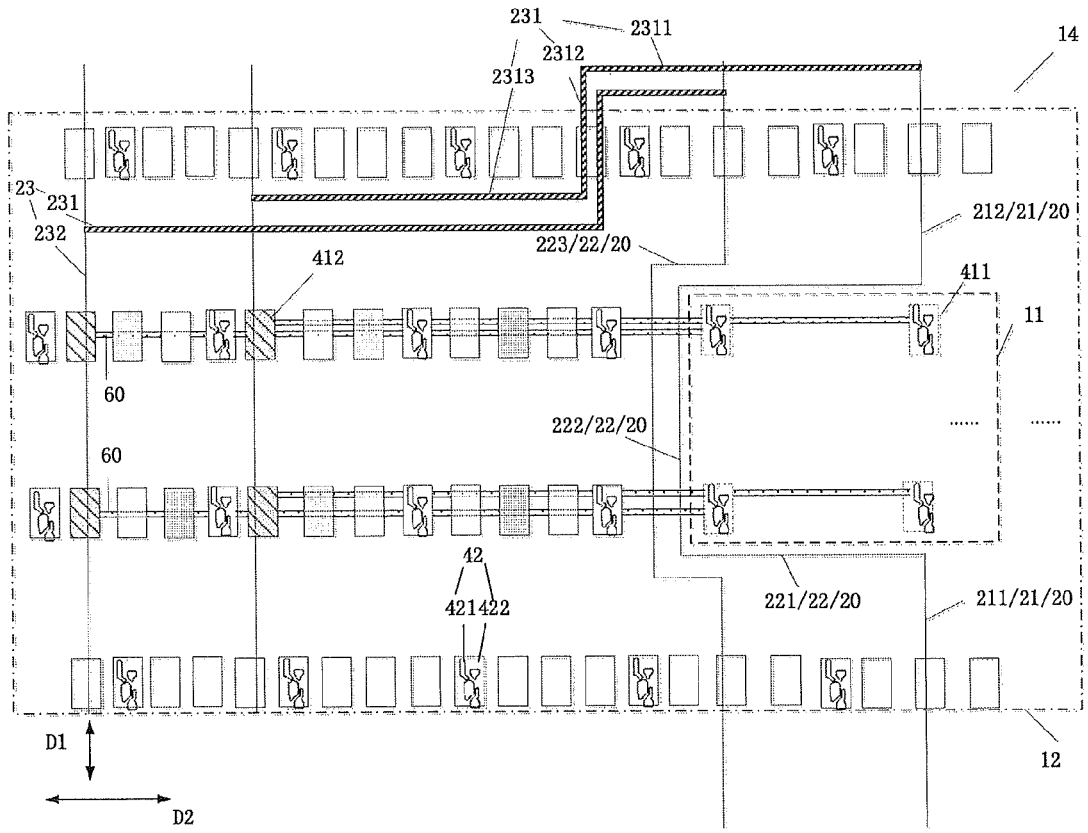
FIG. 9A is a first schematic diagram for illustrating a first display region, a second display region, and part of a peripheral region of the display substrate illustrated in FIG. 8.

FIG. 8 is a third example of the display substrate 01 illustrated in FIG. 2A. FIG. 9A is a first schematic diagram for illustrating the first display region 11, the second display region 12 and part of the peripheral region 14 of the display substrate 01 illustrated in FIG. 8, and FIG. 9B is a second schematic diagram for illustrating the first display region 11, the second display region 12 and part of the peripheral region 14 of the display substrate 01 illustrated in FIG. 8.

Figure 9B:
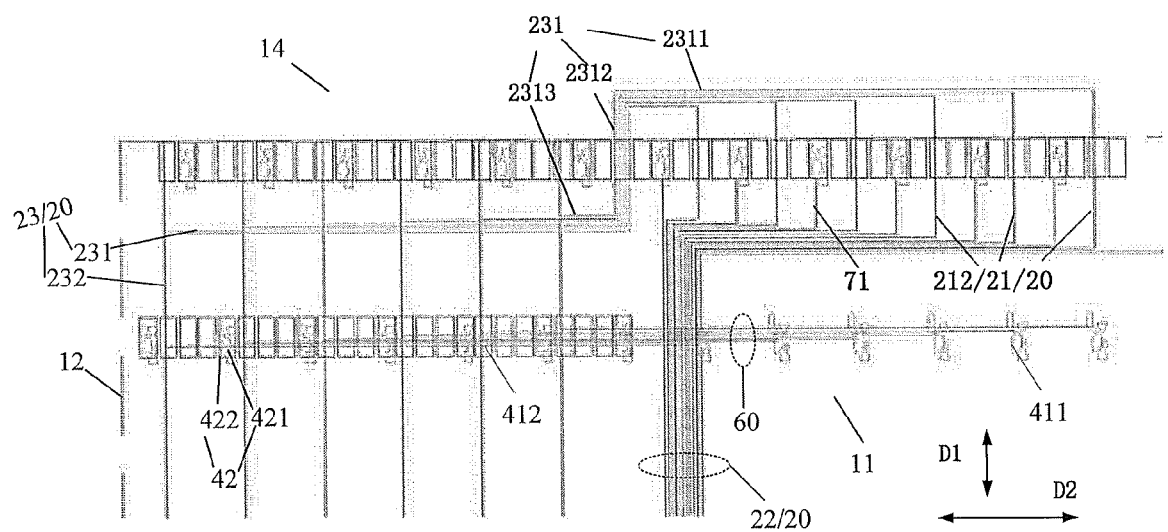
FIG. 9B is a second schematic diagram for illustrating the first display region, the second display region, and part of the peripheral region of the display substrate illustrated in FIG. 8.

For example, as illustrated in FIG. 8 and FIG. 9A to FIG. 9B, the first line portion 231 includes a first portion 2311, a second portion 2312 and a third portion 2313 which are sequentially connected; the first portion 2311 of the first line portion 231 is electrically connected with the second sub-portion 212, and the third portion 2313 of the first line portion 231 is electrically connected with the second line portion 232; the first portion 2311 of the first line portion 231 is positioned in the peripheral region 14, and is arranged in parallel to the second display region 12 in the first direction D1; the second portion 2312 of the first line portion 231 extends to the second display region 12 from the peripheral region 14 along the first direction D1; and the third portion 2313 of the first line portion 231 is positioned in the second display region 12, and a dummy extending line, extending along the second direction D2, of the third portion 2313 of the first line portion 231 is arranged in parallel to the first display region 11 in the first direction D1.

In some examples, the third portion 2313 of the first line portion 231 is electrically connected with the second sub-portion 212, and the first portion 2311 of the first line portion 231 is electrically connected with the second line portion 232, i.e., the portion, electrically connected with the second sub-portion 212, of the first line portion 231 is positioned in the second display region 12, and the portion, electrically connected with the second line portion 232, of the first line portion 231 is positioned in the peripheral region 14, which is not repeated herein.

It should be noted that other structures and the specific implementation mode of the display substrate 01 illustrated in FIG. 8 are the same or similar with those of the display substrate 01 illustrated in FIG. 4, and the same or similar points are not repeated herein.

It should be noted that although the second winding portions 23 of the display substrates 01 illustrated in FIG. 4, FIG. 6 and FIG. 8 all carry out winding from the second sub-portion 212 of the first main body portion 21 to the position in parallel (in parallel in the second direction D2) to the second sub-portion 212 of the first main body portion 21 via one side, away from the third display region 13, of the first display region 11 in the first direction D1, the embodiments of the present disclosure are not limited thereto. In some examples, the second winding portion 23 can carry out winding from the first sub-portion 211 of the first main body portion 21 to the position in parallel (in parallel in the second direction D2) to the second sub-portion 212 of the first main body portion 21 via one side, close to the third display region 13, of the first display region 11 in the first direction D1, and exemplary illustration is carried out below in connection with FIG. 10.

Figure 10:
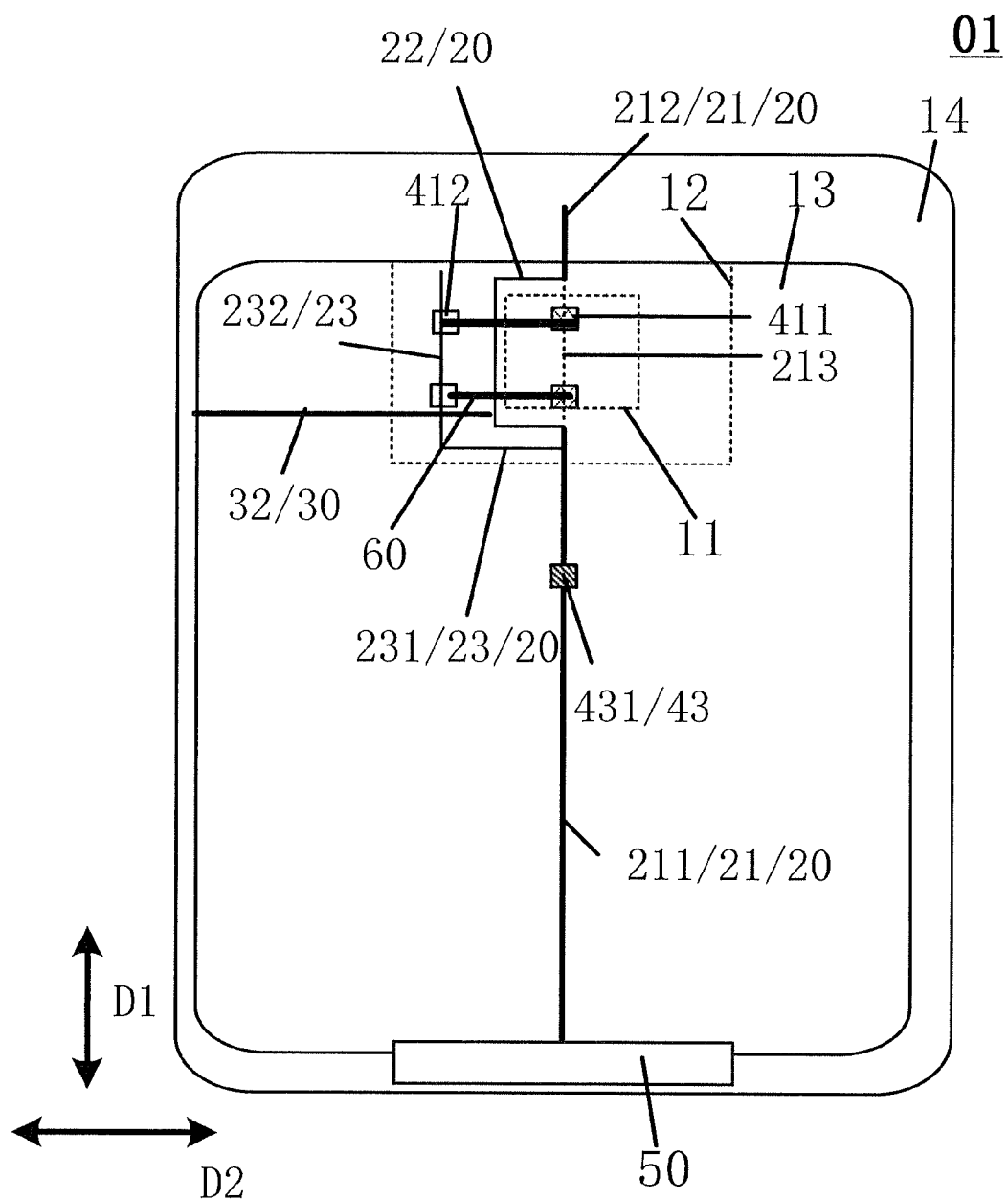
FIG. 10 is a fourth example of the display substrate illustrated in FIG. 2A.

FIG. 10 is a fourth example of the display substrate 01 illustrated in FIG. 2A. The display substrate 01 illustrated in FIG. 10 is similar with the display substrate 01 illustrated in FIG. 6, the differences between them will be illustrated herein, and the same points are not repeated herein. The differences between the display substrate 01 illustrated in FIG. 10 and the display substrate 01 illustrated in FIG. 6 are that the first line portion 231 of the display substrate 01 illustrated in FIG. 10 is positioned on one side, close to the third display region 13, of the first display region 11 in the first direction D1, and in the working process, the current trend in the second line portion 232 of the display substrate 01 illustrated in FIG. 10 is the same with the current trend in the main body portion.

In some examples, in the first direction D1, at least part (e.g., all) of the first line portion 231 can be arranged in parallel to the first display region 11, and can be positioned at one end, close to the first display region 11, of the third display region 13, which is not repeated herein.

It should be noted that the first signal lines 20 of the display substrates 01 illustrated in FIG. 4, FIG. 6, FIG. 8 and FIG. 10 all carry out winding from one side of the first display region 11 in the first direction D1 to the position in parallel (in parallel in the second direction D2) to the first main body portion 21, however, the embodiments of the present disclosure are not limited thereto. In some examples, the first signal line 20 of the display substrate 01 can be wound from both sides of the first display region 11 in the first direction D1 to the position in parallel (in parallel in the second direction D2) to the first main body portion 21. Exemplary illustration is carried out below in connection with FIG. 11 and FIG. 12A to FIG. 12C.

Figure 11:
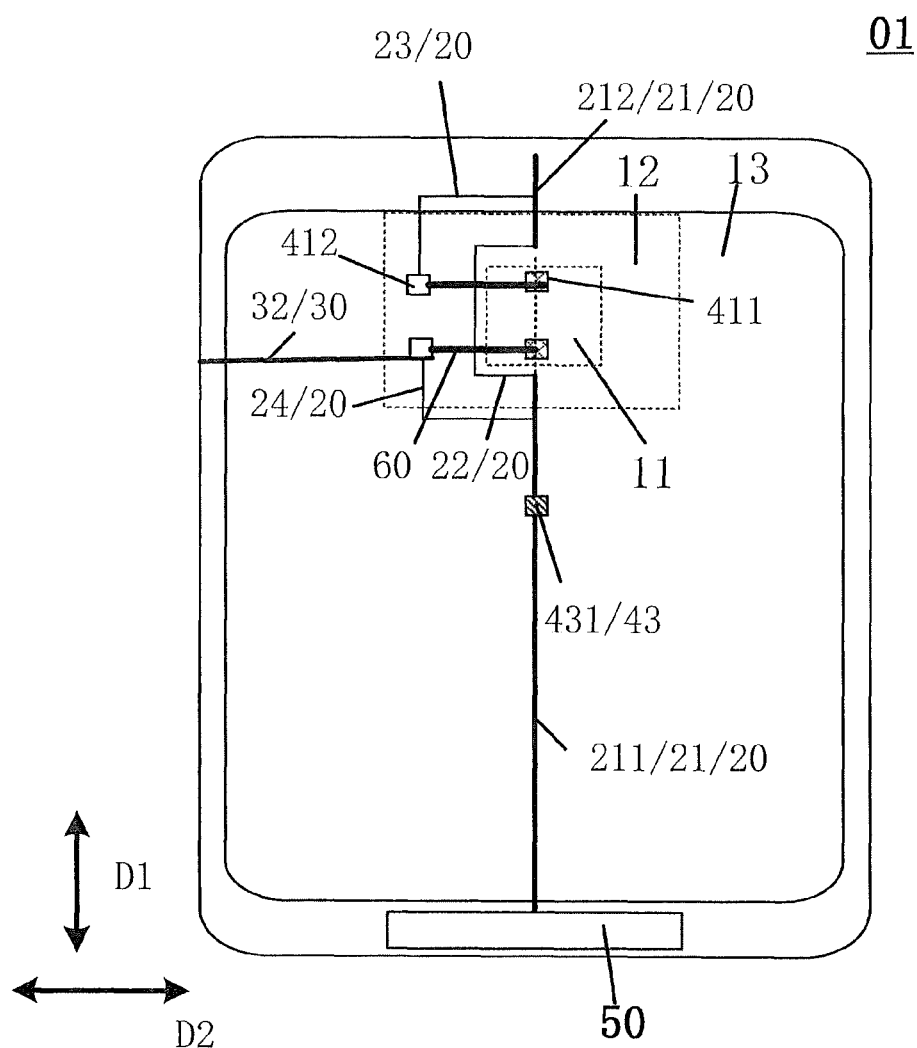
FIG. 11 is a fifth example of the display substrate illustrated in FIG. 2A.
Figure 12A:
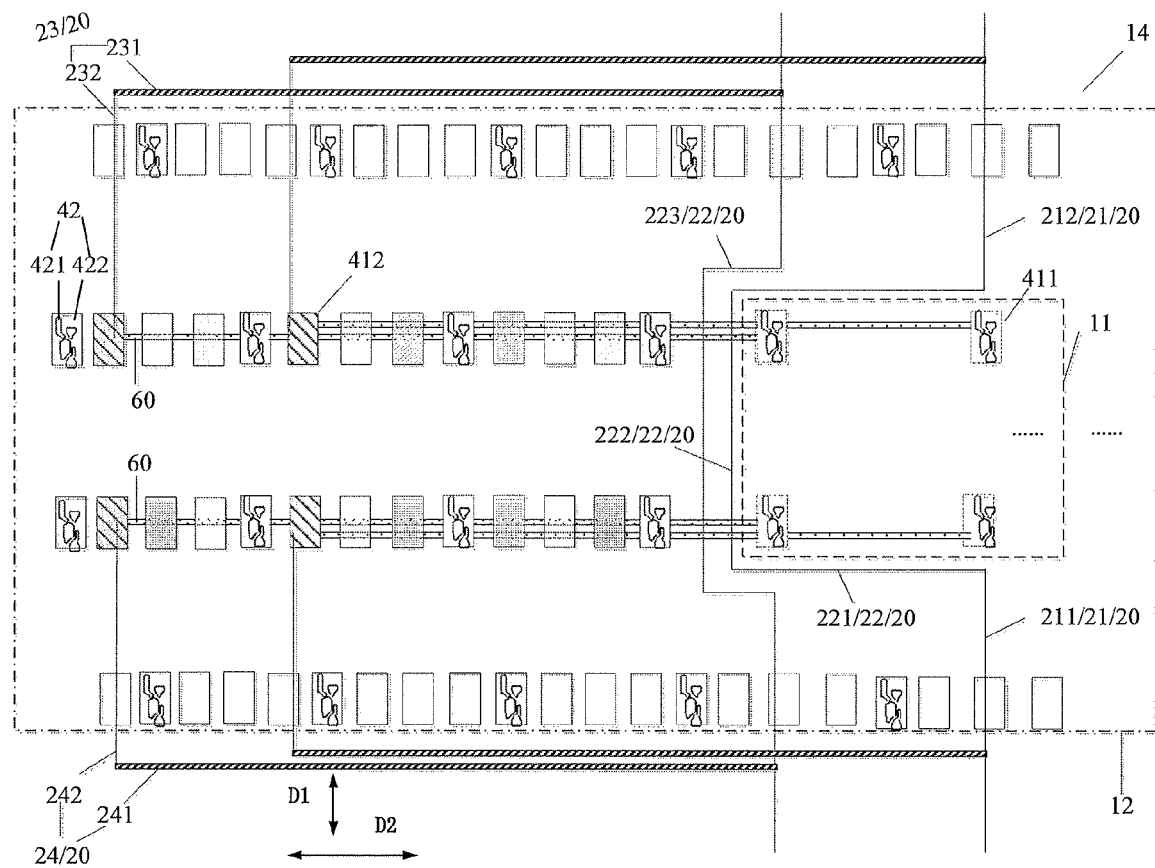
FIG. 12A is a first schematic diagram for illustrating a first display region, a second display region, and part of a peripheral region of the display substrate illustrated in FIG. 11.

FIG. 11 is a fifth example of the display substrate 01 illustrated in FIG. 2A. FIG. 12A is a first schematic diagram for illustrating the first display region 11, the second display region 12 and part of the peripheral region 14 of the display substrate 01 illustrated in FIG. 11, and FIG. 12B is a second schematic diagram for illustrating the first display region 11, the second display region 12 and part of the peripheral region 14 of the display substrate 01 illustrated in FIG. 11; and FIG. 12C is a plane schematic diagram corresponding to a partial region REG_E of FIG. 12B.

The display substrate 01 illustrated in FIG. 11 is similar with the display substrate 01 illustrated in FIG. 4, only the difference between them will be illustrated herein, and the same points are not repeated herein. The difference between the display substrate 01 illustrated in FIG. 11 and the display substrate 01 illustrated in FIG. 4 is that the display substrate 01 further includes a third winding portion 24. For example, at least part of the third winding portion 24 is routed along a direction intersecting with (e.g., perpendicular to) the first direction D1.

Figure 12B:
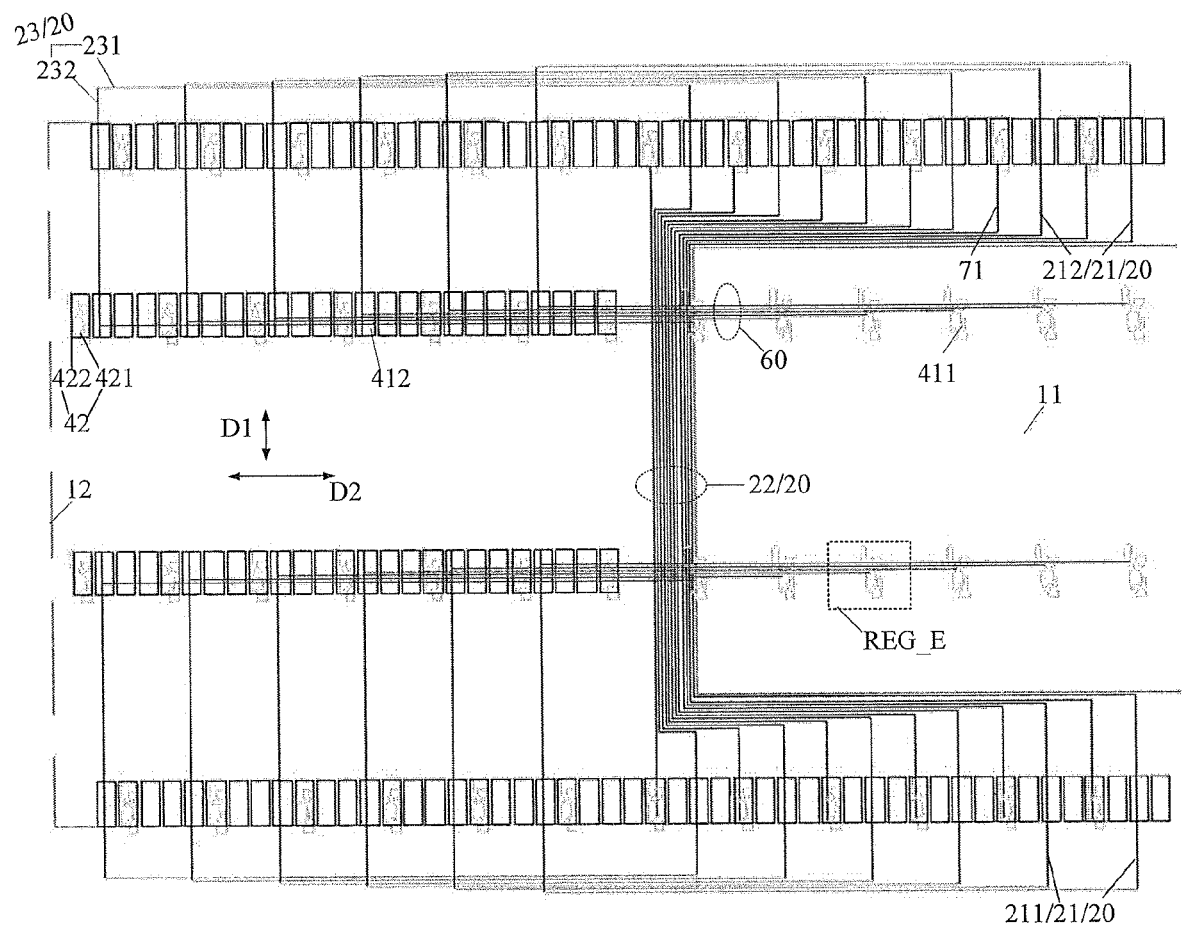
FIG. 12B is a second schematic diagram for illustrating the first display region, the second display region, and part of the peripheral region of the display substrate illustrated in FIG. 11.
Figure 12C:
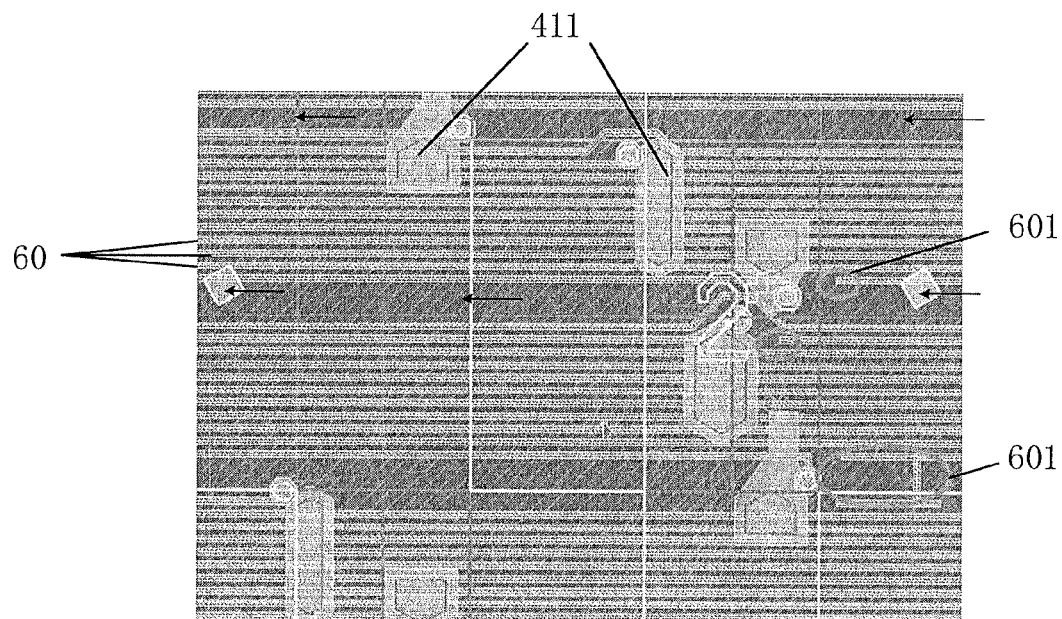
FIG. 12C is a plane schematic diagram corresponding to a partial region of FIG. 12B.

For example, as illustrated in FIG. 11 and FIG. 12A to FIG. 12B, a first end of the third winding portion 24 is electrically connected with the first sub-portion 211, a second end of the third winding portion 24 is electrically connected with the corresponding first pixel circuit 412, and the first pixel circuit 412 connected with the second winding portion 23 is different from the first pixel circuit 412 connected with the third winding portion 24.

For example, as illustrated in FIG. 11 and FIG. 12A to FIG. 12B, the first pixel circuit 412 connected with the second winding portion 23 and the first pixel circuit 412 connected with the third winding portion 24 are positioned in the same column, i.e., the first pixel circuit 412 connected with the second winding portion 23 and the first pixel circuit 412 connected with the third winding portion 24 are arranged in the first direction D1. For example, the first pixel circuits 412 connected with the second winding portion 23 are the first half column of first pixel circuits 412 of the above-mentioned same column of first pixel circuits 412, and the first pixel circuits 412 connected with the second winding portion 23 are the second half column of first pixel circuits 412 of the above-mentioned same column of first pixel circuits 412.

For example, by enabling the first signal line 20 to further include the third winding portion 24, the data line can be used for carrying out bidirectional driving on the pixel circuits (the first pixel circuit 412 and the second pixel circuit 422) in a region, in parallel to the first display region 11 in the second direction D2, of the second display region 12, i.e., the data signals are input into the pixel circuits in the region from the positions above and below the region, in parallel to the first display region 11 in the second direction D2, of the second direction region 12; and in this case, the size of an opening of the second display region 12 (e.g., the inner edge 121 of the second display region 12) is larger.

For example, as illustrated in FIG. 11 and FIG. 12A to FIG. 12B, the third winding portion 24 includes a third line portion 241 and a fourth line portion 242 which are sequentially connected; the end, which is not connected with the fourth line portion 242, of the third line portion 241 serves as the first end of the third winding portion 24, and the end, which is not connected with the third line portion 241, of the fourth line portion 242, serves as the second end of the third winding portion 24; the third line portion 241 extends along the second direction D2, and is arranged in parallel to the first line portion 231 in the first direction D1; the fourth line portion 242 extends along the first direction D1, and is arranged in parallel to the first sub-portion 211 in the second direction D2; and in the working process, the current trend in the fourth line portion 242 is the same with the current trend in the main body portion. For example, the fourth line portion 242 is a straight line segment. For example, the third line portion 241 can be a straight line segment. For another example, the third line portion 241 can be of a bent structure, and integrally extends along the second direction D2.

For example, the fourth line portion 242 is positioned in the first electrode layer of the display substrate 01; the third line portion 241 is positioned in the second electrode layer of the display substrate 01; and the third line portion 241 is electrically connected with the first sub-portion 211 and the fourth line portion 242 through a third via hole and a fourth via hole of the insulating layer between the first electrode layer and the second electrode layer, respectively.

For example, by enabling the first line portion 231 of the second winding portion 23 of each first signal line 20 as well as the third line portion 241 of the third winding portion 24 of each first signal line 20 to be positioned in different layer from other portions (e.g., the fourth line portion 242 and the first sub-portion 211) of each first signal line 20, the short circuit between the first line portion 231 of the second winding portion 23 of each first signal line 20 as well as the third line portion 241 of the third winding portion 24 and other first signal lines 20 can be avoided.

For example, as illustrated in FIG. 12C, the first display region 11 merely includes a plurality of transparent wires arranged in parallel and the anode structure 4111, so that the transmittance of the first display region 11 can be improved. For example, as illustrated in FIG. 12C, the plurality of transparent wires arranged in parallel include the connecting wire 60 and a dummy wire 601. For example, the dummy wire 601 has a fracture, and thus, the dummy wire 601 is a discontinuous wire. For example, by arranging the dummy wire 601 with the fracture, the etching uniformity of the first display region 11 can be improved. It should be noted that lines to which the arrows in FIG. 12C point are shadings, but not real wires.

It should be noted that the first line portions 231 of the display substrates illustrated in FIG. 11 and FIG. 12A to FIG. 12B are not limited to be positioned in the peripheral region 14; and the third line portion 241 is not limited to be arranged in parallel to the first display region 11 in the first direction D1 and positioned at the end, close to the first display region 11, of the third display region 13. In an example, the first line portion 231 and the third line portion 241 can be both positioned in the second display region 12, and in addition, the first line portion 231 is positioned on one side, away from the third display region 13, of the first display region 11 in the first direction D1, while the third line portion 241 is positioned between the first display region 11 and the third display region 13 in the first direction D1. In another example, the first line portion 231 may be simultaneously positioned in the peripheral region 14 and the second display region 12, and the third line portion 241 may be simultaneously positioned in the third display region 13 and the second display region 12.

It should be noted that although the first display regions 11 of the display substrates 01 illustrated in FIG. 4, FIG. 6, FIG. 8, FIG. 10 and FIG. 11 are all of a rectangle shape, the embodiments of the present disclosure are not limited thereto. For example, according to actual application demands, the first display region 11 may also be of a circle shape or other suitable shapes; and correspondingly, the shape of the first winding portion 22 is adaptively changed. For example, the shape of the first winding portion 22 is matched with the shape of the first display region 11, so as to reduce influence of the first winding portion 22 on the elements in the first display region 11 and the second display region 12. Exemplary illustration is carried out below in connection with FIG. 13A to FIG. 13D.

Figure 13A:
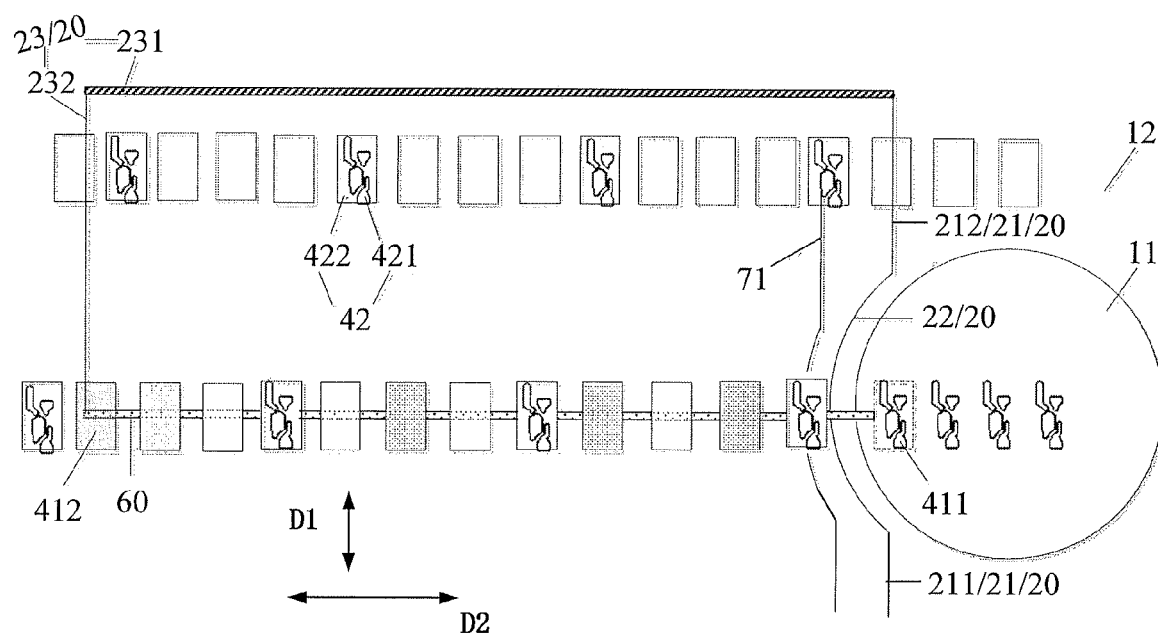
FIG. 13A is a plane schematic diagram of a sixth example of the display substrate 01 illustrated in FIG. 2A.
Figure 13B:
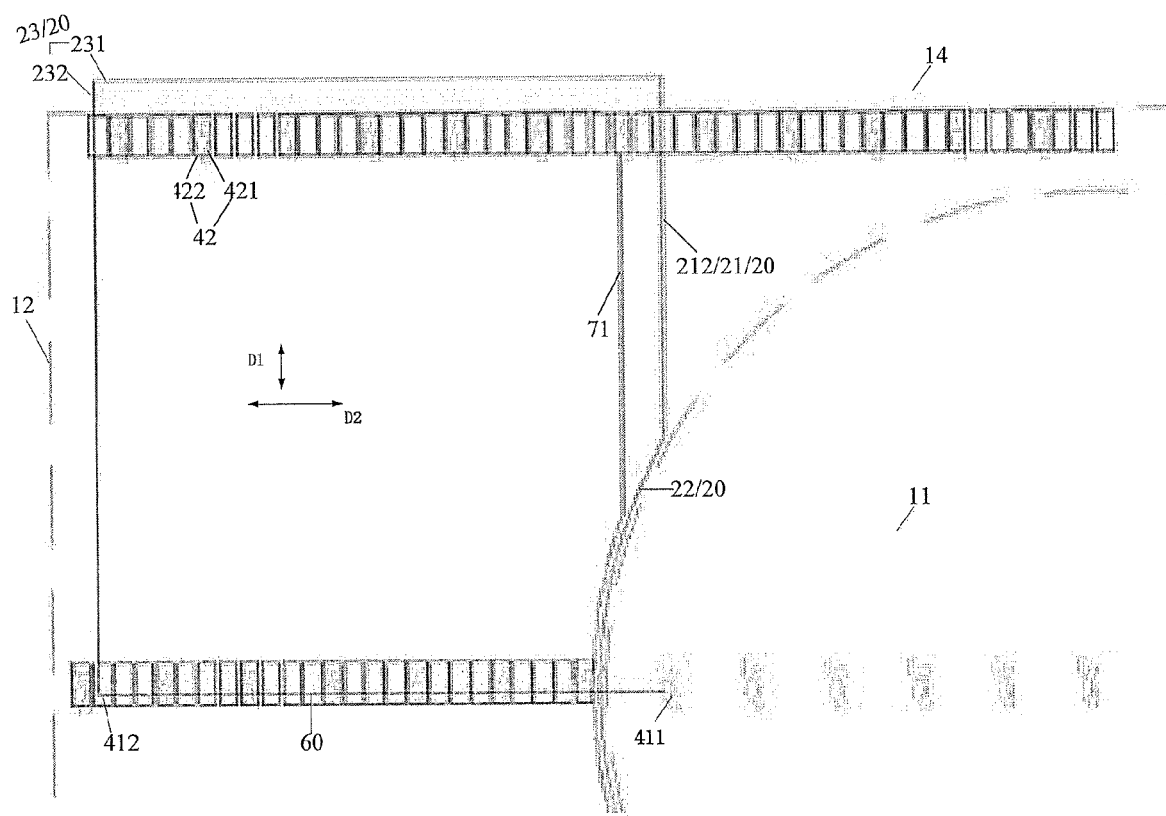
FIG. 13B is another plane schematic diagram of the sixth example of the display substrate illustrated in FIG. 2A.
Figure 13C:
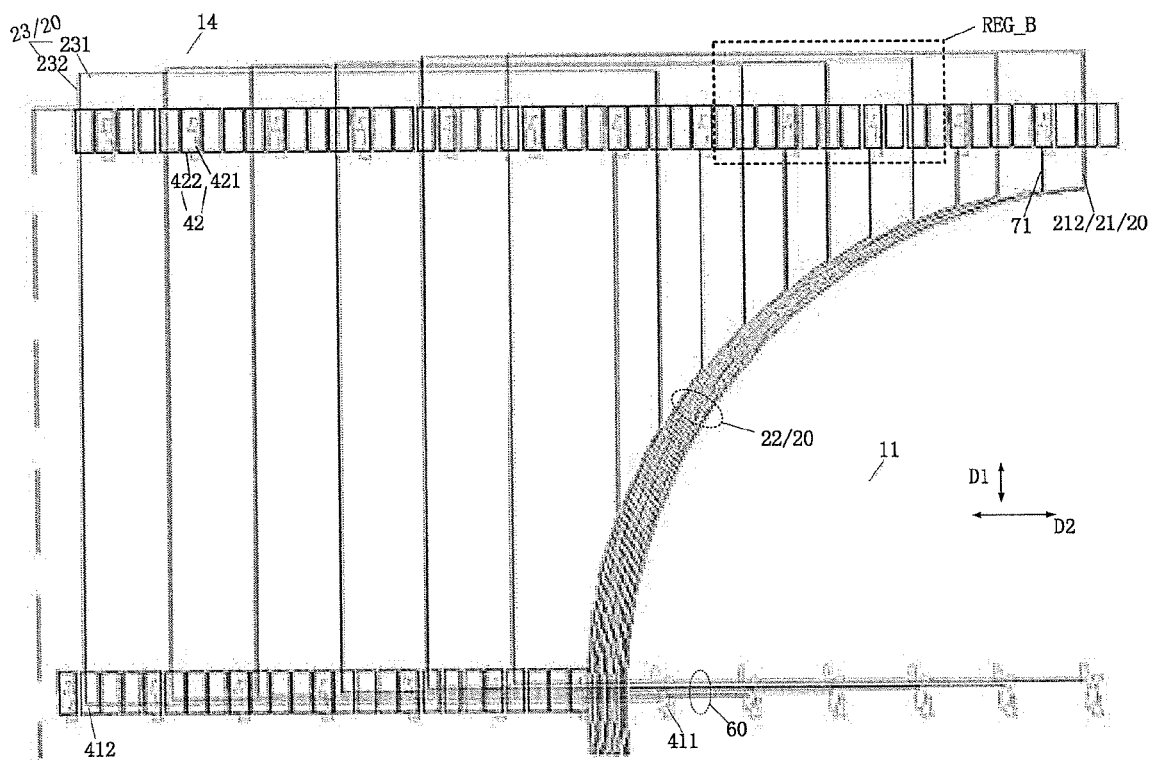
FIG. 13C is yet another plane schematic diagram of the sixth example of the display substrate illustrated in FIG. 2A.
Figure 13D:
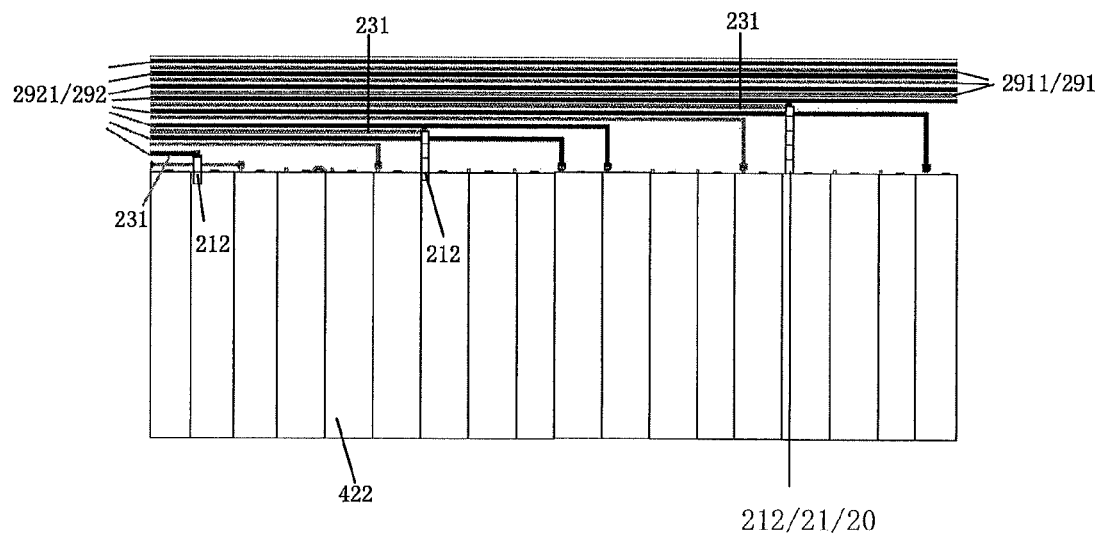
FIG. 13D is a plane schematic diagram corresponding to a partial region REG_B illustrated in FIG. 13C.

FIG. 13A is a plane schematic diagram of a sixth example of the display substrate 01 illustrated in FIG. 2A, FIG. 13B is another plane schematic diagram of the sixth example of the display substrate 01 illustrated in FIG. 2A, and FIG. 13C is yet another plane schematic diagram of the sixth example of the display substrate 01 illustrated in FIG. 2A. FIG. 13D is a plane schematic diagram corresponding to a partial region REG_B illustrated in FIG. 13C.

It should be noted that for clarity, FIG. 13A merely illustrates part of the second display region 12 and part of the peripheral region 14 of the display substrate 01, and FIG. 13B and FIG. 13C merely illustrate part of the first display region 11, part of the second display region 12 and part of the peripheral region 14 of the display substrate 01.

The display substrates 01 illustrated in FIG. 13A to FIG. 13C are similar with the display substrates 01 illustrated in FIG. 5A to FIG. 5C, only the difference between them is illustrated herein, and the same points are not repeated herein. The difference between the display substrates 01 illustrated in FIG. 13A to FIG. 13C and the display substrates 01 illustrated in FIG. 5A to FIG. 5C is that for the display substrates 01 illustrated in FIG. 13A to FIG. 13C, the shapes of the first display regions 11 and the shapes of the first winding portions 22 are different.

As illustrated in FIG. 13A to FIG. 13C, the first display region 11 is of a circle shape; and the first winding portion 22 is an arc line, a first end of the arc line is connected with the end portion, close to the second sub-portion 212, of the first sub-portion 211, and a second end of the arc line is connected with the end portion, close to the first sub-portion 211, of the second sub-portion 212. For example, the curvature of the arc line is matched with (e.g., equal to) that of the circle shape mutually.

It should be noted that according to actual application demands, the shapes of the first display regions 11 of the display substrates 01 illustrated in FIG. 6, FIG. 8, FIG. 10 and FIG. 11 also can be changed into the circle shape, and the first winding portions 22 are changed into the arc lines, which is not repeated herein.

For example, as illustrated in FIG. 13C and FIG. 13D, the peripheral region 14 further includes a plurality of wires 2911 and a plurality of wires 2921; the plurality of wires 2911 are positioned in an electrode layer 291, and the plurality of wires 2921 are positioned in an electrode layer 292. For example, the electrode layer 291 and the electrode layer 292 are different electrode layers in the direction perpendicular to the display substrate. For example, the plurality of wires 2911 and the plurality of wires 2921 are alternatively arranged in a direction perpendicular to an extending direction of the wires 2911. For example, by enabling the plurality of wires 2911 and the plurality of wires 2921 to be alternatively arranged in the direction perpendicular to the extending direction of the wires 2911 and enabling the wires 2911 and the wires 2921 to be positioned in different electrode layers, the arrangement density of the wires (the integral wires 2911 and wires 2921) can be increased.

For example, the second sub-portion 212 of the first signal line 20 and the plurality of wires 2911 are positioned in different electrode layers, and the second sub-portion 212 of the first signal line 20 and the plurality of wires 2921 are positioned in different electrode layers. For example, the gate electrode 4222 and the first capacitor plate 4225 illustrated in FIG. 5H are also positioned in the electrode layer 291; the second capacitor plate 4226 illustrated in FIG. 5H is also positioned in the electrode layer 292; and the second sub-portion 212 of the first signal line 20 is positioned in the same electrode layer with the source electrode 4223 and the drain electrode 4224 illustrated in FIG. 5H.

For example, as illustrated in FIG. 13C and FIG. 13D, the second sub-portion 212 of the first signal line 20 passing through the second pixel circuit 422 is electrically connected (e.g., electrically connected through a via hole) with the corresponding wire 2911 or the corresponding wire 2921, so that the signal on the second sub-portion 212 of the first signal line 20 is subjected to layer changing to the corresponding wire 2911 or the corresponding wire 2921 for transmission. For example, the wire 2911 or the wire 2921 electrically connected with the second sub-portion 212 of the first signal line 20 is called as the first line portion 231. For example, the second sub-portion 212 of the first signal line 20 passing through the second pixel circuit 422 is electrically connected with the corresponding wire 2911 or the corresponding wire 2921.

For example, the first signal line (positioned in an SD layer) led from each pixel unit can be subjected to layer changing to a Gat1 layer (the electrode layer 291) or a Gat2 layer (the electrode layer 292). For example, if a longitudinal lead intersects with a transverse lead, the longitudinal lead (the second sub-portion 212 of the first signal line 20) adopts the SD layer, and it is because that the distance between the SD layer and the Gat layer (the electrode layer 291 or 292) can be greater than that between the Gat1 layer (the electrode layer 291) and the Gat2 layer (the electrode layer 292), so that the capacitive coupling can be reduced.

It should be noted that although the second display regions 12 of the display substrates 01 illustrated in FIG. 4, FIG. 6, FIG. 8, FIG. 10, FIG. 11 and FIG. 13A to FIG. 13C are all of a rectangle shape, the embodiments of the present disclosure are not limited thereto. For example, according to actual application demands, the second display region 12 also may be of a circle shape or other suitable shapes, which is not repeated herein.

It should be noted that the first signal lines 20 of the display substrate 01 illustrated in FIG. 4, FIG. 6, FIG. 8, FIG. 10, FIG. 11 and FIG. 13A to FIG. 13C all adopt two or more winding portions to wind the first signal lines 20 to the positions in parallel (in parallel in the second direction D2) to the first main body portion 21, the embodiments of the present disclosure are not limited thereto. For example, according to actual application demands, the first signal line 20 of the display substrate 01 can merely adopt one winding portion to wind the first signal line 20 to the position in parallel (in parallel in the second direction D2) to the first main body portion 21, and exemplary illustration is carried out below in connection with FIG. 14.

Figure 14:
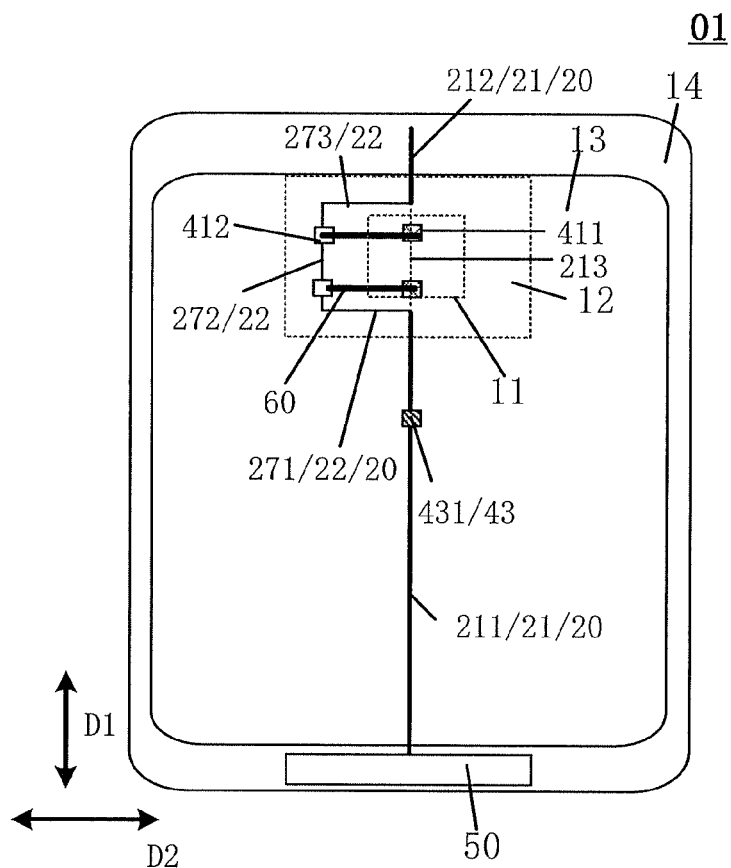
FIG. 14 is a plane schematic diagram of a seventh example of the display substrate illustrated in FIG. 2A.

FIG. 14 is a plane schematic diagram of a seventh example of the display substrate 01 illustrated in FIG. 2A. The display substrate 01 illustrated in FIG. 14 is similar with the display substrate 01 illustrated in FIG. 4, only the difference between them will be illustrated herein, and the same points are not repeated herein. The difference between the display substrate 01 illustrated in FIG. 14 and the display substrate 01 illustrated in FIG. 4 includes: the display substrate 01 illustrated in FIG. 14 merely has the first winding portion 22, but does not have the second winding portion 23.

For example, as illustrated in FIG. 14, the first winding portion 22 surrounds the first display region 11, and is integrally positioned in the second display region 12. For example, as illustrated in FIG. 14, the first winding portion 22 includes a fifth line portion 271, a sixth line portion 272 and a seventh line portion 273 which are sequentially connected; the fifth line portion 271 is electrically connected with the first sub-portion 211, and the seventh line portion 273 is electrically connected with the second sub-portion 212; the sixth line portion 272 extends along the first direction D1, and the fifth line portion 271 and the seventh line portion 273 extend along the second direction D2 intersecting with the first direction D1; the sixth line portion 272 and a dummy connecting line positioned between the first sub-portion 211 and the second sub-portion 212 and extending along the first direction D1 are arranged in parallel in the first direction D1; the sixth line portion 272 and the first pixel circuit 412 electrically connected with the sixth line portion 272 at least partially overlap with each other (or are positioned in the same column, closely adjacent to each other, but do not overlap with each other); and in the working process, the current trend in the sixth line portion 272 is the same with the current trend in the first main body portion 211. For example, the fifth line portion 271, the sixth line portion 272 and the seventh line portion 273 are all straight line segments.

For example, the data driving circuit 50 can be implemented as a driving chip. For example, the driving chip can be bound on the display substrate 01 via a flexible circuit board, and provide data signals for display to a plurality of data lines via a flexible circuit so as to drive the display substrate 01 to achieve the display function. For example, in the peripheral region 14, a gate driving chip also can be arranged, or a gate driving circuit (GOA, not illustrated in the drawings) on an array substrate also can be formed, and a plurality of output ends of the gate driving chip or GOA are respectively connected with a plurality of gate lines, so as to provide gate scanning signals to the plurality of gate lines. It should be noted that the display substrate 01 is not limited to be driven by one single data driving circuit, and in some examples, the display substrate 01 can be driven by two data driving circuits, and the two data driving circuits are positioned on different sides of the display substrate 01 (e.g., positioned on different sides of the display substrate 01 in the first direction D1).

Figure 15:
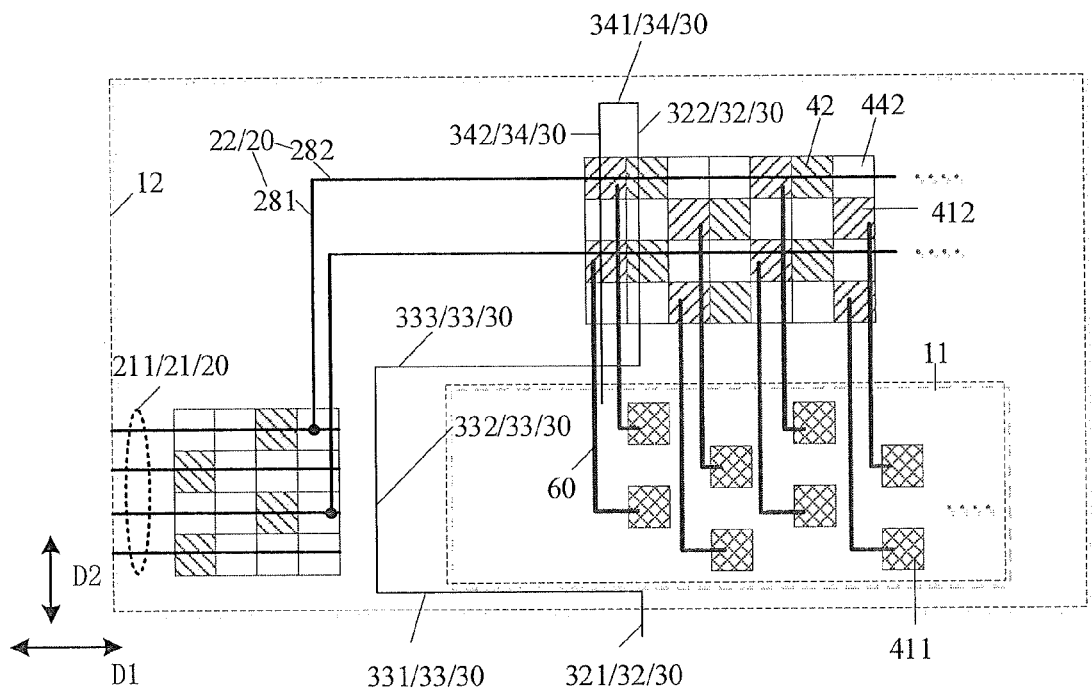
FIG. 15 is a plane schematic diagram of an eighth example of the display substrate illustrated in FIG. 2A.
Figure 16:
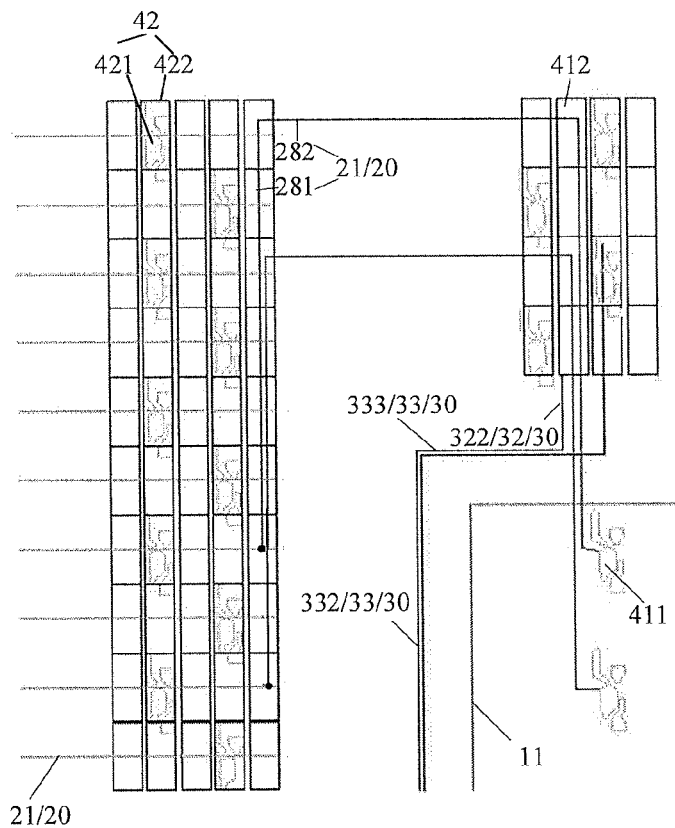
FIG. 16 is another plane schematic diagram of the eighth example of the display substrate illustrated in FIG. 2A.

FIG. 15 is a plane schematic diagram of an eighth example of the display substrate 01 illustrated in FIG. 2A, and FIG. 16 is another plane schematic diagram of the eighth example of the display substrate 01 illustrated in FIG. 2A. It should be noted that for clarity, FIG. 15 merely illustrates the first display region 11 and part of the second display region 12 of the display substrate 01.

The display substrate 01 illustrated in FIG. 15 is similar with the display substrate 01 illustrated in FIG. 4, only the differences between them will be illustrated herein, and the same points are not repeated herein. The differences between the display substrate 01 illustrated in FIG. 15 and the display substrate 01 illustrated in FIG. 4 include: the first direction D1 of the display substrate 01 illustrated in FIG. 15 is a row direction of a display panel; the connecting wire 60 of the display substrate 01 illustrated in FIG. 15 extends along a column direction; the first signal line 20 of the display substrate 01 illustrated in FIG. 15 is a gate line, while the second signal line 30 is a data line; and the structures of the winding portions of the first signal line 20 and the second signal line 30 of the display substrate 01 illustrated in FIG. 15 are respectively different from those of the winding portions of the first signal line 20 and the second signal line 30 of the display substrate 01 shown in FIG. 4.

For example, as illustrated in FIG. 15, the first winding portion 22 surrounds the first display region 11, and is integrally positioned in the second display region 12; the first winding portion 22 includes an eighth line portion 281 and a ninth line portion 282 which are sequentially connected; the eighth line portion 281 is electrically connected with the first main body portion 21, and extends along the second direction D2; the ninth line portion 282 extends along the first direction D1, and is arranged in parallel to a dummy extending line of the first main body portion 21 in the first direction D1; in the working process, the current trend in the ninth line portion 282 is the same with the current trend in the main body portion; and the ninth line portion 282 is electrically connected to the first pixel circuit 412 configured to drive a first number of first light emitting elements 411 arranged in parallel in the first display region 11 along the first direction D1. For example, both the eighth line portion 281 and the ninth line portion 282 are straight line segments.

In some examples, the first main body portion 21 includes the first sub-portion 211 and the second sub-portion 212 (not illustrated in the drawings), the first winding portion 22 further includes a tenth line portion (not illustrated in the drawings), a first end of the tenth line portion is connected with the ninth line portion 282, a second end of the tenth line portion is connected with the second sub-portion 212, and the tenth line portion extends along the second direction D2.

For example, as illustrated in FIG. 15, the second signal line 30 includes the second main body portion 32, a fourth winding portion 33 and a fifth winding portion 34; the fourth winding portion 33 is routed deviated from a dummy extending line of the second main body portion 32 along the second direction D2; the second main body portion 32 includes a third sub-portion 321 and a fourth sub-portion 322 which are spaced by the first display region 11, and the third sub-portion 321 is electrically connected with the fourth sub-portion 322 via the fourth winding portion 33; and the fourth winding portion 33 is routed deviated from a dummy connecting line positioned between the third sub-portion 321 and the fourth sub-portion 322 and extending along the second direction D2. For example, at least part of the fourth winding portion 33 extends along a direction intersecting with the second direction D2. For example, at least part of the fifth winding portion 34 extends along the direction intersecting with the second direction D2. For example, both the third sub-portion 321 and the fourth sub-portion 322 are straight line segments.

For example, as illustrated in FIG. 15, the fourth winding portion 33 includes a fourth line segment 331, a fifth line segment 332 and a sixth line segment 333 which are sequentially connected. The end portion, which is not connected with the fifth line segment 332, of the fourth line segment 331 is connected with the end portion, close to the fourth sub-portion 322, of the third sub-portion 321. The end portion, which is not connected with the fifth line segment 332, of the sixth line segment 333 is connected with the end portion, close to the third sub-portion 321, of the fourth sub-portion 322. The fourth line segment 331 and the sixth line segment 333 extend along the first direction D1, and the fifth line segment 332 extends along the second direction D2. For example, the fourth line segment 331, the fifth line segment 332 and the sixth line segment 333 are all straight line segments.

For example, as illustrated in FIG. 15, a first end of the fifth winding portion 34 is electrically connected with the second sub-portion 212, and a second end of the fifth winding portion 34 is electrically connected with the corresponding first pixel circuit 412. For example, as illustrated in FIG. 15, the second end of the fifth winding portion 34 may be electrically connected with the same column of first pixel circuits 412 (e.g., the same column of first pixel circuits 412 directly adjacent to the second line portion 232 of the second winding portion 23).

For example, as illustrated in FIG. 15, the fifth winding portion 34 includes a seventh line segment 341 and an eighth line segment 342 which are sequentially connected; the end, which is not connected with the eighth line segment 342, of the seventh line segment 341 serves as the first end of the fifth winding portion 34; the end, which is not connected with the seventh line segment 341, of the eighth line segment 342, serves as the second end of the fifth winding portion 34; the seventh line segment 341 extends along the first direction D1; the eighth line segment 342 extends along the second direction D2, and is arranged in parallel to the second sub-portion 212 in the first direction D1; and in the working process, the current trend in the eighth line segment 342 is opposite to the current trend in the second sub-portion 212. For example, both the seventh line segment 341 and the eighth line segment 342 are straight line segments.

For example, as illustrated in FIG. 15, the first light emitting element 411 and the first pixel circuit 412 for driving the first light emitting element 411 are positioned on the adjacent columns of the display panel. For example, as illustrated in FIG. 15, at least one second signal line 30 is configured to drive the first light emitting element 411 and the second light emitting element 421 arranged in parallel along the second direction D2, i.e., the first light emitting element 411 and the third light emitting element 431 which are driven by the same one second signal line 30 are positioned in the same column of the display substrate 01.

It should be noted that in some examples, the first light emitting element 411 and the first pixel circuit 412 for driving the first light emitting element 411 also can be positioned in the same column of the display panel, i.e., the first light emitting element 411 and the first pixel circuit 412 for driving the first light emitting element 411 are arranged in parallel in the column direction.

For example, as illustrated in FIG. 15, the first direction D1 is the row direction of the display panel, and the second direction D2 is the column direction of the display panel; and the first signal line 20 is a gate line, and the second signal line 30 is a data line.

It should be noted that extension of the connecting wire 60 of the display substrate 01 illustrated in FIG. 15 along the column direction is not limited to the case that the connecting wire 60 of the display substrate 01 is straight (i.e., not limited to the case that the connecting wire 60 of the display substrate 01 is a straight line segment), and in some examples, the connecting wire 60 of the display substrate 01 illustrated in FIG. 15 further includes a portion extending along the row direction.

For example, the source and drain electrodes, the first winding portion and the second signal line are all positioned in the first electrode layer, and the first main body portion, the gate electrode and the first capacitor plate are positioned in the second electrode layer. For another example, both the first winding portion and the second signal line are positioned in the first electrode layer, and the first main body portion and the second capacitor plate of the storage capacitor are positioned in the second electrode layer.

FIG. 16 is similar with FIG. 15, FIG. 16 illustrates more first signal lines 20, the fifth winding portion 34 of the second signal line 30 is not illustrated in FIG. 16, and FIG. 16 is not repeated herein.

Figure 17:
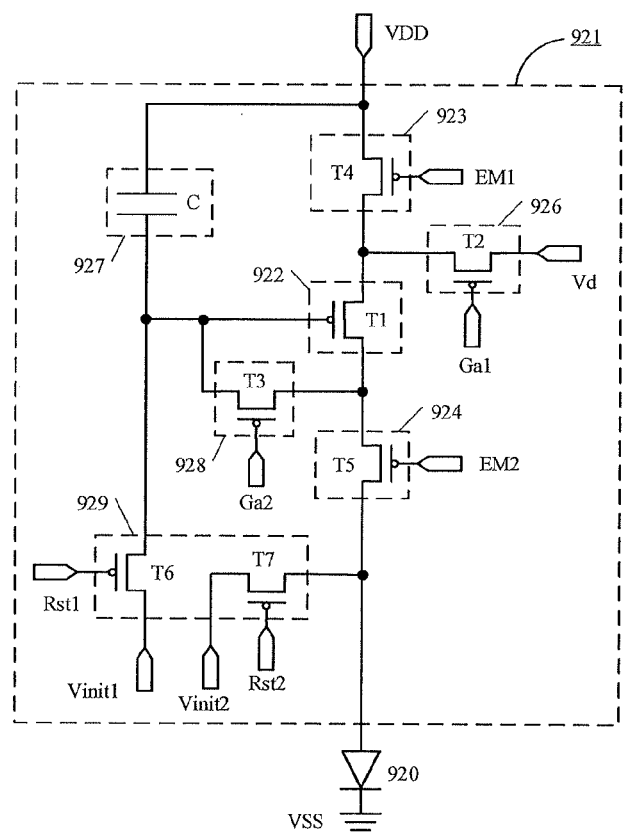
FIG. 17 illustrates a pixel circuit and a light emitting element driven by a pixel electrode, which are provided by at least one embodiment of the present disclosure.

FIG. 17 illustrates a pixel circuit 921 and a light emitting element 920 driven by the pixel circuit, which are provided by at least one embodiment of the present disclosure. For example, at least one (e.g., all) of the first pixel circuit 412, the second pixel circuit 422 and the third pixel circuit 432 which are provided by at least one embodiment of the present disclosure can be implemented as the pixel circuit 921 illustrated in FIG. 17.

For example, as illustrated in FIG. 17, the pixel circuit 921 further includes a first light emitting control circuit 923 and a second light emitting control circuit 924. A driving circuit 922 includes a control end, a first end and a second end, and is configured to provide a driving current for driving the organic light emitting element 920 to emit light to the organic light emitting element 920. For example, the first light emitting control circuit 923 is connected to the first end of the driving circuit 922 and a first voltage end VDD, and is configured to implement connection or disconnection between the driving circuit 922 and the first voltage end VDD. The second light emitting control circuit 924 is electrically connected to the second end of the driving circuit 922 and a first electrode of the organic light emitting element 920, and is configured to implement connection or disconnection between the driving circuit 922 and the organic light emitting element 920.

For example, as illustrated in FIG. 17, the pixel circuit 921 further includes a data writing circuit 926, a storage circuit 927, a threshold compensating circuit 928 and a reset circuit 929. The data writing circuit 926 is electrically connected to the first end of the driving circuit 922, and is configured to write a data signal into the storage circuit 927 under the control of a scanning signal; the storage circuit 927 is electrically connected to the control end of the driving circuit 922 and the first voltage end VDD, and is configured to store the data signal; the threshold compensating circuit 928 is electrically connected to the control end and the second end of the driving circuit 922, and is configured to carry out threshold compensation on the driving circuit 922; and the reset circuit 929 is electrically connected to the control end of the driving circuit 922 and the first electrode of the organic light emitting element 920, and is configured to carry out resetting on the control end of the driving circuit 922 and the first electrode of the organic light emitting element 920 under the control of a reset control signal.

For example, as illustrated in FIG. 17, the driving circuit 922 includes a driving transistor T1, the control end of the driving circuit 922 includes a gate electrode of the driving transistor T1, the first end of the driving circuit 922 includes a first electrode of the driving transistor T1, and the second end of the driving circuit 922 includes a second electrode of the driving transistor T1.

For example, as illustrated in FIG. 17, the data writing circuit 926 includes a data writing transistor T2, the storage circuit 927 includes a capacitor C, the threshold compensating circuit 928 includes a threshold compensating transistor T3, the first light emitting control circuit 923 includes a first light emitting control transistor T4, the second light emitting control circuit 924 includes a second light emitting control transistor T5, the reset circuit 929 includes a first reset transistor T6 and a second reset transistor T7, and the reset control signal may include a first reset control sub-signal and a second reset control sub-signal.

For example, as illustrated in FIG. 17, a first electrode of the data writing transistor T2 is electrically connected to the first electrode of the driving transistor T1, a second electrode of the data writing transistor T2 is electrically connected to a data line Vd to receive the data signal, and a gate electrode of the data writing transistor T2 is electrically connected to a first scanning signal line Ga1 to receive the scanning signal; a first electrode of the capacitor C is electrically connected to the first power supply end VDD, and a second electrode of the capacitor C is electrically connected to the gate electrode of the driving transistor T1; a first electrode of the threshold compensating transistor T3 is electrically connected to the second electrode of the driving transistor T1, a second electrode of the threshold compensating transistor T3 is electrically connected to the gate electrode of the driving transistor T1, and a gate electrode of the threshold compensating transistor T3 is electrically connected to a second scanning signal line Ga2 to receive a compensation control signal; a first electrode of the first reset transistor T6 is electrically connected to a first reset power end Vinit1 to receive a first reset signal, a second electrode of the first reset transistor T6 is electrically connected to the gate electrode of the driving transistor T1, and a gate electrode of the first reset transistor T6 is electrically connected to a first reset control signal line Rst1 to receive a first reset control sub-signal; a first electrode of the second reset transistor T7 is electrically connected to a second reset power end Vinit2 to receive a second reset signal, a second electrode of the second reset transistor T7 is electrically connected to the first electrode of the organic light emitting element 920, and a gate electrode of the second reset transistor T7 is electrically connected to a second reset control signal line Rst2 to receive a second reset control sub-signal; a first electrode of the first light emitting control transistor T4 is electrically connected to the first power supply end VDD, a second electrode of the first light emitting control transistor T4 is electrically connected to the first electrode of the driving transistor T1, and a gate electrode of the first light emitting control transistor T4 is electrically connected to a first light emitting control signal line EM1 to receive a first light emitting control signal; a first electrode of the second light emitting control transistor T5 is electrically connected to the second electrode of the driving transistor T1, a second electrode of the second light emitting control transistor T5 is electrically connected to a second electrode of the organic light emitting element 920, and a gate electrode of the second light emitting control transistor T5 is electrically connected to a second light emitting control signal line EM2 to receive a second light emitting control signal; and the first electrode of the organic light emitting element 920 is electrically connected to a second power supply end VSS.

For example, one of the first power supply end VDD and the second power supply end VSS is a high-voltage end, while the other one is a low-voltage end. For example, in the embodiment illustrated in FIG. 17, the first power supply end VDD is a voltage source for outputting a constant first voltage, and the first voltage is a positive voltage; and the second power supply end VSS can be a voltage source for outputting a constant second voltage, and the second voltage is a negative voltage and the like. For example, in some examples, the second power supply end VSS can be grounded.

For example, as illustrated in FIG. 17, the scanning signal and the compensation control signal can be the same, i.e., the gate electrode of the data writing transistor T2 and the gate electrode of the threshold compensating transistor T3 can be electrically connected to the same signal line, e.g., the first scanning signal line Ga1, so as to receive the same signal (e.g., the scanning signal), and in this case, the second scanning signal line Ga2 can be not arranged on the display substrate 1000, so as to reduce the number of the signal lines. For another example, the gate electrode of the data writing transistor T2 and the gate electrode of the threshold compensating transistor T3 also can be electrically connected to different signal lines, respectively, i.e., the gate electrode of the data writing transistor T2 is electrically connected to the first scanning signal line Ga1 and the gate electrode of the threshold compensating transistor T3 is electrically connected to the second scanning signal line Ga2, and signals transmitted by the first scanning signal line Ga1 and the second scanning signal line Ga2 are the same.

It should be noted that the scanning signal and the compensation control signal also may be different, so that the gate electrode of the data writing transistor T2 and the threshold compensation transistor T3 can be separately and individually controlled, so as to improve flexibility of controlling the pixel circuit.

For example, as illustrated in FIG. 17, the first light emitting control signal and the second light emitting control signal can be the same, i.e., the gate electrode of the first light emitting control transistor T4 and the gate electrode of the second light emitting control transistor T5 can be electrically connected to the same signal line, e.g., the first light emitting control signal line EM1, so as to receive the same signal (e.g., the first light emitting control signal), and in this case, the second light emitting control signal line EM2 can be not arranged on the display substrate 1000, so as to reduce the number of the signal lines. For another example, the gate electrode of the first light emitting control transistor T4 and the gate electrode of the second light emitting control transistor T5 also can be electrically connected to different signal lines, respectively, i.e., the gate electrode of the first light emitting control transistor T4 is electrically connected to the first light emitting control signal line EM1 and the gate electrode of the second light emitting control transistor T5 is electrically connected to the second light emitting control signal line EM2, and signals transmitted by the first light emitting control signal line EM1 and the second light emitting control signal line EM2 are the same.

It should be noted that when the first light emitting control transistor T4 and the second light emitting control transistor T5 are different types of transistors, e.g., the first light emitting control transistor T4 is a P-type transistor and the second light emitting control transistor T5 is an N-type transistor, the first light emitting control signal and the second light emitting control signal also can be different, and the embodiments of the present disclosure do not make any limit in this aspect.

For example, the first reset control sub-signal and the second reset control sub-signal can be the same, i.e., the gate electrode of the first reset transistor T6 and the gate electrode of the second reset transistor T7 can be electrically connected to the same signal line, e.g., the first reset control signal line Rst1, so as to receive the same signal (e.g., the first reset control sub-signal), and in this case, the second reset control signal line Rst2 can be not arranged on the display substrate 1000, so as to reduce the number of the signal lines. For another example, the gate electrode of the first reset transistor T6 and the gate electrode of the second reset transistor T7 also can be electrically connected to different signal lines, respectively, i.e., the gate electrode of the first reset transistor T6 is electrically connected to the first reset control signal line Rst1 and the gate electrode of the second reset transistor T7 is electrically connected to the second reset control signal line Rst2, and signals transmitted by the first reset control signal line Rst1 and the second reset control signal line Rst2 are the same. It should be noted that the first reset control sub-signal and the second reset control sub-signal also can be different.

For example, in some examples, the second reset control sub-signal can be the same with the scanning signal, i.e., the gate electrode of the second reset transistor T7 can be electrically connected to the first scanning signal line Ga1 to receive the scanning signal which serves as the second reset control sub-signal.

For example, the gate electrode of the first reset transistor T6 and a source electrode of the second reset transistor T7 are connected to the first reset power end Vinit1 and the second reset power end Vinit2, respectively, and the first reset power end Vinit1 and the second reset power end Vinit2 can be direct current reference voltage ends, so as to output a constant direct current reference voltage. The first reset power end Vinit1 and the second reset power end Vinit2 can be the same, and for example, the gate electrode of the first reset transistor T6 and the source electrode of the second reset transistor T7 are connected to the same reset power end. The first reset power end Vinit1 and the second reset power end Vinit2 may be high-voltage ends, or may be low-voltage ends, as long as the first reset power end Vinit1 and the second reset power end Vinit2 can provide a first reset signal and a second reset signal to carry out resetting on the gate electrode of the driving transistor T1 and the first electrode of the light emitting element 920, and the present disclosure does not make any limit in this aspect.

It should be noted that the driving circuit 922, the data writing circuit 926, the storage circuit 927, the threshold compensating circuit 928 and the reset circuit 929 in the pixel circuit illustrated in FIG. 17 are merely schematic, and the specific structures of the circuits such as the driving circuit 922, the data writing circuit 926, the storage circuit 927, the threshold compensating circuit 928, the reset circuit 929 and the like can be set according to actual application demands, and the embodiments of the present disclosure do not make any specific limit in this aspect.

For example, according to the characteristics of the transistors, the transistors can be divided into the N-type transistors and the P-type transistors, and for clarity, the embodiments of the present disclosure illustrate the technical solutions of the present disclosure in detail by taking the case that the transistors are the P-type transistors (e.g., P-type MOS transistors) as an example, and in other words, in the description of the present disclosure, the driving transistor T1, the data writing transistor T2, the threshold compensating transistor T3, the first light emitting control transistor T4, the second light emitting control transistor T5, the first reset transistor T6, the second reset transistor T7 and the like all can be the P-type transistors. However, the transistors in the embodiments of the present disclosure are not limited to the P-type transistors, and those skilled in the art also can utilize the N-type transistor (e.g., an N-type MOS transistor) to achieve functions of one or a plurality of transistors in the embodiments of the present disclosure according to actual demands.

It should be noted that the transistor adopted in the embodiments of the present disclosure can be a thin film transistor or a field effect transistor or other switching devices with the same characteristics, and the thin film transistor can include an oxide semiconductor thin film transistor, an amorphous silicon thin film transistor or a poly silicon thin film transistor and the like. A source electrode and a drain electrode of the thin film transistor can be symmetrical in structure, so there is no difference between the source electrode and the drain electrode of the thin film transistor in physical structure. In the embodiments of the present disclosure, in order to distinguish the transistors, except for the gate electrode used as a control electrode, it is directly described that one electrode is the first electrode and the other electrode is the second electrode, and thus, in the embodiments of the present disclosure, the first electrodes and the second electrodes of all or part of the transistors can be interchanged as required.

It should be noted that the first pixel circuit 412, the second pixel circuit 422 and the third pixel circuit 432 which are provided by at least one embodiment of the present disclosure are not limited to a pixel circuit implemented to include seven transistors and one capacitor (i.e., not limited to a 7T1C pixel circuit illustrated in FIG. 17), and the first pixel circuit 412, the second pixel circuit 422 and the third pixel circuit 432 which are provided by at least one embodiment of the present disclosure can include an applicable number of transistors and an applicable number of capacitors. For example, according to actual application demands, the first pixel circuit 412, the second pixel circuit 422 and the third pixel circuit 432 which are provided by at least one embodiment of the present disclosure can be 7T2C pixel circuits, 6T1C pixel circuits, 6T2C pixel circuits or 9T2C pixel circuits.

Figure 18:
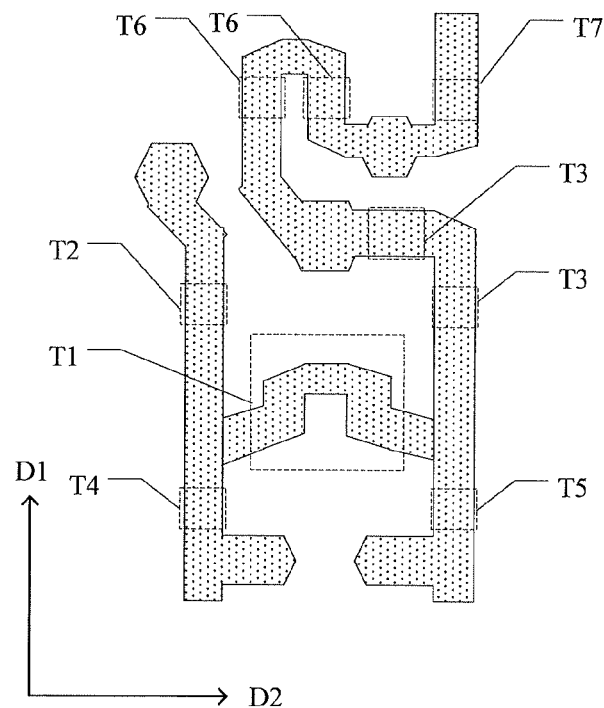
FIG. 18 is a structural schematic diagram of a 7T1C pixel circuit illustrated in FIG. 17.

FIG. 18 is a structural schematic diagram of the 7T1C pixel circuit illustrated in FIG. 17. Positions of a first transistor T1 to a seventh transistor T7 included by the 7T1C pixel circuit are illustrated in FIG. 18, which are not repeated herein.

Figure 19:
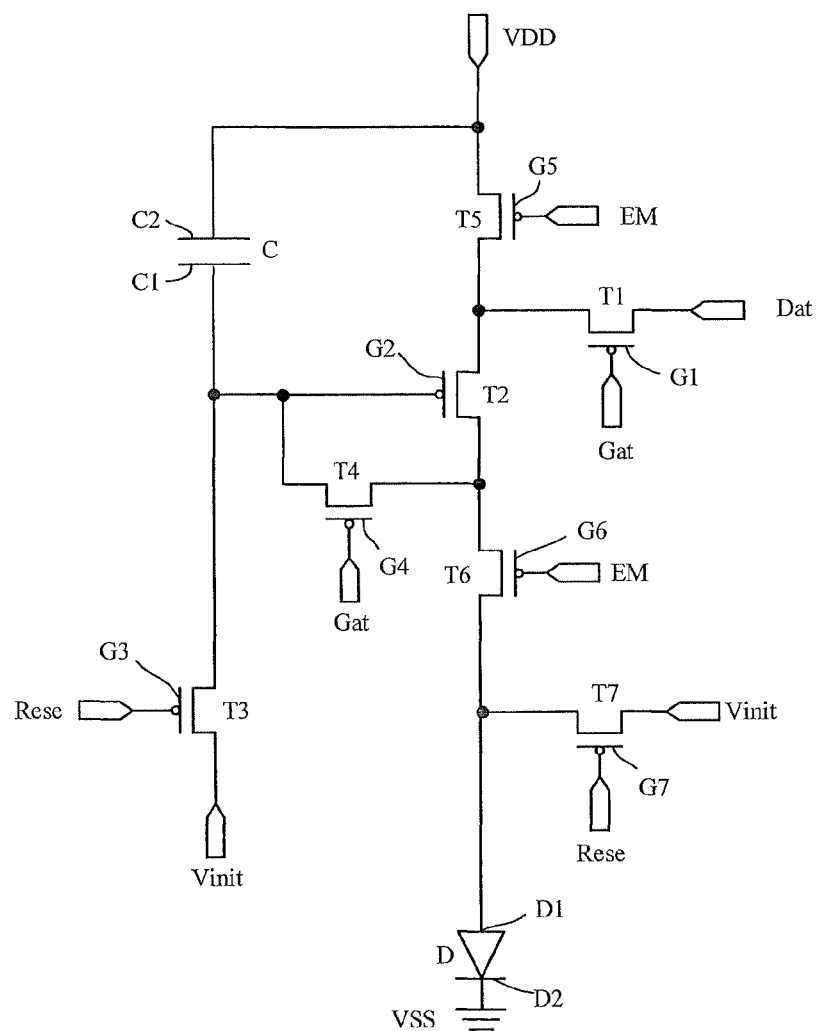
FIG. 19 is a structural schematic diagram illustrating a sub-pixel according to an embodiment of the present disclosure.
Figure 20:
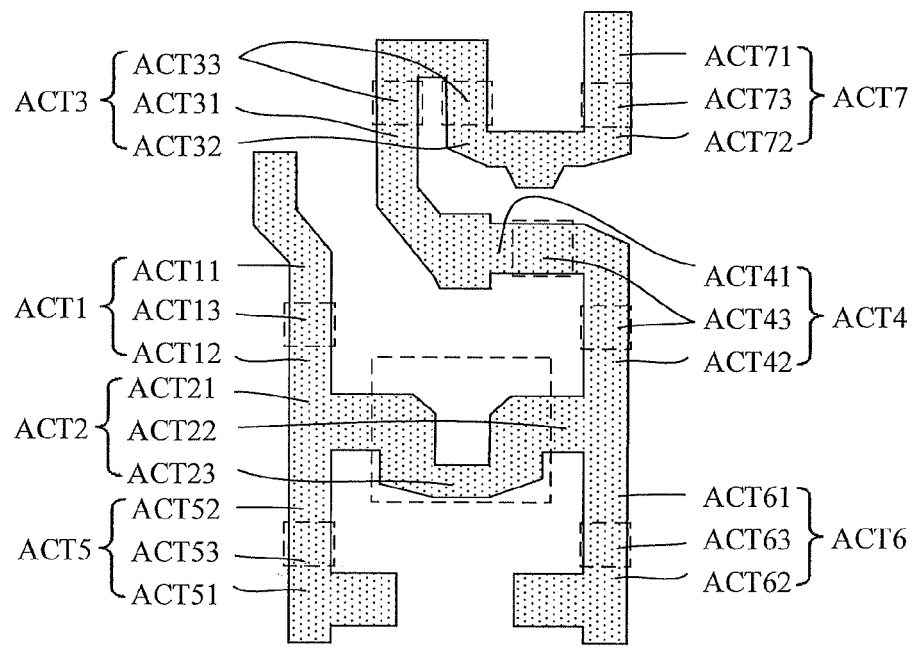
FIG. 20 to FIG. 23 are layout schematic diagrams respectively illustrating certain layers in sub-pixels according to some embodiments of the present disclosure.
Figure 21:
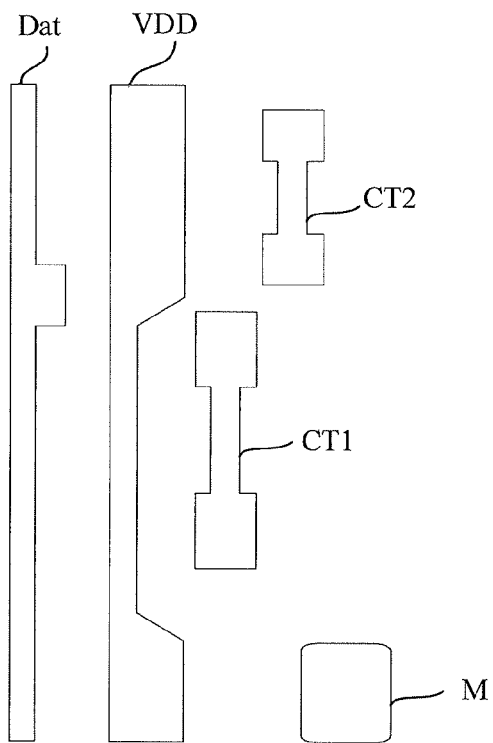
Figure 22:
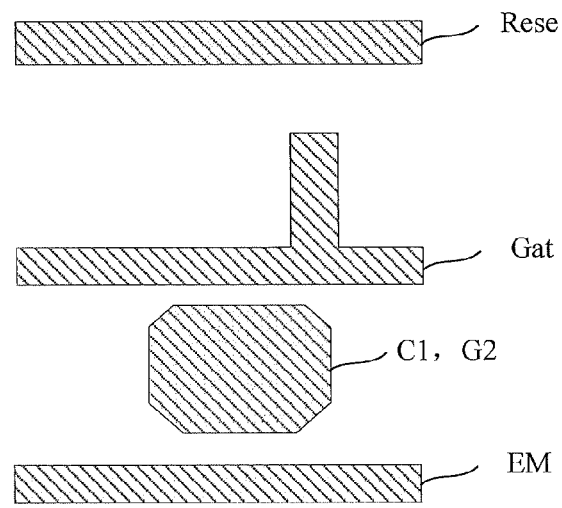
Figure 23:
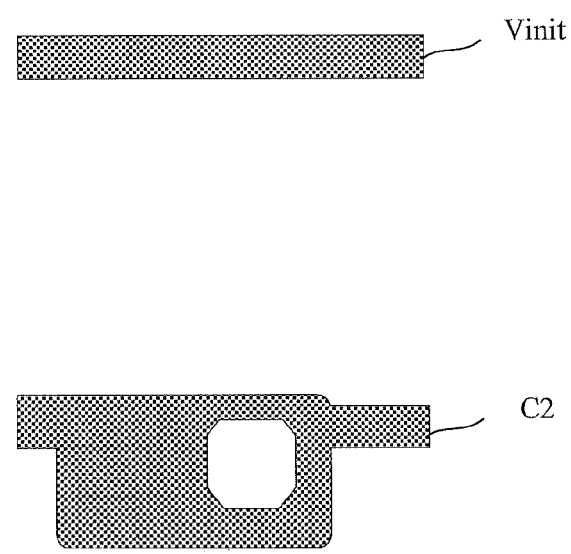
Figure 24:
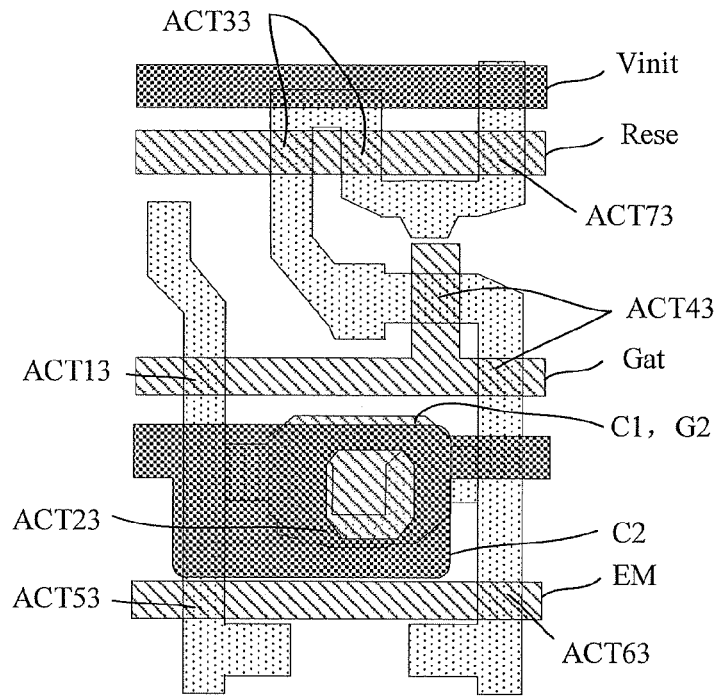
FIG. 24 is a layout schematic diagram of lamination of the layers illustrated in FIG. 20 to FIG. 23 in a sub-pixel according to an embodiment of the present disclosure.
Figure 25:
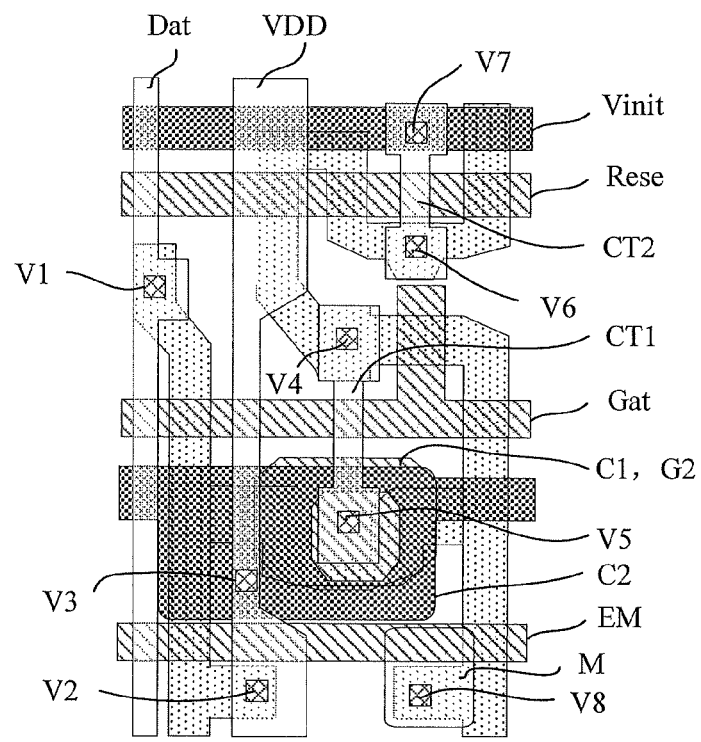
FIG. 25 is a layout schematic diagram of lamination of the layers illustrated in FIG. 20 to FIG. 23 in a sub-pixel according to an embodiment of the present disclosure.

FIG. 19 is a structural schematic diagram illustrating a sub-pixel according to one embodiment of the present disclosure. FIG. 20 to FIG. 23 are layout schematic diagrams respectively illustrating certain layers in sub-pixels according to some embodiments of the present disclosure. FIG. 20 is a plane schematic diagram of an LTPS layer (a low temperature poly silicon layer) of a sub-pixel according to one embodiment of the present disclosure; FIG. 21 is a plane schematic diagram of a SD layer (a source and drain electrode layer) of a sub-pixel according to one embodiment of the present disclosure; FIG. 22 is a plane schematic diagram of a Gat1 layer (a first gate layer) of a sub-pixel according to one embodiment of the present disclosure; and FIG. 23 is a plane schematic diagram of a Gat2 layer (a second gate layer) of a sub-pixel according to one embodiment of the present disclosure. FIG. 24 is a layout schematic diagram of lamination of the layers illustrated in FIG. 20, FIG. 22 and FIG. 23 in a sub-pixel according to one embodiment of the present disclosure. FIG. 25 is a layout schematic diagram of lamination of the layers illustrated in FIG. 20 to FIG. 23 in a sub-pixel according to one embodiment of the present disclosure. For example, the LTPS layer (the low temperature poly silicon layer), the Gat1 layer (the first gate layer), the Gat2 layer (the second gate layer) and the SD layer (the source and drain electrode layer) are sequentially arranged from bottom to top in a direction perpendicular to the sub-pixel. A data line of the SD layer (the source and drain electrode layer) can be exchanged to the Gat1 layer (the first gate layer) and the Gat2 layer (the second gate layer) after being led out.

As illustrated in FIG. 19, the sub-pixel can include a light emitting element D, a first transistor T1, a capacitor C, a second transistor T2 and a third transistor T3. The light emitting element D includes an anode D1 and a cathode D2. In some implementation modes, the light emitting element D can be an OLED. Herein, the first transistor T1 also can be called as a switching transistor, the second transistor T2 also can be called as a driving transistor, and the third transistor T3 also can be called as a reset transistor.

The first transistor T1 is configured to transmit a data signal from a data line Dat to the second transistor T2 when the first transistor T1 is turned on in response to a scanning signal of a gate line Gat. The second transistor T2 is configured to transmit a driving current Id to the light emitting element D when the second transistor T2 is turned on so as to drive the light emitting element D to emit light. The third transistor T3 is configured to reset a voltage of a gate electrode G2 of the second transistor T2 into a voltage of an initial voltage line Vinit when the third transistor T3 is turned on in response to a reset signal of a reset line Rese.

In different embodiments, as illustrated in FIG. 19, the sub-pixel can further include one or more of a fourth transistor T4, a fifth transistor T5, a sixth transistor T6 and a seventh transistor T7. Herein, the fourth transistor T4 can be called as a compensating transistor, the fifth transistor T5 can be called as a driving control transistor, the sixth transistor T6 can be called as an emission control transistor, and the seventh transistor T7 can be called as a bypass transistor. For example, the fourth transistor T4 is configured to enable the second transistor T2 to be in a diode connecting state when the fourth transistor T4 is turned on in response to the scanning signal of the scanning line Gat. For example, the fifth transistor T5 and the sixth transistor T6 are configured to enable an emission current Id to flow to the light emitting element D when the fifth transistor T5 and the sixth transistor T6 are turned on in response to a control signal of a control line EM. For example, the seventh transistor T7 is configured to enable part of the driving current Id to flow as a bypass current Ibp when the seventh transistor 17 is turned on in response to the reset signal of the reset line Rese. It should be noted that a third gate electrode G3 of the third transistor T3 and a seventh gate electrode G7 of the seventh transistor T7, which are illustrated in FIG. 19, are both connected to the same reset line Rese, but it is not restrictive. For example, in certain embodiments, the seventh gate electrode G7 of the seventh transistor T7 can be connected to another reset line different from the reset line Rese.

In some embodiments, all of the first transistor T1, the second transistor T2, the third transistor T3, the fourth transistor T4, the fifth transistor T5, the sixth transistor T6 and the seventh transistor T7 are P-channel thin film transistors. In some other embodiments, one or more of the first transistor T1, the second transistor T2, the third transistor T3, the fourth transistor T4, the fifth transistor T5, the sixth transistor T6 and the seventh transistor T7 can be N-channel thin film transistors.

For example, an active layer of each of the first transistor T1, the second transistor T2, the third transistor T3, the fourth transistor T4, the fifth transistor T5, the sixth transistor T6 and the seventh transistor T7 can be illustrated in FIG. 20. A material of the active layer, for example, can include poly silicon, e.g., low temperature poly silicon and the like. The active layer of each transistor includes two electrode regions and a channel region positioned between two electrode regions. Herein, one of two electrode regions serves as a source region, while the other one serves as a drain region. It should be understood that the doping concentration in the two electrode regions is greater than that in the channel region. In other words, each of the two electrode regions is a conductor region, and the channel region is a semiconductor region.

With reference to FIG. 19 and FIG. 20, the first transistor T1 includes a first active layer ACT1 and a first gate electrode G1 connected to the scanning line Gat. In some embodiments, the scanning line Gat and the first gate electrode G1 can be integrally arranged. As illustrated in FIG. 20, the first active layer ACT1 includes a first electrode region ACT11, a second electrode region ACT12 and a first channel region ACT13 positioned between the first electrode region and the second electrode region. Herein, the first electrode region ACT11 is connected to the data line Dat, and the second electrode region ACT12 is connected to a power line VDD. For example, the first electrode region ACT11 can be connected to the data line Dat through a via hole V1 illustrated in FIG. 25. In some embodiments, the second electrode region ACT12 can be connected to the power line VDD through a fifth active layer ACT5 of the fifth transistor T5. For example, the fifth active layer ACT5 can be connected to the power line VDD through a via hole V2 illustrated in FIG. 25. In some embodiments, with reference to FIG. 21, the data line Dat and the power line VDD can be positioned in the same layer.

It should be noted that in this disclosure, the case that two parts are positioned in the same layer means that the two parts are formed by the same patterning process, i.e., the two parts are formed by carrying out one-time patterning on the same material layer; or the two parts are positioned on the same film layer, and are in direct contact with the film layer.

The capacitor C includes a first electrode plate C1 and a second electrode plate C2 connected to the power line VDD. For example, the second electrode plate C2 can be connected to the power line VDD through a via hole V3 illustrated in FIG. 25.

The second transistor T2 includes a second active layer ACT2 and a second gate electrode G2 connected to the first electrode plate C1. In some embodiments, the first electrode plate C1 and the second gate electrode G2 can be integrally arranged. As illustrated in FIG. 20, the second active layer ACT2 includes a third electrode region ACT21, a fourth electrode region ACT22 and a second channel region ACT23 positioned between the third electrode region ACT21 and the fourth electrode region ACT22. The third electrode region ACT21 is connected to the second electrode region ACT12, and the fourth electrode region ACT22 is connected to the anode D1. In some embodiments, the third electrode region ACT21 and the second electrode region ACT12 can be integrally formed. In some embodiments, the third electrode region ACT21 can be connected to the power line VDD through the fifth active layer ACT5 of the fifth transistor T5.

The third transistor T3 includes a third active layer ACT3 and a third gate electrode G3 connected to the reset line Rese. In some embodiments, the reset line Rese and the third gate electrode G3 can be integrally arranged. As illustrated in FIG. 20, the third active layer ACT3 includes a fifth electrode region ACT31, a sixth electrode region ACT32 and a third channel region ACT33 positioned between the fifth electrode region ACT31 and the sixth electrode region ACT32. The fifth electrode region ACT31 is connected to the first electrode plate C1, and the sixth electrode region ACT32 is connected to the initial voltage line Vinit. For example, the fifth electrode region ACT31 can be connected to a first connector CT1 through a via hole V4 illustrated in FIG. 25, and the first electrode plate C1 can be connected to the first connector CT1 through a via hole V5 illustrated in FIG. 25. For example, the sixth electrode region ACT32 can be connected to a second connector CT2 through a via hole V6 illustrated in FIG. 25, and the initial voltage line Vinit can be connected to the second connector CT2 through a via hole V7 illustrated in FIG. 25. In some embodiments, with reference to FIG. 21, the first connector CT1, the second connector CT2, the data line Dat and the power line VDD can be positioned in the same layer. In some embodiments, with reference to FIG. 22, the scanning line Gat, the first electrode plate C1 and the reset line Rese can be positioned in the same layer. In some embodiments, with reference to FIG. 23, the second electrode plate C2 and the initial voltage line Vinit can be positioned in the same layer.

With reference to FIG. 20 and FIG. 24, the first channel region ACT13 can be an overlapping region of the first active layer ACT1 and the scanning line Gat, the second channel region ACT23 can be an overlapping region of the second active layer ACT2 and the first electrode plate C1, the third channel region ACT33 can be an overlapping region of the third active layer ACT3 and the reset line Rese, and a fourth channel region ACT43 can be an overlapping region of a fourth active layer ACT4 and the scanning line Gat.

With reference to FIG. 19 and FIG. 20, the light emitting element D includes the anode D1 and the cathode D2. The first transistor T1 includes the first active layer ACT1 and the first gate electrode G1 connected to the scanning line Gat, the first active layer ACT1 includes the first electrode region ACT11, the second electrode region ACT12 and the first channel region ACT13 positioned between the first electrode region and the second electrode region, the first electrode region ACT11 is connected to the data line Dat, and the second electrode region ACT12 is connected to the power line VDD.

The capacitor C includes the first electrode plate C1 and the second electrode plate C2 connected to the power line VDD. The second transistor T2 includes the second active layer ACT2 and the second gate electrode G2 connected to the first electrode plate C1, the second active layer ACT2 includes the third electrode region ACT21, the fourth electrode region ACT22 and the second channel region ACT23 positioned between the third electrode region ACT21 and the fourth electrode region ACT22, the third electrode region ACT21 is connected to the second electrode region ACT12, and the fourth electrode region ACT22 is connected to the anode D1.

The third transistor T3 includes the third active layer ACT3 and the third gate electrode G3 connected to the reset line Rese, the third active layer ACT3 includes the fifth electrode region ACT31, the sixth electrode region ACT32 and the third channel region ACT33 positioned between the fifth electrode region ACT31 and the sixth electrode region ACT32, the fifth electrode region ACT31 is connected to the first electrode plate C1, and the sixth electrode region ACT32 is connected to the initial voltage line Vinit.

The fourth transistor T4, the fifth transistor T5, the sixth transistor T6 and the seventh transistor T7 are illustrated below in connection with FIG. 19 and FIG. 20.

The fourth transistor T4 includes the fourth active layer ACT4 and a fourth gate electrode G4 connected to the scanning line Gat. In some embodiments, the scanning line Gat and the fourth gate electrode G4 can be integrally arranged. As illustrated in FIG. 20, the fourth active layer ACT4 includes a seventh electrode region ACT41, an eighth electrode region ACT42 and a fourth channel region ACT43 positioned between the seventh electrode region ACT41 and the eighth electrode region ACT42. The seventh electrode region ACT41 is connected to the second gate electrode G2, and the eighth electrode region ACT42 is connected to the fourth electrode region ACT22. For example, the seventh electrode region ACT41 can be connected to the first connector CT1 through the via hole V4 illustrated in FIG. 25, and the second gate electrode G2 can be connected to the first connector CT1 through the via hole V5 illustrated in FIG. 25. In some embodiments, the seventh electrode region ACT41 and the fifth electrode region ACT31 can be integrally formed. In some embodiments, the eighth electrode region ACT42 and the fourth electrode region ACT22 can be integrally formed. In certain embodiments, the fourth channel region ACT43 can include two spaced portions, i.e., the fourth gate electrode G4 can include two gate electrodes.

The fifth transistor T5 includes a fifth active layer ACT5 and a fifth gate electrode G5 connected to the control line EM. As illustrated in FIG. 20, the fifth active layer ACT5 includes a ninth electrode region ACT51, a tenth electrode region ACT52 and a fifth channel region ACT53 positioned between the ninth electrode region ACT51 and the tenth electrode region ACT52. The ninth electrode region ACT51 is connected to the power line VDD, and the tenth electrode region ACT52 is connected to the second electrode region ACT12. For example, the ninth electrode region ACT51 can be connected to the power line VDD through the via hole V2 illustrated in FIG. 25. For example, the tenth electrode region ACT52 can be connected to the second electrode region ACT12 through the third electrode region ACT21. In some embodiments, with reference to FIG. 22, the control line EM, the scanning line Gat, the first electrode plate C1 and the reset line Rese can be positioned in the same layer.

The sixth transistor T6 includes a sixth active layer ACT6 and a sixth gate electrode G6 connected to the control line EM. As illustrated in FIG. 20, the sixth active layer ACT6 includes an eleventh electrode region ACT61, a twelfth electrode region ACT62 and a sixth channel region ACT63 positioned between the eleventh electrode region ACT61 and the twelfth electrode region ACT62. The eleventh electrode region ACT61 is connected to the fourth electrode region ACT22, and the twelfth electrode region ACT62 is connected to the anode D1. In some embodiments, the eleventh electrode region ACT61 and the fourth electrode region ACT22 can be integrally formed. In some embodiments, the twelfth electrode region ACT62 can be connected to a conducting layer M (e.g., a metal layer) through a via hole V8 illustrated in FIG. 25, and the conducting layer M can be connected to the anode D1 through other via holes. In some embodiments, with reference to FIG. 21, the conducting layer M, the first connector CT1, the second connector CT2, the data line Dat and the power line VDD can be positioned in the same layer.

The seventh transistor T7 includes a seventh active layer ACTT and a seventh gate electrode G7 connected to the reset line Rese. In some embodiments, the reset line Rese and the seventh gate electrode G7 can be integrally arranged. As illustrated in FIG. 20, the seventh active layer ACT7 includes a thirteenth electrode region ACT71, a fourteenth electrode region ACT72 and a seventh channel region ACT73 positioned between the thirteenth electrode region ACT71 and the fourteenth electrode region ACT72. The thirteenth electrode region ACT71 is connected to the twelfth electrode region ACT62, and the fourteenth electrode region ACT72 is connected to the initial voltage line Vinit. For example, the fourteenth electrode region ACT72 can be connected to the second connector CT2 through the via hole V6 illustrated in FIG. 25, and the initial voltage line Vinit can be connected to the second connector CT2 through the via hole V7 illustrated in FIG. 25. In some embodiments, the fourteenth electrode region ACT72 and the sixth electrode region ACT32 can be integrally formed.

With reference to FIG. 20 and FIG. 24, the fifth channel region ACT53 can be an overlapping region of the fifth active layer ACT5 and the control line EM, the sixth channel region ACT63 can be an overlapping region of the sixth active layer ACT6 and the control line EM, and the seventh channel region ACT73 can be an overlapping region of the seventh active layer ACT7 and the reset line.

In some embodiments, with reference to FIG. 20, the first active layer ACT1, the second active layer ACT2, the third active layer ACT3, the fourth active layer ACT4, the fifth active layer ACT5, the sixth active layer ACT6 and the seventh active layer ACT7 can be positioned in the same layer.

A driving method of a sub-pixel according to some embodiments of the present disclosure is illustrated below. It should be noted that in the description below, it is assumed that the sub-pixel includes transistors T1, T2, T3, T4, T5, T6 and T7, and all of the transistors T1, T2, T3, T4, T5, T6 and T7 are P-type channel transistors.

In a resetting phase, the third transistor T3 is turned on in response to a reset signal of a reset line Rese, and a second gate electrode G2 of the second transistor T2 is connected to an initial voltage line Vinit via the third transistor T3. Therefore, a voltage of a second gate electrode G2 of the driving transistor T1 is reset as a voltage of the initial voltage line Vinit.

In a compensating phase, the first transistor T1 and the fourth transistor T4 are turned on in response to a scanning signal of a scanning line Gat. In this case, the second transistor T2 is in a diode connecting state, and is forward biased. A voltage of the second gate electrode G2 of the second transistor T2 is the sum of a voltage Vdata of a data signal from a data line Dat and a threshold voltage Vth (a negative value) of the second transistor T2, i.e., Vdata+Vth. In this case, a voltage of a first electrode plate C1 of the capacitor Cst is Vdata+Vth, and a voltage of a second electrode plate C2 of the capacitor Cst is a voltage ELVDD of a power line VDD. Charges corresponding to a voltage difference between the first electrode plate C1 and the second electrode plate C2 are filled into the capacitor Cst.

In a light emitting phase, the fifth transistor T5 and the sixth transistor T6 are turned on in response to a control signal of a control line EM. A driving current Id is generated in response to a voltage difference between the voltage of the second gate electrode G2 of the second transistor T2 and the voltage of the power line VDD, and the driving current Id is supplied to a light emitting element D by the sixth transistor T6. In the light emitting phase, a gate-to-source voltage Vgs of the second transistor T2 is kept as (Vdata+Vth)−ELVDD. The driving current Id is in proportion to (Vdata−ELVDD)$^2$. Therefore, the driving current Id is unrelated to a threshold voltage Vth of the first transistor T1.

In addition, in the resetting phase, the seventh transistor T7 is turned on in response to the reset signal of the reset line Rese. In addition, the seventh transistor T7 can be simultaneously turned on with the first transistor T1 and the fourth transistor T4. In order to prevent the driving current Id from driving the light emitting element D to emit light in the case that the second transistor T2 is turned off, part of the driving current Id can flow out as a bypass current Ibp through the seventh transistor T7.

It should be noted that for other components (e.g., an image data encoding/decoding device, a clock circuit and the like) of the display substrate 01 and a display device 03, applicable components can be adopted, which should be understood by those skilled in the art, and is not repeated herein and should not be regarded as the limitation to the present disclosure.

At least one embodiment of the present disclosure further provides a display device, which includes any one of the above-mentioned display substrates according to the present disclosure. The display device can be implemented as any product or component with the display function, such as a mobile phone, a tablet personal computer, a television, a display, a notebook computer, a digital photo frame, a navigator and the like.

Although general descriptions and specific implementations have been used above to describe the present disclosure in detail, some modifications or improvements can be made on the basis of the embodiments of the present disclosure, which is obvious to those skilled in the art. Therefore, these modifications or improvements made without departing from the spirit of the present disclosure all fall within the scope of protection claimed by the present disclosure.

What have been described above are merely exemplary embodiments of the present disclosure, and are not intended to limit the protection scope of the present disclosure, and the protection scope of the present disclosure is determined by the appended claims.

What is claimed is:

1. A display substrate, comprising a display region, at least one first signal line, and at least one connecting wire,
   wherein the display region comprises a first display region and a second display region;
   the second display region at least partially surrounds the first display region;
   the first display region comprises at least one first light emitting element, and the second display region comprises at least one first pixel circuit;
   the at least one first signal line comprises a first main body portion and a first winding portion;
   the first main body portion extends along a first direction, and at least part of the first winding portion extends along a direction intersecting with the first direction;
   the at least one first signal line is electrically connected to the at least one first pixel circuit, so as to provide a first driving signal for the at least one first pixel circuit;
   the at least one first pixel circuit is respectively connected to the at least one first light emitting element through corresponding connecting wire; and
   the at least one first pixel circuit is configured to respectively drive the at least one first light emitting element,
   wherein the first main body portion comprises a first sub-portion and a second sub-portion which are spaced by the first display region;
   the first sub-portion and the second sub-portion are electrically connected through the first winding portion; and
   at least part of the first winding portion intersects with a dummy connecting line positioned between the first sub-portion and the second sub-portion and extending along the first direction.

2. The display substrate according to claim 1, wherein the display region further comprises a third display region;
   the third display region at least partially surrounds the second display region;
   the at least one first light emitting element comprises a plurality of first light emitting elements;
   the second display region comprises a plurality of second light emitting elements;
   the third display region comprises a plurality of third light emitting elements; and
   the at least one first signal line is configured to drive the first light emitting elements and the third light emitting elements which are arranged in parallel along the first direction.

3. The display substrate according to claim 1, further comprising at least one second signal line,
   wherein the at least one second signal line comprises a second main body portion, and the second main body portion extends along a second direction intersecting with the first direction;

a dummy extending line, extending along the first direction, of the first main body portion intersects with a dummy extending line, extending along the second direction, of the second main body portion in the first display region; and the second main body portion of the at least one second signal line is electrically connected to the at least one first pixel circuit, so as to provide a second driving signal different from the first driving signal for the at least one first pixel circuit.

4. The display substrate according to claim 3, wherein the at least one connecting wire extends to the second display region from the first display region along the second direction.

5. The display substrate according to claim 4, wherein the first winding portion surrounds the first display region, and is integrally in the second display region;

the first winding portion comprises an eighth line portion and a ninth line portion which are sequentially connected;

the eighth line portion is electrically connected to the first main body portion, and extends along the second direction;

the ninth line portion extends along the first direction, and is arranged in parallel to the dummy extending line of the first main body portion in the first direction;

in working process, current trend in the ninth line portion is same with current trend in the first main body portion; and the ninth line portion is electrically connected to the first pixel circuit configured to drive a first number of first light emitting elements arranged in parallel in the first display region along the first direction.

6. The display substrate according to claim 5, wherein the second signal line further comprises a fourth winding portion, and the fourth winding portion is routed deviated from the dummy extending line of the second main body portion along the second direction;

the second main body portion comprises a third sub-portion and a fourth sub-portion which are spaced by the first display region, and the third sub-portion is electrically connected to the fourth sub-portion through the fourth winding portion; and the fourth winding portion is routed deviated from a dummy connecting line positioned between the third sub-portion and the fourth sub-portion and extending along the second direction.

7. The display substrate according to claim 1, wherein the first winding portion is an arc line, a first end of the arc line is connected with an end portion, close to the second sub-portion, of the first sub-portion, and a second end of the arc line is connected with an end portion, close to the first sub-portion, of the second sub-portion; or the first winding portion comprises a first line segment, a second line segment, and a third line segment which are sequentially connected, an end portion, which is not connected with the second line segment, of the first line segment is connected with the end portion, close to the second sub-portion, of the first sub-portion, an end portion, which is not connected with the second line segment, of the third line segment is connected with the end portion, close to the first sub-portion, of the second sub-portion, the second line segment extends along the first direction, and the first line segment and the third line segment extend along a second direction intersecting with the first direction.

8. The display substrate according to claim 1, wherein the second display region has an inner edge and an outer edge, and the inner edge of the second display region surrounds the first winding portion.

9. The display substrate according to claim 1, wherein the at least one first signal line further comprises a second winding portion;

a first end of the second winding portion is electrically connected to the second sub-portion, and a second end of the second winding portion is electrically connected to a corresponding first pixel circuit;

the second winding portion comprises a first line portion and a second line portion which are sequentially connected;

an end, which is not connected with the second line portion, of the first line portion serves as the first end of the second winding portion;

an end, which is not connected with the first line portion, of the second line portion serves as the second end of the second winding portion;

the first line portion extends along a second direction intersecting with the first direction;

the second line portion extends along the first direction, and is arranged in parallel to the second sub-portion in the second direction; and in working process, current trend in the second line portion is opposite to current trend in the first main body portion.

10. The display substrate according to claim 9, further comprising a peripheral region surrounding the display region, wherein the first line portion is integrally in the peripheral region, and is arranged in parallel to the second display region in the first direction.

11. The display substrate according to claim 9, wherein the first line portion is integrally in the second display region, and at least part of the first line portion is arranged in parallel to the first display region in the first direction.

12. The display substrate according to claim 9, further comprising a peripheral region surrounding the display region, wherein the first line portion comprises a first portion, a second portion, and a third portion which are sequentially connected;

the first portion of the first line portion is electrically connected to the second sub-portion, and the third portion of the first line portion is electrically connected to the second line portion;

the first portion of the first line portion is in the peripheral region, and is arranged in parallel to the second display region in the first direction;

the second portion of the first line portion extends to the second display region from the peripheral region along the first direction; and the third portion of the first line portion is in the second display region, and a dummy extending line, extending along the second direction, of the third portion of the first line portion is arranged in parallel to the first display region in the first direction.

13. The display substrate according to claim 9, wherein the at least one first signal line further comprises a third winding portion; and a first end of the third winding portion is electrically connected to the first sub-portion, a second end of the third winding portion is electrically connected to a corresponding first pixel circuit, and the first pixel circuit connected to the second winding portion is different from the first pixel circuit connected to the third winding portion.

14. The display substrate according to claim 13, wherein the third winding portion comprises a third line portion and a fourth line portion which are sequentially connected;
- an end, which is not connected with the fourth line portion, of the third line portion serves as the first end of the third winding portion, and an end, which is not connected with the third line portion, of the fourth line portion, serves as the second end of the third winding portion;
- the third line portion extends along the second direction, and is arranged in parallel to the first line portion in the first direction;
- the fourth line portion extends along the first direction, and is arranged in parallel to the first sub-portion in the second direction; and
- in the working process, current trend in the fourth line portion is same with current trend in the first main body portion.

15. The display substrate according to claim 9, wherein the first main body portion, the first winding portion, and the second line portion are in a first electrode layer of the display substrate;
- the first line portion is in a second electrode layer of the display substrate;
- the first electrode layer and the second electrode layer are stacked in a normal direction of a display surface of the display substrate; and
- the first line portion is electrically connected to the second sub-portion and the second line portion through a first via hole and a second via hole of an insulating layer between the first electrode layer and the second electrode layer, respectively.

16. The display substrate according to claim 15, wherein each of the at least one first pixel circuit comprises a thin film transistor;
- the thin film transistor comprises a gate electrode and source and drain electrodes; and
- the source and drain electrodes are in the first electrode layer, and the gate electrode is in the second electrode layer.

17. The display substrate according to claim 1, wherein the first winding portion surrounds the first display region, and is integrally in the second display region;
- the first winding portion comprises a fifth line portion, a sixth line portion, and a seventh line portion which are sequentially connected;
- the fifth line portion is electrically connected to the first sub-portion, and the seventh line portion is electrically connected to the second sub-portion;
- the sixth line portion extends along the first direction, and the fifth line portion and the seventh line portion extend along a second direction intersecting with the first direction;
- the sixth line portion and the dummy connecting line positioned between the first sub-portion and the second sub-portion and extending along the first direction are arranged in parallel in the first direction;
- the sixth line portion at least partially overlaps with the first pixel circuit electrically connected to the sixth line portion; and
- in working process, current trend in the sixth line portion is same with current trend in the first main body portion.

18. The display substrate according to claim 1, wherein a portion, in the first display region, of the at least one connecting wire is a transparent wire.

19. A display device, comprising the display substrate according to claim 1.

* * * * *